US012567558B2

(12) United States Patent
Gaury et al.

(10) Patent No.: US 12,567,558 B2
(45) Date of Patent: Mar. 3, 2026

(54) SYSTEMS AND METHODS FOR PULSED VOLTAGE CONTRAST DETECTION AND CAPTURE OF CHARGING DYNAMICS

(71) Applicant: ASML Netherlands B.V., Veldhoven (NL)

(72) Inventors: Benoit Herve Gaury, Eindhoven (NL); Jun Jiang, San Jose, CA (US); Bruno La Fontaine, Pleasanton, CA (US); Shakeeb Bin Hasan, Montreal (CA); Kenichi Kanai, Palo Alto, CA (US); Jasper Frans Mathijs Van Rens, Hegelsom (NL); Cyrus Emil Tabery, San Jose, CA (US); Long Ma, San Jose, CA (US); Oliver Desmond Patterson, San Jose, CA (US); Jian Zhang, San Jose, CA (US); Chih-Yu Jen, San Jose, CA (US); Yixiang Wang, Fremont, CA (US)

(73) Assignee: ASML Netherlands B.V., Veldhoven (NL)

( * ) Notice: Subject to any disclaimer, the term of this patent is extended or adjusted under 35 U.S.C. 154(b) by 376 days.

(21) Appl. No.: 18/019,088

(22) PCT Filed: Jul. 27, 2021

(86) PCT No.: PCT/EP2021/070930
§ 371 (c)(1),
(2) Date: Jan. 31, 2023

(87) PCT Pub. No.: WO2022/023304
PCT Pub. Date: Feb. 3, 2022

(65) Prior Publication Data
US 2023/0335374 A1 Oct. 19, 2023

Related U.S. Application Data

(60) Provisional application No. 63/219,278, filed on Jul. 7, 2021, provisional application No. 63/113,782, filed
(Continued)

(51) Int. Cl.
*H01J 37/26* (2006.01)
*G01N 23/2251* (2018.01)
(Continued)

(52) U.S. Cl.
CPC ........ *H01J 37/265* (2013.01); *G01N 23/2251* (2013.01); *H01J 37/228* (2013.01); *H01J 37/244* (2013.01); *H01J 2237/2482* (2013.01)

(58) Field of Classification Search
CPC .. H01J 37/00; H01J 37/02; H01J 37/26; H01J 37/28; H01J 37/265; H01J 37/228; H01J 37/244; H01J 2237/2482; G01N 23/2251
(Continued)

(56) References Cited

U.S. PATENT DOCUMENTS 6,635,872 B2 10/2003 Davidson
9,291,665 B2 3/2016 Patterson et al.
(Continued)

FOREIGN PATENT DOCUMENTS

TW 201618151 A 5/2016
TW 201946085 A 12/2019
(Continued)

OTHER PUBLICATIONS

International Search Report issued in related Foreign Application No. PCT/EP2021/070930; mailed Nov. 25, 2021 (2 pgs.).
(Continued)

*Primary Examiner* — Jason L McCormack
(74) *Attorney, Agent, or Firm* — Finnegan, Henderson, Farabow, Garrett & Dunner LLP

(57) ABSTRACT

Systems and methods of observing a sample using a charged-particle beam apparatus in voltage contrast mode are disclosed. The charged-particle beam apparatus comprises a charged-particle source, an optical source, a charged-particle detector configured to detect charged particles, and a controller having circuitry configured to apply a first signal to cause the optical source to generate the optical pulse, apply a second signal to the charged-particle detector to detect the second plurality of charged particles, and adjust a time delay between the first and the second
(Continued)

signals. In some embodiments, the controller having circuitry may be further configured to acquire a plurality of images of a structure, to determine an electrical characteristic of the structure based on the rate of gray level variation of the plurality of images of the structure, and to simulate, using a model, a physical characteristic of the structure based on the determined electrical characteristic.

20 Claims, 27 Drawing Sheets

Related U.S. Application Data on Nov. 13, 2020, provisional application No. 63/059,568, filed on Jul. 31, 2020.

(51) Int. Cl.
  *H01J 37/22* (2006.01)
  *H01J 37/244* (2006.01)

(58) Field of Classification Search
  USPC .......................................... 250/306, 307, 311
  See application file for complete search history.

(56) References Cited

U.S. PATENT DOCUMENTS

2007/0242269 A1* 10/2007 Trainer .............. G01N 15/0205
                                                        356/336
2011/0284744 A1   11/2011 Zewail et al.
2021/0066028 A1*   3/2021 Shirasaki .............. H01J 37/226

FOREIGN PATENT DOCUMENTS

TW            202024619  A      7/2020
WO     WO 2010/042629  A2      4/2010
WO     WO 2017/221362  A1     12/2017

OTHER PUBLICATIONS

Ming Lei Etal, "Detection of Sub-Design Rule Shorts for Process Development in Advanced Technology Nodes", IEEE Transactions on Semiconductor Manufacturing, vol. 30, No. 4, Nov. 2017.
J.A. Kash et al. "Dynamic Internal Testing of CMOS Circuits Using Hot Luminescence", IEEE Electron Device Letters, vol. 18, No. 7, Jul. 1997.
J.C. Tsang et al., "Picosecond hot electron light emission from submicron complementary metal-oxide-semiconductor circuits." Applied Physics Letters, 70 (7), 889-891 (1997).
Office Action of the Intellectual Property Office of Taiwan issued in related Taiwanese Patent Application No. 110128030; mailed Dec. 6, 2022 (11 pgs.).

* cited by examiner

<u>100</u>

600

900

1000

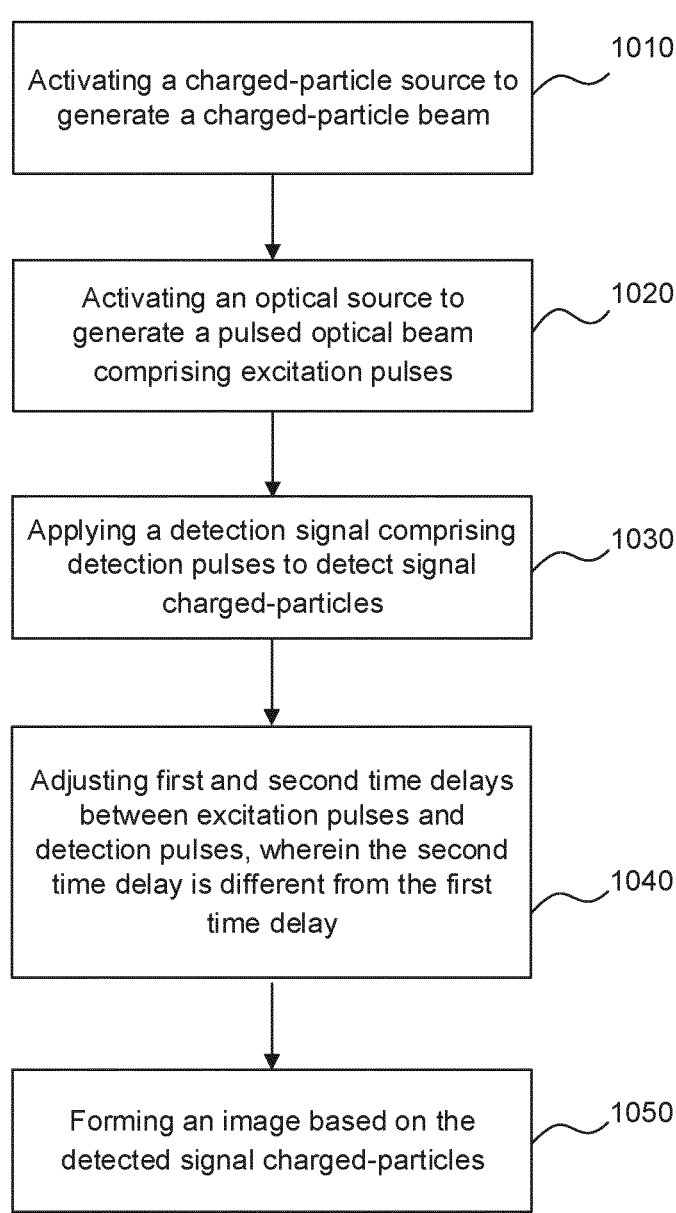

1010 Activating a charged-particle source to generate a charged-particle beam

1020 Activating an optical source to generate a pulsed optical beam comprising excitation pulses 1030 Applying a detection signal comprising detection pulses to detect signal charged-particles 1040 Adjusting first and second time delays between excitation pulses and detection pulses, wherein the second time delay is different from the first time delay 1050 Forming an image based on the detected signal charged-particles

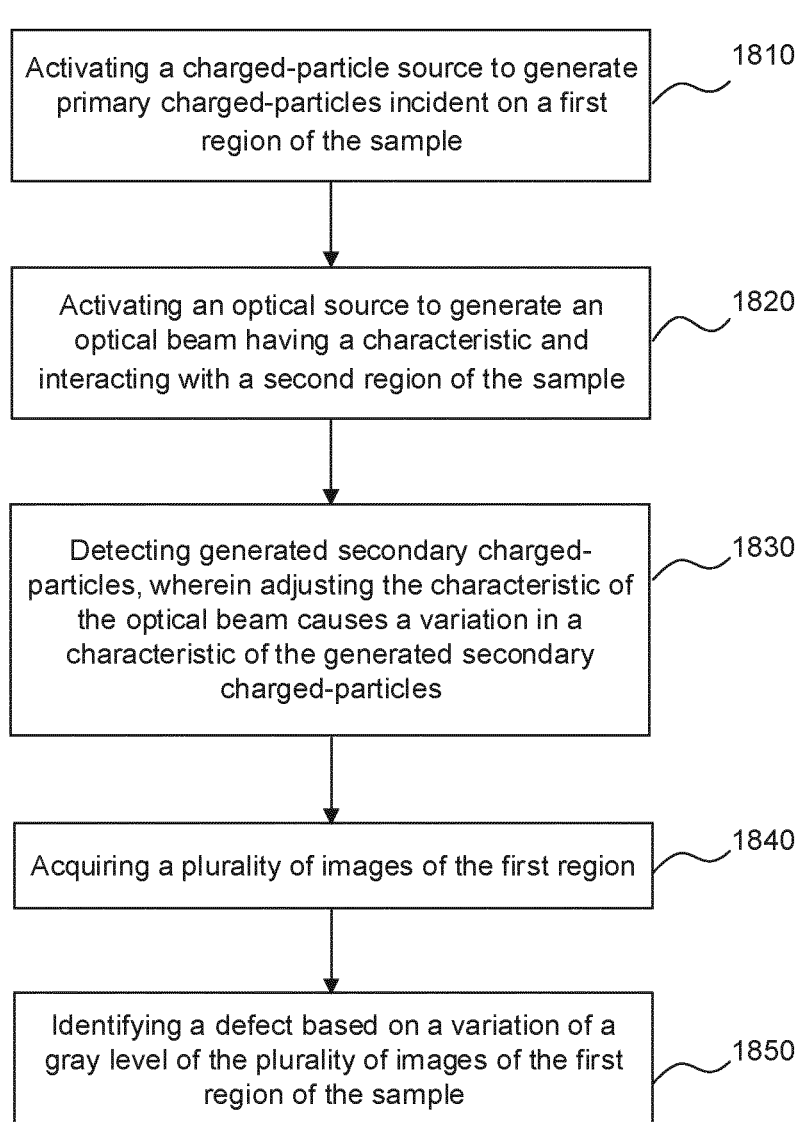

Activating a charged-particle source to generate primary charged-particles incident on a first region of the sample                    1810

Activating an optical source to generate an optical beam having a characteristic and interacting with a second region of the sample     1820

Detecting generated secondary charged-particles, wherein adjusting the characteristic of the optical beam causes a variation in a characteristic of the generated secondary charged-particles     1830

Acquiring a plurality of images of the first region     1840

Identifying a defect based on a variation of a gray level of the plurality of images of the first region of the sample     1850

*FIG. 18*

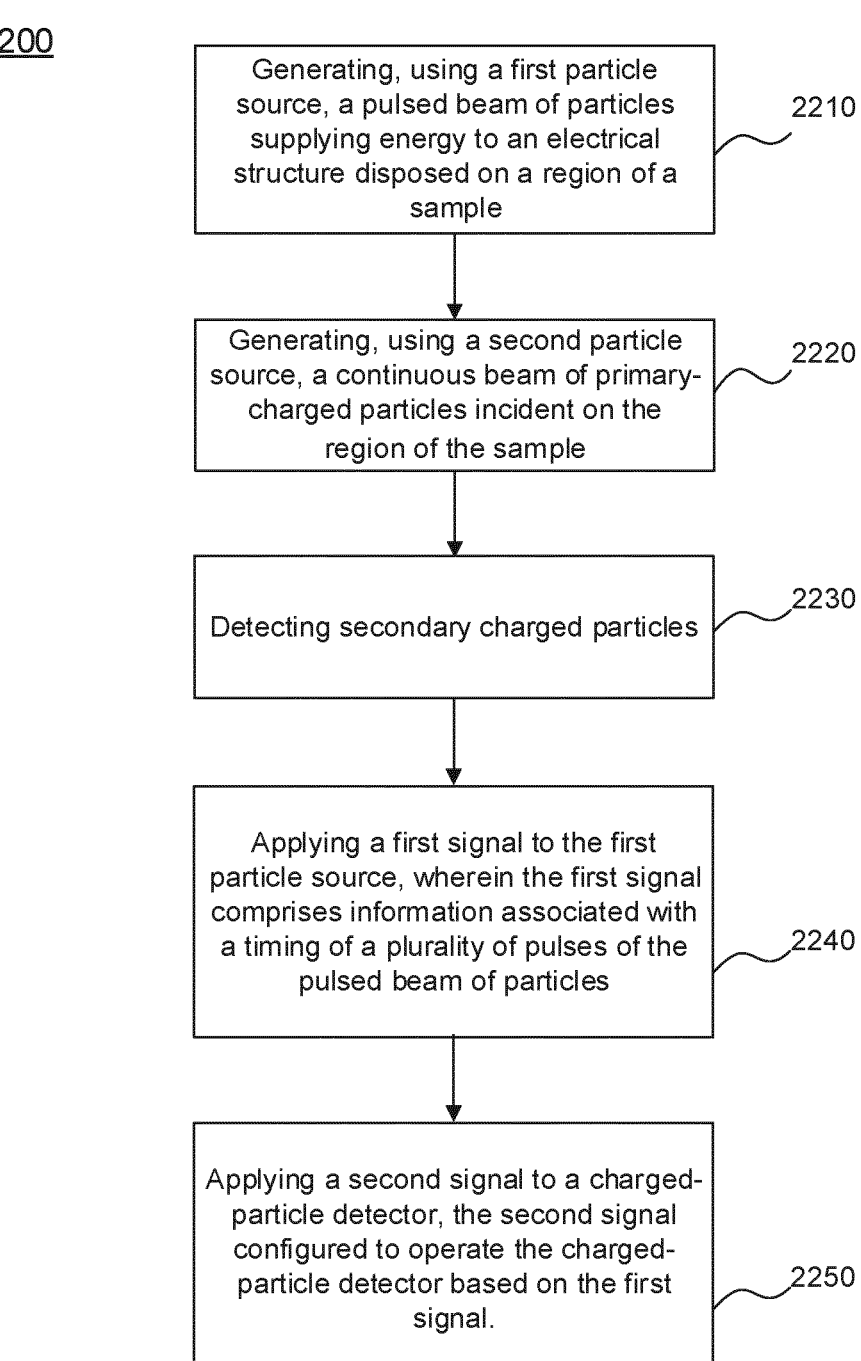

2200

Generating, using a first particle source, a pulsed beam of particles supplying energy to an electrical structure disposed on a region of a sample — 2210

Generating, using a second particle source, a continuous beam of primary-charged particles incident on the region of the sample — 2220

Detecting secondary charged particles — 2230

Applying a first signal to the first particle source, wherein the first signal comprises information associated with a timing of a plurality of pulses of the pulsed beam of particles — 2240

Applying a second signal to a charged-particle detector, the second signal configured to operate the charged-particle detector based on the first signal. — 2250

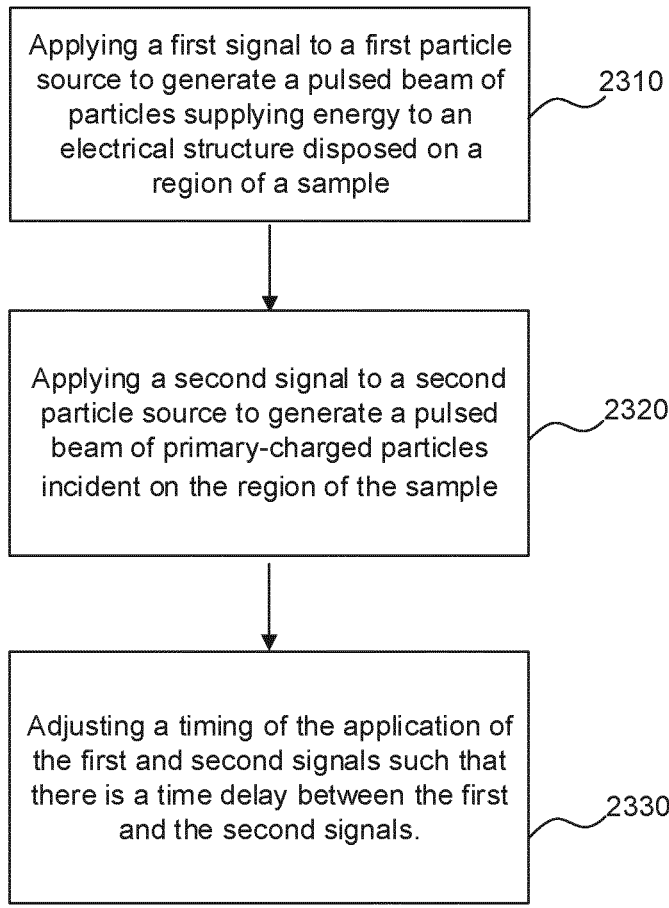

Applying a first signal to a first particle source to generate a pulsed beam of particles supplying energy to an electrical structure disposed on a region of a sample — 2310

Applying a second signal to a second particle source to generate a pulsed beam of primary-charged particles incident on the region of the sample — 2320

Adjusting a timing of the application of the first and second signals such that there is a time delay between the first and the second signals. — 2330

*FIG. 23*

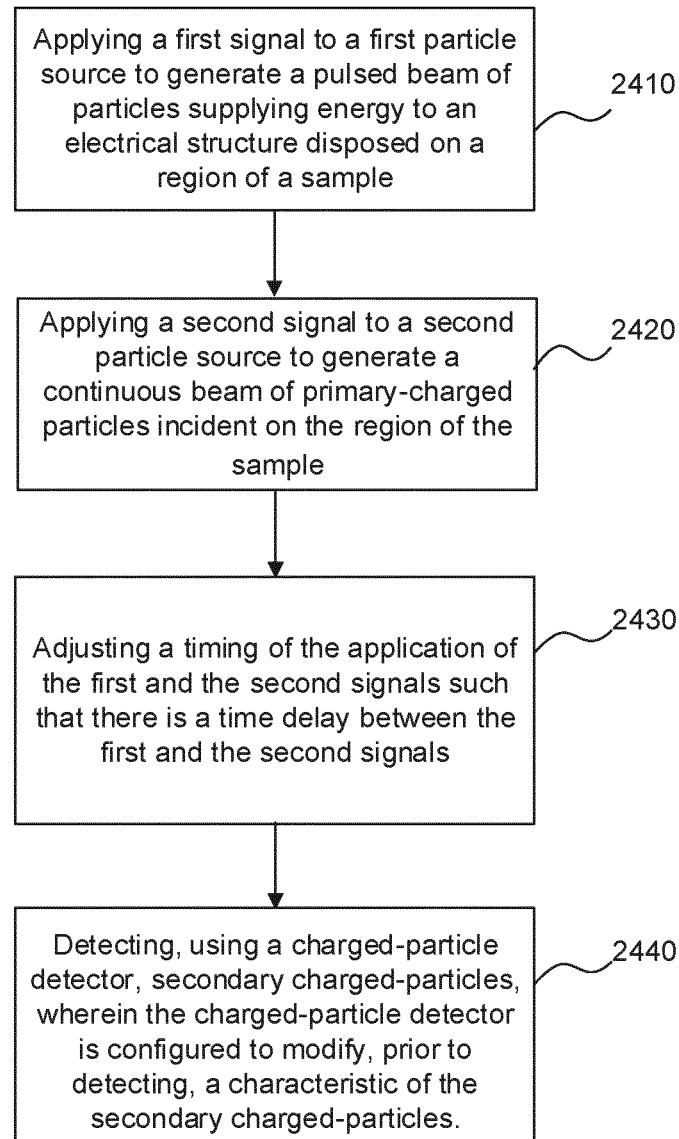
_FIG. 24_

2600

SYSTEMS AND METHODS FOR PULSED VOLTAGE CONTRAST DETECTION AND CAPTURE OF CHARGING DYNAMICS

CROSS-REFERENCE TO RELATED APPLICATIONS

This application claims priority to International Application No. PCT/EP2021/070930, filed Jul. 27, 2021, and published as WO 2022/023304 A1, which claims priority of U.S. application 63/059,568 which was filed on Jul. 31, 2020, of U.S. application 63/113,782, which was filed on Nov. 13, 2020, and of U.S. application 63/219,278, which was filed on Jul. 7, 2021. The contents of these applications are incorporated herein by reference in their entireties.

TECHNICAL FIELD

The embodiments provided herein disclose a charged-particle beam apparatus, and more particularly systems and methods for improving defect detection capabilities and circuit performance testing by enhancing voltage contrast signal in an electron microscope.

BACKGROUND

In manufacturing processes of integrated circuits (ICs), unfinished or finished circuit components are inspected to ensure that they are manufactured according to design and are free of defects. Inspection systems utilizing optical microscopes or charged particle (e.g., electron) beam microscopes, such as a scanning electron microscope (SEM) can be employed. As the physical sizes of IC components continue to shrink, and their structures continue to become more complex, accuracy and throughput in defect detection and inspection become more important. Transient electrical defects in a circuit or a circuit component may cause a finite rate of change in the charges stored, resistance to the flow of charge, charge leakage, among other things. Although existing voltage contrast defect detection techniques may detect transient defects with time constants in the range of milliseconds to microseconds, high-resistance defects with time constants in the range of nanoseconds to picoseconds may be undetected, rendering the defect inspection process and the inspection tool inadequate for its desired purpose.

In addition, such unfinished or finished circuit components are tested to ensure their performance, such as speed or operating frequency, are in accordance with the intended design or application. Although existing testing techniques may provide the required information once the components are finished, one may not be able to gather similar test data at an earlier stage when the circuit component is not yet completed.

In existing voltage contrast inspection methods, gray levels of structures may be compared to a reference gray level value range to detect a defect. Structures showing absolute gray level values outside the reference range may be identified as defects. This approach, though useful as a qualitative characterization technique for determining full opens and leakages in a device, may not provide a quantitative analysis of a defect such as a partial open, or voids in the device structure.

SUMMARY

One aspect of the present disclosure is directed to a charged-particle beam apparatus comprising a charged-particle source configured to generate a primary charged-particle beam along a primary optical axis, an optical source configured to generate a pulsed optical beam interacting with a sample, the interaction generating a first plurality of charged particles, a charged-particle detector configured to detect a second plurality of charged particles generated from a probe spot on the sample formed by the primary charged-particle beam and modified by interaction with a portion of the first plurality of charged particles; and a controller having circuitry configured to apply a first signal to cause the optical source to generate the pulsed optical beam, and apply a second signal to the initiate the detection of the second plurality of charged-particles.

In some embodiments, the pulsed optical beam may comprise a plurality of excitation pulses. The controller including circuitry may be further configured to apply the first signal to the optical source to generate the plurality of excitation pulses having a first frequency, and the second signal to the charged-particle detector, the second signal having a second frequency substantially similar to the first frequency. In some embodiments, the controller including circuitry may be further configured to apply a third signal to the charged-particle source to generate a pulsed charged-particle beam comprising a plurality of charged-particle pulses.

Another aspect of the present disclosure is directed to a charged-particle beam apparatus comprising a charged-particle source configured to generate a primary charged-particle beam along a primary optical axis, an optical source configured to generate a pulsed optical beam comprising a first excitation pulse that generates a first portion of a first plurality of charged particles upon interaction with a sample surface; and a second excitation pulse that generates a second portion of the first plurality of charged particles upon interaction with the sample surface, a charged-particle detector configured to detect a second plurality of charged particles generated from a probe spot on the sample formed by the primary charged-particle beam and modified by interaction with a portion of the first plurality of charged particles, and a controller having circuitry configured to adjust a first time delay between a first excitation pulse of the pulsed optical beam and a corresponding first detection pulse, and adjust a second time delay between a second excitation pulse of the pulsed optical beam and a corresponding second detection pulse, wherein the second time delay is different from the first time delay. In some embodiments, the second time delay may be longer or shorter than the first time delay.

Another aspect of the present disclosure is directed to a charged-particle beam apparatus comprising a charged-particle source configured to generate a primary charged-particle beam along a primary optical axis, an optical source configured to generate an optical pulse that irradiates a region of a sample, wherein the irradiation generates a first plurality of charged particles from the region of the sample, a charged-particle detector configured to detect a second plurality of charged particles generated from a probe spot on the sample formed by the primary charged-particle beam and modified by interaction with a portion of the first plurality of charged particles, and a controller having circuitry configured to apply a first signal to cause the optical source to generate the optical pulse, apply a second signal to the charged-particle detector to detect the second plurality of charged particles, and adjust a time delay between the first and the second signals. The controller may include circuitry further configured to apply a first portion of the second signal to initiate the detection of the second plurality of charged particles and apply a second portion of the second signal to terminate the detection of the second plurality of charged particles, wherein the first portion comprises a rising edge of the second signal and the second portion comprises a falling edge of the second signal, with respect to a reference signal. The controller may include circuitry further configured to determine information associated with the probe spot of the sample based on an output signal generated by the charged-particle detector, and wherein the output signal is based on the second plurality of charged particles detected in a detection time elapsed between the first and the second portions of the second signal. The controller may include circuitry further configured to detect a defect based on determined information associated with the probe spot of the sample.

Another aspect of the present disclosure is directed to a controller of a charged-particle beam apparatus. The controller may comprise circuitry configured to apply a first signal to cause an optical source configured to generate a pulsed optical beam interacting with a sample, the interaction generating a first plurality of charged particles, and apply a second signal to a charged-particle detector configured to detect a second plurality of charged-particles generated from the sample formed by a primary charged-particle beam and modified by interaction with a portion of the first plurality of charged particles.

Another aspect of the present disclosure is directed to a controller of a charged-particle beam apparatus. The controller may comprise a circuitry configured to adjust a first time delay between a first excitation pulse of a pulsed optical beam and a corresponding first detection pulse; and adjust a second time delay between a second excitation pulse of the pulsed optical beam and a corresponding second detection pulse, wherein the second time delay is different from the first time delay.

Another aspect of the present disclosure is directed to a method for forming an image of a sample using a charged-particle beam apparatus comprising a charged-particle source, an optical source, a charged-particle detector, and a controller. The method may comprise activating the charged-particle source to generate a primary charged-particle beam along a primary optical axis, activating the optical source to generate a pulsed optical beam interacting with the sample, the interaction generating a first plurality of charged particles, applying, using the controller, a signal to the charged-particle detector to detect a second plurality of charged-particles generated from a probe spot on the sample formed by the primary charged-particle beam and modified by interaction with a portion of the first plurality of charged particles, and forming an image of the sample based on the detected second plurality of charged-particles.

Another aspect of the present disclosure is directed to a method for forming an image of a sample using a charged-particle beam apparatus comprising a charged-particle source, an optical source, a charged-particle detector, and a controller. The method may comprise activating the charged-particle source to generate a primary charged-particle beam along a primary optical axis, activating the optical source to generate a pulsed optical beam comprising a first excitation pulse that generates a first portion of a first plurality of charged particles upon interaction with a sample surface; and a second excitation pulse that generates a second portion of the first plurality of charged particles upon interaction with the sample surface, detecting, using the charged-particle detector, a second plurality of charged-particles generated from a probe spot on the sample formed by the primary charged-particle beam and modified by interaction with a portion of the first plurality of charged particles, adjusting, using the controller a first time delay between a first excitation pulse of the plurality of excitation pulses and a corresponding first detection pulse, and a second time delay between a second excitation pulse of the plurality of excitation pulses and a corresponding second detection pulse, wherein the second time delay is different from the first time delay. The method may further comprise and forming an image of the sample based on the detected second plurality of charged particles.

Another aspect of the present disclosure is directed to an electron beam inspection apparatus. The electron beam inspection apparatus may comprise an electron source configured to generate a primary electron beam that irradiates a region of a sample, the region comprising a structure. The apparatus may further include an electron detector configured to detect a plurality of signal electrons generated from the irradiated region, and a controller having circuitry configured to acquire a plurality of images of the structure, and determine a characteristic of a structure based on a rate of gray level variation of the plurality of images of the node. The structure may comprise an electrical node. In some embodiments, the structure may be associated with the electrical node.

Another aspect of the present disclosure is directed to a method for determining a characteristic of a structure on a sample. The method may comprise activating an electron source to generate a primary electron beam that irradiates a region of the sample, the region comprising a structure. The method may further include detecting, using an electron detector, a plurality of signal electrons generated from the irradiated region, acquiring a plurality of images of the structure, and determining the characteristic of the structure based on a rate of gray level variation of the plurality of images of the node.

Another aspect of the present disclosure is directed to a non-transitory computer readable medium storing a set of instructions that is executable by one or more processors of a charged-particle beam apparatus to cause the charged-particle beam apparatus to perform a method of observing a sample. The method may comprise activating a charged-particle source to generate a primary charged-particle beam, activating an optical source to generate a pulsed optical beam interacting with the sample, the interaction generating a first plurality of charged particles, applying a signal to a charged-particle detector to detect a second plurality of charged-particles generated from a probe spot on the sample formed by the primary charged-particle beam and modified by interaction with a portion of the first plurality of charged particles, and forming an image of the sample based on the detected second plurality of charged-particles.

Another aspect of the present disclosure is directed to a non-transitory computer readable medium storing a set of instructions that is executable by one or more processors of a charged-particle beam apparatus to cause the charged-particle beam apparatus to perform a method of observing a sample. The method may comprise activating a charged-particle source to generate a primary charged-particle beam, activating an optical source to generate a pulsed optical beam comprising a first excitation pulse that generates a first portion of a first plurality of charged particles upon interaction with a sample surface; and a second excitation pulse that generates a second portion of the first plurality of charged particles upon interaction with the sample surface, detecting a second plurality of charged-particles generated from a probe spot on the sample formed by the primary charged-particle beam and modified by interaction with a portion of the first plurality of charged particles; adjusting a first time delay between a first excitation pulse of the plurality of excitation pulses and a corresponding first detection pulse, adjusting a second time delay between a second excitation pulse of the plurality of excitation pulses and a corresponding second detection pulse, wherein the second time delay is different from the first time delay, and forming an image of the sample based on the detected second plurality of charged-particles.

Another aspect of the present disclosure is directed to a non-transitory computer readable medium storing a set of instructions that is executable by one or more processors of an electron beam apparatus to cause the electron beam apparatus to perform a method of determining a characteristic of a structure on a sample. The method may comprise activating an electron source to generate a primary electron beam that irradiates a region of the sample, the region comprising a structure, acquiring a plurality of images of the structure based on signal electrons generated by the irradiation of the region of the sample and detected using an electron detector, and determining the characteristic of the structure based on a rate of gray level variation of the plurality of images of the node.

Another aspect of the present disclosure is directed to a charged-particle beam apparatus comprising a charged-particle source configured to generate primary charged-particles along a primary optical axis and incident on a first region of a sample, an optical source configured to generate an optical beam interacting with a second region of the sample, the interaction between the optical beam and the second region of the sample may involve generating charge carriers in the sample based on a characteristic of the optical beam, and a charged-particle detector configured to detect secondary charged-particles generated by an interaction of the primary charged-particles with the first region of the sample, wherein an adjustment of the characteristic of the optical beam may cause a variation in a characteristic of the generated secondary charged-particles.

Another aspect of the present disclosure is directed to a method for identifying a defect in a sample. The method may comprise activating a charged-particle source to generate primary charged-particles along a primary optical axis and incident on a first region of the sample, activating an optical source to generate an optical beam having a characteristic and interacting with a second region of the sample, detecting secondary charged-particles generated by an interaction of the primary charged-particles with the first region of the sample, wherein adjusting the characteristic of the optical beam may cause a variation in a characteristic of the generated secondary charged-particles, acquiring a plurality of images of the first region of the sample, and identifying the defect based on a variation of a gray level of the plurality of images of the first region of the sample associated with the variation in the characteristic of the generated secondary charged-particles.

Another aspect of the present disclosure is directed to a non-transitory computer readable medium storing a set of instructions that is executable by one or more processors of a charged-particle beam apparatus to cause the charged-particle beam apparatus to perform a method of identifying a defect in a sample. The method may comprise activating a charged-particle source to generate primary charged-particles along a primary optical axis and incident on a first region of the sample, activating an optical source to generate an optical beam having a characteristic and interacting with a second region of the sample, detecting secondary charged-particles generated by an interaction of the primary charged-particles with the first region of the sample, wherein adjusting the characteristic of the optical beam causes a variation in a characteristic of the generated secondary charged-particles, acquiring a plurality of images of the first region of the sample, and identifying the defect based on a variation of the gray level of the plurality of images of the first region of the sample associated with the variation in the characteristic of the generated secondary charged-particles.

Another aspect of the present disclosure is directed to a system comprising a first particle source configured to generate a pulsed beam of particles supplying energy to an electrical structure disposed on a region of a sample, a charged-particle beam apparatus, comprising: a second particle source configured to generate a continuous beam of primary charged-particles incident on the region of the sample, a charged-particle detector configured to detect secondary charged-particles generated by an interaction between the primary charged-particles and the region of the sample, and a controller. The controller may include circuitry configured to apply a first signal to the first particle source, wherein the first signal comprises information associated with a timing of a plurality of pulses of the pulsed beam of particles. The controller may further be configured to apply a second signal to the charged-particle detector, the second signal configured to operate the charged-particle detector based on the first signal.

Another aspect of the present disclosure is directed to a method comprising generating, using a first particle source, a pulsed beam of particles supplying energy to an electrical structure disposed on a region of a sample, generating, using a second particle source, a continuous beam of primary charged-particles incident on the region of the sample, and detecting secondary charged-particles generated by an interaction between the primary charged-particles and the region of the sample, applying a first signal to the first particle source, wherein the first signal comprises information associated with a timing of a plurality of pulses of the pulsed beam of particles, and applying, a second signal to a charged-particle detector, the second signal configured to operate the charged-particle detector based on the first signal.

Another aspect of the present disclosure is directed to a non-transitory computer readable medium storing a set of instructions that is executable by one or more processors of an apparatus to cause the apparatus to perform a method. The method may comprise causing a first particle source to generate a pulsed beam of particles supplying energy to an electrical structure disposed on a region of a sample, causing a second particle source to generate a continuous beam of primary charged-particles incident on the region of the sample, detecting secondary charged-particles generated by an interaction between the primary charged-particles and the region of the sample, applying a first signal from the first particle source, wherein the first signal comprises information associated with a timing of a plurality of pulses of the pulsed beam of particles, and applying a second signal to the charged-particle detector, the second signal configured to operate the charged-particle detector based on the first signal.

Another aspect of the present disclosure is directed to a system comprising a first particle source configured to generate a pulsed beam of particles supplying energy to an electrical structure disposed on a region of a sample, a charged-particle beam apparatus comprising a second particle source configured to generate a pulsed beam of primary charged-particles incident on the region of the sample, and a controller. The controller may include circuitry configured to apply a first signal to cause the first particle source to generate the pulsed beam of particles, apply a second signal to cause the second particle source to generate the pulsed beam of primary charged-particles, and adjust a timing of application of the first and the second signals such that there is a time delay between the first and the second signals.

Another aspect of the present disclosure is directed to a method comprising applying a first signal to a first particle source to cause the first particle source to generate a pulsed beam of particles, the generated pulsed beam configured to supply energy to an electrical structure disposed on a region of a sample, applying a second signal to a second particle source to cause the second particle source to generate a pulsed beam of primary charged-particles incident on the region of the sample, and adjusting a timing of application of the first and the second signals such that there is a time delay between the applied first and the second signals.

Another aspect of the present disclosure is directed to a non-transitory computer readable medium storing a set of instructions that is executable by one or more processors of an apparatus to cause the apparatus to perform a method. The method may comprise applying a first signal to cause a first particle source to generate a pulsed beam of particles to supply energy to an electrical structure disposed on a region of a sample, applying a second signal to cause a second particle source to generate a pulsed beam of primary charged-particles incident on the region of the sample, and adjusting a timing of application of the first and the second signals such that there is a time delay between the applied first and the second signals.

Another aspect of the present disclosure is directed to a system comprising a first particle source configured to generate a pulsed beam of particles supplying energy to an electrical structure disposed on a region of a sample. The system may further comprise a charged-particle beam apparatus comprising: a second particle source configured to generate a continuous beam of primary charged-particles incident on the region of the sample; and a charged-particle detector configured to detect secondary charged-particles generated by an interaction between the primary charged-particles and the region of the sample, wherein the charged-particle detector is further configured to modify, prior to detecting, a characteristic of the secondary charged-particles; and a controller having circuitry configured to apply a first signal to cause the first particle source to generate the pulsed beam of particles, apply a second signal to cause the second particle source to generate the continuous beam of primary charged-particles, and adjust a timing of application of the first and the second signals such that there is a time delay between the first and the second signals.

Another aspect of the present disclosure is directed to a method comprising applying a first signal to cause a first particle source to generate a pulsed beam of particles, applying a second signal to cause a second particle source to generate a continuous beam of primary charged-particles, and adjusting a timing of application of the first and the second signals such that there is a time delay between the first and the second signals, and detecting, using a charged-particle detector, secondary charged-particles generated by an interaction between the primary charged-particles and a region of a sample, wherein the charged-particle detector is configured to modify, prior to detecting, a characteristic of the secondary charged-particles.

Another aspect of the present disclosure is directed to a non-transitory computer readable medium storing a set of instructions that is executable by one or more processors of a charged-particle beam apparatus to cause the charged-particle beam apparatus to perform a method. The method may comprise generating a pulsed beam of particles configured to supply energy to an electrical structure disposed on a region of a sample, generating a continuous beam of primary charged-particles incident on the region of the sample, detecting secondary charged-particles generated by an interaction between the primary charged-particles and the region of the sample, wherein a charged-particle detector is configured to modify, prior to detecting, a characteristic of the secondary charged-particles, applying a first signal to cause the first particle source to generate the pulsed beam of particles, applying a second signal to cause the second particle source to generate the continuous beam of primary charged-particles, and adjusting a timing of application of the first and the second signals such that there is a time delay between the first and the second signals.

Another aspect of the present disclosure is directed to a system comprising a first particle source configured to generate a pulsed beam of particles supplying energy to an electrical structure comprising a plurality of transistors. The electrical structure, in response to receiving the energy from the pulsed beam of particles, may be configured to switch an operation state of one or more transistors of the plurality of transistors, enabling a flow of transient charges, wherein the flow of transient charges causes an emission of a plurality of electromagnetic pulses. The system may further include a detector configured to detect the plurality of electromagnetic pulses.

Another aspect of the present disclosure is directed to a method comprising generating a pulsed beam of particles configured to supply energy to an electrical structure comprising a plurality of transistors; switching, in response to receiving the supplied energy from the pulsed beam of particles, an operation state of one or more transistors of the plurality of transistors, enabling a flow of transient charges, wherein the flow of transient charges causes an emission of a plurality of electromagnetic pulses at an emission frequency; and detecting the plurality of electromagnetic pulses to determine an oscillation frequency of the electrical structure based on the emission frequency of the plurality of electromagnetic pulses.

Another aspect of the present disclosure is directed to a non-transitory computer readable medium storing a set of instructions that is executable by one or more processors of an apparatus to cause the apparatus to perform a method. The method may comprise generating a pulsed beam of particles configured to supply energy to an electrical structure comprising a plurality of transistors; switching, in response to receiving the energy from the pulsed beam of particles, an operation state of one or more transistors of the plurality of transistors, enabling a flow of transient charges, wherein the flow of transient charges causes an emission of a plurality of electromagnetic pulses at an emission frequency; and detecting the plurality of electromagnetic pulses to determine an oscillation frequency of the electrical structure based on the emission frequency.

Other advantages of the embodiments of the present disclosure will become apparent from the following description taken in conjunction with the accompanying drawings wherein are set forth, by way of illustration and example, certain embodiments of the present invention.

BRIEF DESCRIPTION OF FIGURES

FIG. 10 is a process flowchart representing an exemplary method of observing a sample using charged-particle beam apparatus of FIG. 3, consistent with embodiments of the present disclosure.

FIG. 18 is a process flowchart of an exemplary method of detecting a defect by charge control in a semiconductor device, consistent with embodiments of the present disclosure.

FIG. 22 is a process flowchart of an exemplary method of detecting a defect using a VC mode in a charged-particle beam apparatus of FIG. 19, consistent with embodiments of the present disclosure.

FIG. 23 is a process flowchart of an exemplary method of detecting a defect using a VC mode in a charged-particle beam apparatus of FIG. 20, consistent with embodiments of the present disclosure.

FIG. 24 is a process flowchart of an exemplary method of detecting a defect using a VC mode in a charged-particle beam apparatus of FIG. 21, consistent with embodiments of the present disclosure.

DETAILED DESCRIPTION

Figure 1:
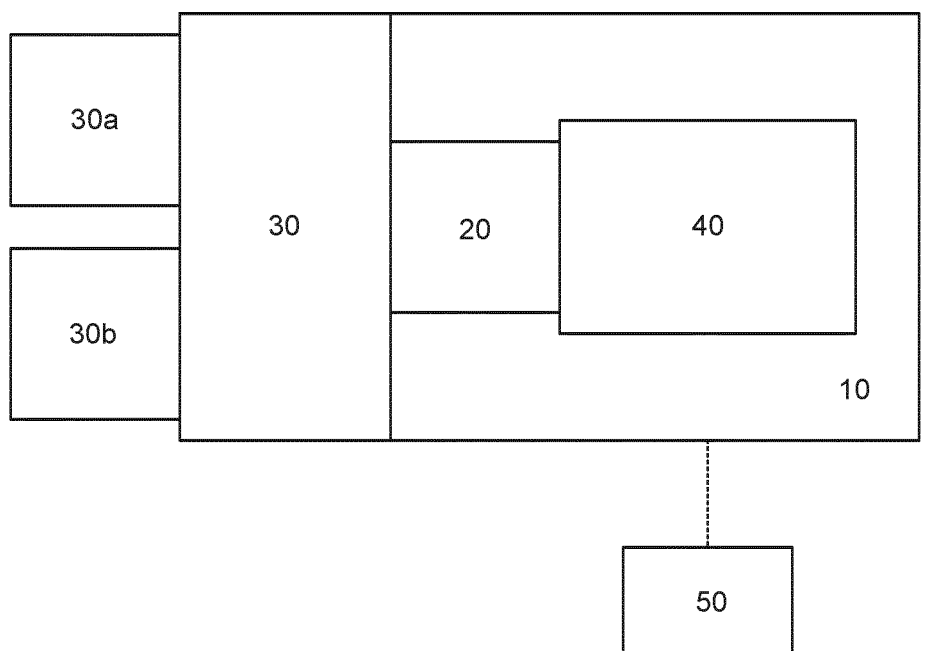
FIG. 1 is a schematic diagram illustrating an exemplary electron beam inspection (EBI) system, consistent with embodiments of the present disclosure.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations. Instead, they are merely examples of apparatuses and methods consistent with aspects related to the disclosed embodiments as recited in the appended claims. For example, although some embodiments are described in the context of utilizing electron beams, the disclosure is not so limited. Other types of charged particle beams may be similarly applied. Furthermore, other imaging systems may be used, such as optical imaging, photo detection, x-ray detection, etc.

Electronic devices are constructed of circuits formed on a piece of silicon called a substrate. Many circuits may be formed together on the same piece of silicon and are called integrated circuits or ICs. The size of these circuits has decreased dramatically so that many more of them can fit on the substrate. For example, an IC chip in a smart phone can be as small as a thumbnail and yet may include over 2 billion transistors, the size of each transistor being less than $\frac{1}{1000}$th the size of a human hair.

Making these extremely small ICs is a complex, time-consuming, and expensive process, often involving hundreds of individual steps. Errors in even one step have the potential to result in defects in the finished IC, thereby rendering it useless. Thus, one goal of the manufacturing process is to avoid such defects to maximize the number of functional ICs made in the process, that is, to improve the overall yield of the process.

One component of improving yield is monitoring the chip making process to ensure that it is producing a sufficient number of functional integrated circuits. One way to monitor the process is to inspect the chip circuit structures at various stages of their formation. Inspection can be carried out using a scanning electron microscope (SEM). An SEM can be used to image these extremely small structures, in effect, taking a "picture" of the structures. The image can be used to determine if the structure was formed properly and also if it was formed in the proper location. If the structure is defective, then the process can be adjusted so the defect is less likely to recur. It may be desirable to have higher throughput for defect detection and inspection processes to meet the requirements of IC manufacturers.

Detecting buried defects in vertical high-density structures, such as 3D NAND flash memory devices, can be challenging. One of several ways to detect buried or on-surface electrical defects in such devices is by using a voltage contrast method in a SEM. In this method, electrical conductivity differences in materials, structures, or regions of a sample cause contrast differences in SEM images thereof. In the context of defect detection, an electrical defect under the sample surface may generate a charging variation on the sample surface, so the electrical defect can be detected by a contrast in the SEM image of the sample surface. To enhance the voltage contrast, a process called pre-charging or flooding may be employed in which a region of interest of the sample may be exposed to a large beam current before an inspection using a small beam current but high imaging resolution. For the inspection, some of the advantages of flooding may include reduction of charging of the wafer to minimize distortion of images due to the charging, and in some cases, increase of charging of the wafer to enhance the difference of defective and surrounding non-defective features in images, among other things.

Defect inspection by voltage contrast techniques in a SEM may include, among other things, pre-charging the sample using a flooding beam, detecting signal electrons from the sample, and forming images of the region of interest based on the number and type of signal electrons detected by an electron detector. In currently existing inspection systems, the time period between pre-charging the sample and acquiring images based on the detected signal is on the order of milliseconds to several microseconds. In some cases, such as the detection of high-resistance defects, reducing the time period between pre-charging and detection using line scan averages and spot-to-spot comparisons may be beneficial to detect transient defects with fast decay rates. Although shorter time periods between pre-charging and detection may result in improved detection sensitivity, however, doing so may negatively affect the inspection throughput.

An IC chip such as an ASIC (Application Specific Integrated Circuit) chip may comprise circuitry components including transistors, capacitors, diodes, SRAM and/or DRAM memory cells, oscillators, among other things. The time constant of an R-C(Resistor-Capacitor) circuit is referred to as the time required to charge a capacitor, through a resistor, from an initial charge voltage of 0 to 63.2% of the applied voltage, or the time required to discharge the capacitor to approximately 36.8% of its initial charge voltage. In an ASIC chip, based on the application, the time constant of an RC circuit may be several femtoseconds (fs). Even if there is a high-resistance defect in the RC circuit causing the capacitor to discharge slower and increasing the time constant to several picoseconds, the existing techniques may be unable to detect the defect. In addition, if a defect causes only a transient change in the surface charging effect, the change in secondary electron signal may be undetectable because of the low signal-to-noise ratio. Therefore, for voltage contrast defect detection, it may be desirable to enhance the voltage contrast signal in the time frame relevant to the detection of transient defects present in a device to improve defect sensitivity while maintaining the inspection throughput.

In semiconductor devices, buried defects such as voids or particles may cause full opens and leakages (shorts), or in some cases, a partial open or a partial leakage. Existing voltage contrast (VC) inspection techniques, though useful for detecting defects that cause full opens or shorts, may be incapable of detecting voids that cause partial opens or partial leakage in a device. Generally, voltage contrast inspection methods involving flood exposure of electrons on a surface, rely on differences in surface potential measurements of structures on the surface. The gray level of a pixel representing a surface region with high surface potential is higher (appears brighter in a SEM image) than the gray level of the pixel representing a lower surface potential region. The gray levels of structures are compared to a reference gray level to detect a defect. Existing voltage contrast inspection techniques, in addition to being a mostly qualitative characterization technique, may be inadequate to detect defects that cause partial opens and shorts that do not generate a strong gray level contrast. Furthermore, as the semiconductor nodes become smaller and device geometries become increasingly complex, in addition to qualitative defect detection, quantitative analysis may be desirable as well.

In a semiconductor FAB, monitoring the process integrity and tool health throughout the fabrication process may be desirable to detect irregularities or defects, and in some instances, may help predict occurrence of a defect. One of several ways to monitor process and tool health during fabrication of semiconductor devices may include extracting electrical or physical characteristics of the device such as contact resistance, dielectric capacitance, film thickness, stoichiometry, composition, critical dimension, surface energy, etc. Some of the existing techniques to extract these characteristics may include electrical methods such as forming electrical test structures that can be probed at one or more process steps, optical methods such as optical reflectance spectroscopy or scatterometry, or optoelectronic techniques such as critical dimension scanning electron microscopy (CDSEM) metrology to determine critical dimensions, linewidths and space. However, these existing techniques have limitations that render them inadequate, ineffective, or inaccurate. For example, electrical test structures are not always representative of the product circuitry, and the measurements may be made after the probe pads are formed. Optical reflectance spectroscopy or scatterometry may provide average measurements over a large region and may be limited in their scope of parameters. Although CDSEM metrology may provide accurate critical dimension measurements, it is time consuming, and may therefore, negatively impact the inspection throughput. Electrical parameters such as resistance, derived from CD measurements may be inaccurate because CDSEM metrology does not account for the effect of underlying layers and their interaction with the structure of interest. Therefore, a dynamic voltage contrast metrology technique may be desirable to quantitatively characterize defects and extract electrical as well as physical wafer parameters to monitor process, tool, and wafer health, while maintaining the inspection throughput.

Precharging a sample (e.g., a wafer) in a VC inspection method may involve flooding the sample with electrons or photons. In either case, the inspection method relies on differences in surface potential measurements of structures causing a contrast difference in appearance. Generally, a defect-free normal metal contact appears brighter than a defective contact such as a high-resistance or an open. In a reverse-biased blocking p-n junction, however, the contrast between a normal and a defective contact may not be high enough, partly because of the lack of neutralizing charges. One of several ways to overcome this challenge may include flooding the sample using an optical source such as a laser to generate an abundance of electron-hole pairs, thereby providing neutralizing charges and varying the surface potential such that a high contrast may be obtained. Although the laser may provide charges to neutralize the positive charges generated during electron-beam inspection, the generated charge carriers may be excessive and there may be several issues that arise. As an example, (1) a leaky device such as a device with a leakage path for built-up charges, may appear as bright as a normal device, rendering the inspection technique inadequate or even misleading, and (2) a high-resistance contact may be interpreted and categorized as an open depending on the ensemble of gray level values in the field-of-view during inspection. Therefore, a dynamic charge control technique may be desirable to accurately identify electrical defects in a semiconductor device during fabrication of the device.

The electrical characteristics, among other things, of an IC chip, may impact the cost and yield of the chip. Electrical properties including maximum operating frequency, circuit speed, and total power consumed by the IC chip, among other things, may determine the dollar value of the IC chip. The electrical properties may vary based on the location of the chip on the wafer. As an example, edge dies may be susceptible to more defects, irregularities, etc. compared to the dies located towards the center of the wafer, thereby negatively impacting the overall yield and throughput. Although electrical tests are performed after every metallization step in the fabrication process, however, these tests only provide limited information about the actual circuits located in the die and away from the scribe lines. Further, because a probe card may be physically connected to the metal contacts, these tests may damage the contact, generating more defects. Therefore, it may be desirable to determine the electrical performance of a circuit such as by measuring an oscillation frequency of a test structure, during chip fabrication while maintaining the overall yield and throughput.

Some embodiments of the present disclosure are directed to charged-particle beam apparatuses and methods of forming an image of a sample. The apparatus may include a charged-particle source, an optical source, a charged-particle detector, and a controller having circuitry. The charged-particle source may comprise an electron source configured to generate a primary electron beam, which upon interaction with the sample generates secondary electrons or backscattered electrons. The optical source may be configured to generate a pulsed laser beam comprising excitation pulses of sub-picosecond pulse duration. Upon interaction with the sample, the excitation pulses generate photoelectrons, causing the sample surface to flood with charges, thereby enhancing the voltage contrast signal in the secondary electron or backscattered electron signal detected by the charged-particle detector. The controller may comprise a synchronous digital circuit configured to adjust a time delay between the excitation pulse and the detection signal to adjust a sensitivity for defect detection by the charged-particle detector. The ultrashort pulse width of the optical beam may enable detection of defects with fast decay rates in the order of several femtoseconds or characterize circuit response such as speed or frequency, in a device.

Some embodiments of the present disclosure are directed to electron beam inspection apparatuses and methods to determine characteristics of a structure on a semiconductor wafer. The apparatus may include an electron source, an electron detector, a controller having circuitry, and an image processing system. In voltage contrast inspection mode of operation of the electron beam inspection apparatus, the electron source may be activated to generate a primary electron beam, which upon interaction with the sample generates signal electrons such as secondary or backscattered electrons. The signal electrons may be detected by an electron detector. The controller includes circuitry configured to acquire a plurality of images of a region of the sample comprising a node, based on the detected signal electrons. The image processor may determine a gray level value and a gradient of the gray level value for the node or a structure associated with the node in the plurality of images. Based on the gradient of the gray level value of the structure, a model may predict the electrical and physical characteristics of the structure.

Relative dimensions of components in drawings may be exaggerated for clarity. Within the following description of drawings, the same or like reference numbers refer to the same or like components or entities, and only the differences with respect to the individual embodiments are described. As used herein, unless specifically stated otherwise, the term "or" encompasses all possible combinations, except where infeasible. For example, if it is stated that a component may include A or B, then, unless specifically stated otherwise or infeasible, the component may include A, or B, or A and B. As a second example, if it is stated that a component may include A, B, or C, then, unless specifically stated otherwise or infeasible, the component may include A, or B, or C, or A and B, or A and C, or B and C, or A and B and C.

Reference is now made to FIG. 1, which illustrates an exemplary electron beam inspection (EBI) system 100 consistent with embodiments of the present disclosure. As shown in FIG. 1, charged particle beam inspection system 100 includes a main chamber 10, a load-lock chamber 20, an electron beam tool 40, and an equipment front end module (EFEM) 30. Electron beam tool 40 is located within main chamber 10. While the description and drawings are directed to an electron beam, it is appreciated that the embodiments are not used to limit the present disclosure to specific charged particles.

EFEM 30 includes a first loading port 30a and a second loading port 30b. EFEM 30 may include additional loading port(s). First loading port 30a and second loading port 30b receive wafer front opening unified pods (FOUPs) that contain wafers (e.g., semiconductor wafers or wafers made of other material(s)) or samples to be inspected (wafers and samples are collectively referred to as "wafers" hereafter). One or more robot arms (not shown) in EFEM 30 transport the wafers to load-lock chamber 20.

Load-lock chamber 20 is connected to a load/lock vacuum pump system (not shown), which removes gas molecules in load-lock chamber 20 to reach a first pressure below the atmospheric pressure. After reaching the first pressure, one or more robot arms (not shown) transport the wafer from load-lock chamber 20 to main chamber 10. Main chamber 10 is connected to a main chamber vacuum pump system (not shown), which removes gas molecules in main chamber 10 to reach a second pressure below the first pressure. After reaching the second pressure, the wafer is subject to inspection by electron beam tool 40. In some embodiments, electron beam tool 40 may comprise a single-beam inspection tool.

Controller 50 may be electronically connected to electron beam tool 40 and may be electronically connected to other components as well. Controller 50 may be a computer configured to execute various controls of charged particle beam inspection system 100. Controller 50 may also include processing circuitry configured to execute various signal and image processing functions. While controller 50 is shown in FIG. 1 as being outside of the structure that includes main chamber 10, load-lock chamber 20, and EFEM 30, it is appreciated that controller 50 can be part of the structure.

While the present disclosure provides examples of main chamber 10 housing an electron beam inspection system, it should be noted that aspects of the disclosure in their broadest sense, are not limited to a chamber housing an electron beam inspection system. Rather, it is appreciated that the foregoing principles may be applied to other chambers as well.

Figure 2:
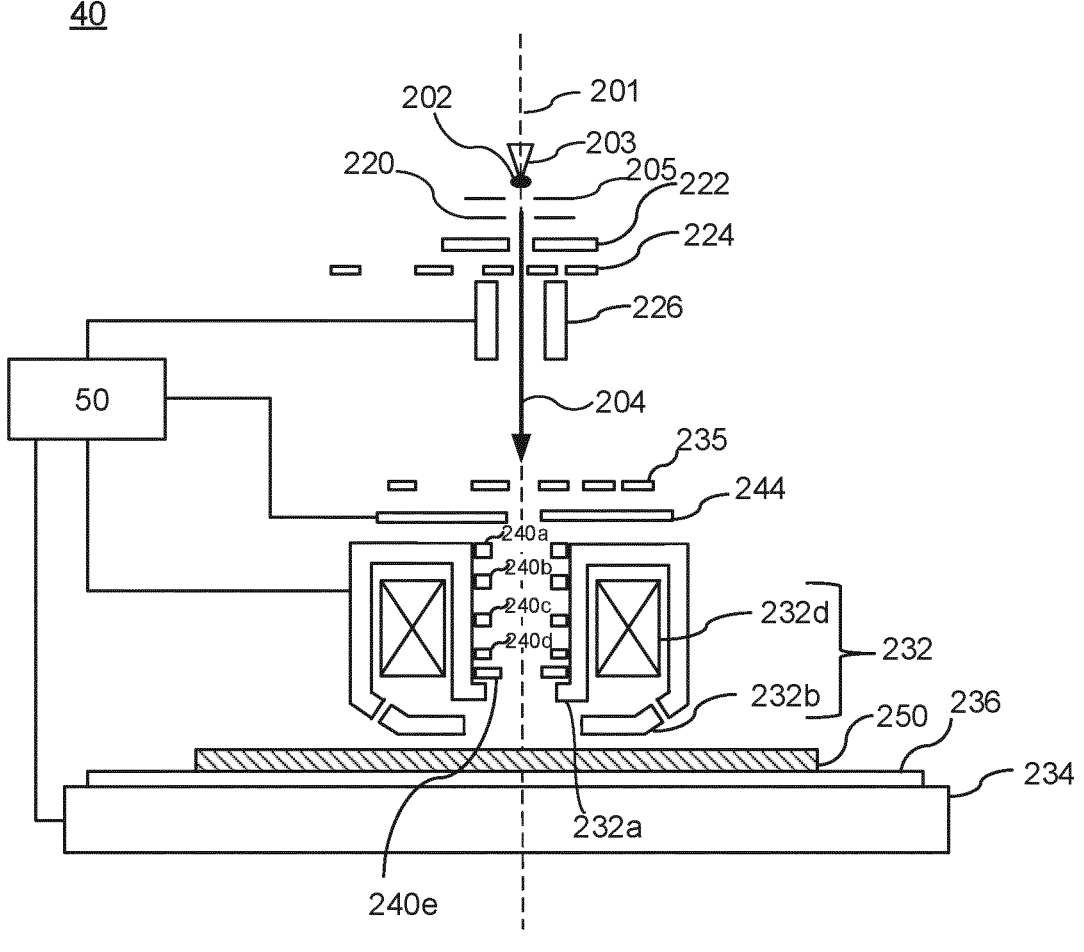
FIG. 2 is a schematic diagram illustrating an exemplary electron beam tool that can be a part of the exemplary electron beam inspection system of FIG. 1, consistent with embodiments of the present disclosure.

Reference is now made to FIG. 2, which illustrates a schematic diagram illustrating an exemplary configuration of electron beam tool 40 that can be a part of the exemplary charged particle beam inspection system 100 of FIG. 1, consistent with embodiments of the present disclosure. In some embodiments, the charged-particles may comprise electrons and the charged-particle source may comprise an electron source. Electron beam tool 40 (also referred to herein as apparatus 40) may comprise an electron emitter, which may comprise a cathode 203, an extractor electrode 205, a gun aperture 220, and an anode 222. Electron beam tool 40 may further include a Coulomb aperture array 224, a condenser lens 226, a beam-limiting aperture array 235, an objective lens assembly 232, and an electron detector 244. Electron beam tool 40 may further include a sample holder 236 supported by motorized stage 234 to hold a sample 250 to be inspected. It is to be appreciated that other relevant components may be added or omitted, as needed.

In some embodiments, electron emitter may include cathode 203, an anode 222, wherein primary electrons can be emitted from the cathode and extracted or accelerated to form a primary electron beam 204 that forms a primary beam crossover 202. Primary electron beam 204 can be visualized as being emitted from primary beam crossover 202.

In some embodiments, the electron emitter, condenser lens 226, objective lens assembly 232, beam-limiting aperture array 235, and electron detector 244 may be aligned with a primary optical axis 201 of apparatus 40. In some embodiments, electron detector 244 may be placed off primary optical axis 201, along a secondary optical axis (not shown).

Objective lens assembly 232, in some embodiments, may comprise a modified swing objective retarding immersion lens (SORIL), which includes a pole piece 232a, a control electrode 232b, a beam manipulator assembly comprising deflectors 240a, 240b, 240d, and 240e, and an exciting coil

232d. In a general imaging process, primary electron beam 204 emanating from the tip of cathode 203 is accelerated by an accelerating voltage applied to anode 222. A portion of primary electron beam 204 passes through gun aperture 220, and an aperture of Coulomb aperture array 224, and is focused by condenser lens 226 so as to fully or partially pass through an aperture of beam-limiting aperture array 235. The electrons passing through the aperture of beam-limiting aperture array 235 may be focused to form a probe spot on the surface of sample 250 by the modified SORIL lens and deflected to scan the surface of sample 250 by one or more deflectors of the beam manipulator assembly. Secondary electrons emanated from the sample surface may be collected by electron detector 244 to form an image of the scanned area of interest.

In objective lens assembly 232, exciting coil 232d and pole piece 232a may generate a magnetic field. A part of sample 250 being scanned by primary electron beam 204 can be immersed in the magnetic field and can be electrically charged, which, in turn, creates an electric field. The electric field may reduce the energy of impinging primary electron beam 204 near and on the surface of sample 250. Control electrode 232b, being electrically isolated from pole piece 232a, may control, for example, an electric field above and on sample 250 to reduce aberrations of objective lens assembly 232 and control focusing situation of signal electron beams for high detection efficiency, or avoid arcing to protect sample. One or more deflectors of beam manipulator assembly may deflect primary electron beam 204 to facilitate beam scanning on sample 250. For example, in a scanning process, deflectors 240a, 240b, 240d, and 240e can be controlled to deflect primary electron beam 204, onto different locations of top surface of sample 250 at different time points, to provide data for image reconstruction for different parts of sample 250. It is noted that the order of 240a-e may be different in different embodiments.

Backscattered electrons (BSEs) and secondary electrons (SEs) can be emitted from the part of sample 250 upon receiving primary electron beam 204. A beam separator 240c can direct the secondary or scattered electron beam(s), comprising backscattered and secondary electrons, to a sensor surface of electron detector 244. The detected secondary electron beams can form corresponding beam spots on the sensor surface of electron detector 244. Electron detector 244 can generate signals (e.g., voltages, currents) that represent the intensities of the received secondary electron beam spots, and provide the signals to a processing system, such as controller 50. The intensity of secondary or backscattered electron beams, and the resultant secondary electron beam spots, can vary according to the external or internal structure of sample 250. Moreover, as discussed above, primary electron beam 204 can be deflected onto different locations of the top surface of sample 250 to generate secondary or scattered electron beams (and the resultant beam spots) of different intensities. Therefore, by mapping the intensities of the secondary electron beam spots with the locations of sample 250, the processing system can reconstruct an image that reflects the internal or external structures of wafer sample 250.

In some embodiments, controller 50 may comprise an image processing system that includes an image acquirer (not shown) and a storage (not shown). The image acquirer may comprise one or more processors. For example, the image acquirer may comprise a computer, server, mainframe host, terminals, personal computer, any kind of mobile computing devices, and the like, or a combination thereof. The image acquirer may be communicatively coupled to electron detector 244 of apparatus 40 through a medium such as an electrical conductor, optical fiber cable, portable storage media, IR, Bluetooth, internet, wireless network, wireless radio, among others, or a combination thereof. In some embodiments, the image acquirer may receive a signal from electron detector 244 and may construct an image. The image acquirer may thus acquire images of regions of sample 250. The image acquirer may also perform various post-processing functions, such as generating contours, superimposing indicators on an acquired image, and the like. The image acquirer may be configured to perform adjustments of brightness and contrast, etc. of acquired images. In some embodiments, the storage may be a storage medium such as a hard disk, flash drive, cloud storage, random access memory (RAM), other types of computer readable memory, and the like. The storage may be coupled with the image acquirer and may be used for saving scanned raw image data as original images, and post-processed images.

In some embodiments, controller 50 may include measurement circuitries (e.g., analog-to-digital converters) to obtain a distribution of the detected secondary electrons and backscattered electrons. The electron distribution data collected during a detection time window, in combination with corresponding scan path data of a primary beam 204 incident on the sample (e.g., a wafer) surface, can be used to reconstruct images of the wafer structures under inspection. The reconstructed images can be used to reveal various features of the internal or external structures of sample 250, and thereby can be used to reveal any defects that may exist in the wafer.

In some embodiments, controller 50 may control motorized stage 234 to move sample 250 during inspection. In some embodiments, controller 50 may enable motorized stage 234 to move sample 250 in a direction continuously at a constant speed. In other embodiments, controller 50 may enable motorized stage 234 to change the speed of the movement of sample 250 over time depending on the steps of scanning process.

As is commonly known in the art, interaction of charged particles, such as electrons of a primary electron beam with a sample (e.g., sample 315 of FIG. 3, discussed later), may generate signal electrons containing compositional and topographical information about the probed regions of the sample. Secondary electrons (SEs) may be identified as signal electrons with low emission energies, and backscattered electrons (BSEs) may be identified as signal electrons with high emission energies. Because of their low emission energy, an objective lens assembly may direct the SEs along electron paths and focus the SEs on a detection surface of a high speed in-lens electron detector (e.g., electron detector 306A of FIG. 3, discussed later) placed inside the SEM column. BSEs traveling along electron paths may be detected by the electron detector 306A, or another in-lens backscattered electron detector (e.g., detector 306B of FIG. 3, discussed later).

Detecting buried defects, physical or electrical in nature, in vertical high-density structures such as 3D NAND flash memory devices, can be challenging. One of several ways to detect buried or on-surface electrical defects in such devices is by using a voltage contrast method in a SEM. In this method, electrical conductivity differences in materials, structures, or regions of a sample cause contrast differences in SEM images thereof. In the context of defect detection, an electrical defect under the sample surface may generate a charging variation on the sample surface, so the electrical defect can be detected by a contrast in the SEM image of the sample surface. To enhance the voltage contrast, a process called pre-charging or flooding may be employed in which the region of interest of the sample may be exposed to a large beam current before an inspection using a small beam current but high imaging resolution. For the inspection, some of the advantages of flooding may include reduction of charging of the wafer to minimize distortion of images due to the charging, and in some cases, increase of charging of the wafer to enhance difference of defective and surrounding non-defective features in images, among other things.

Figure 3:
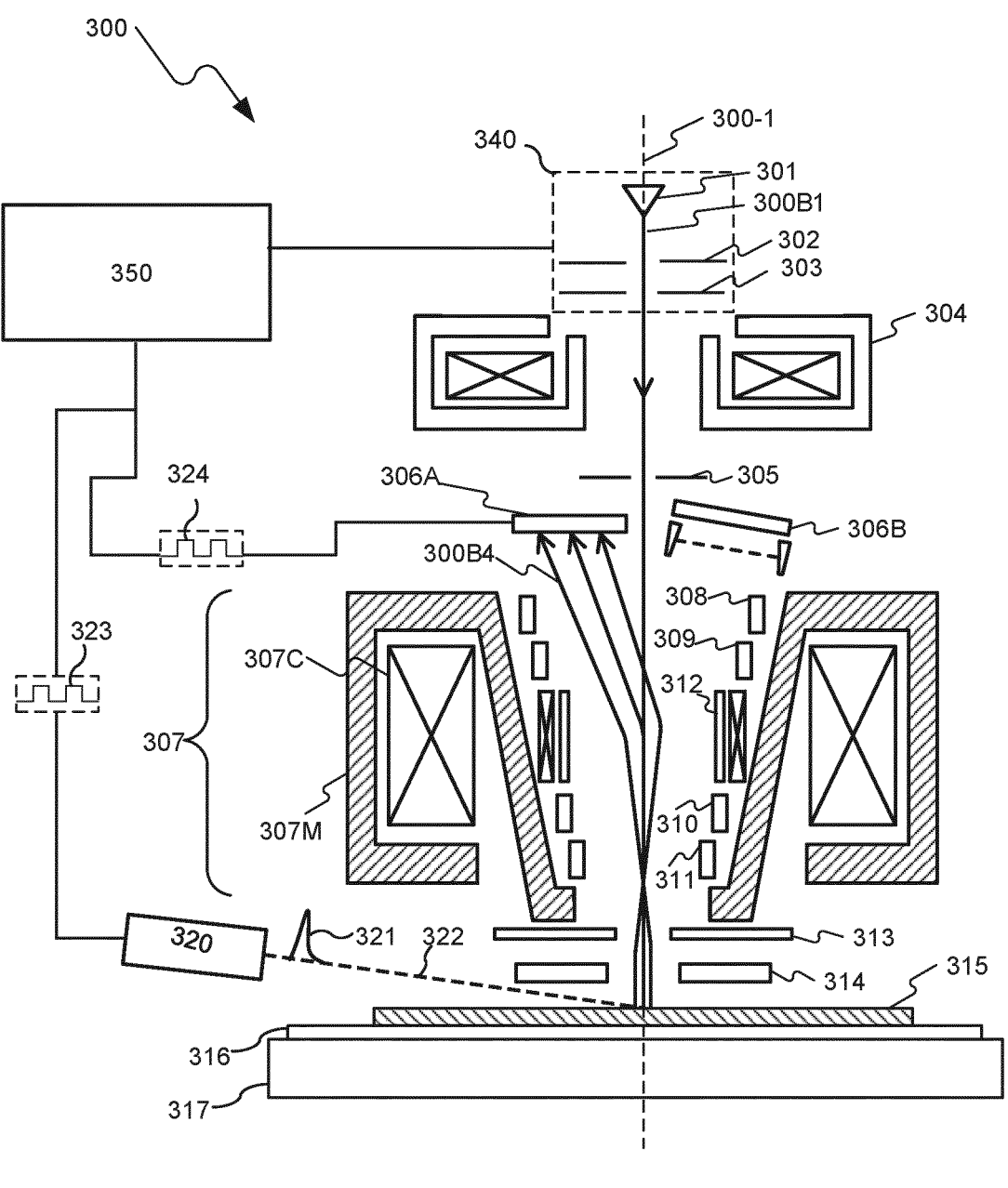
FIG. 3 is a schematic diagram of an exemplary charged-particle beam apparatus comprising a photon source and a controller, consistent with embodiments of the present disclosure.

Reference is now made to FIG. 3, which illustrates a schematic diagram of an exemplary charged-particle beam apparatus 300 (also referred to as apparatus 300), consistent with embodiments of the present disclosure. Apparatus 300 may comprise a charged-particle source assembly 340 (also referred to as an electron source assembly) configured to emit primary electrons from a cathode 301 and extract the emitted electrons using an extractor electrode 302 to form a primary electron beam 300B1 along a primary optical axis 300-1. Apparatus 300 may further comprise an anode 303, a condenser lens 304, a beam-limiting aperture array 305, signal electron detectors 306A, 306B, and 313, an objective lens assembly 307, a scanning deflection unit comprising primary electron beam deflectors 308, 309, 310, and 311, a beam separator 312, and a control electrode 314. Primary electron beam 300B1 may interact with a portion of a sample 315 placed on a stage 316 configured to be secured on a sample holder 317. Apparatus 300 may further comprise an optical source 320 configured to irradiate a surface of sample 315 with a plurality of excitation pulses 321 of an optical beam. One or both of signal electron detectors 306A and 306B may be in-lens electron detectors located inside the electron-optical column of a SEM and may be arranged rotationally symmetric around primary optical axis 300-1, or in any other suitable arrangement. Apparatus 300 may further comprise a controller 350 in electrical communication with optical source 320 and signal electron detectors 306A and 306B. In some embodiments, in addition to performing substantially similar functions as controller 50 of FIG. 2, controller 350 may perform other functions including, but not limited to, activating/deactivating optical source 320, or applying and adjusting electrical signals to signal electron detectors 306A, 306B, and 313, among other functions. It is to be appreciated that relevant components may be added, omitted, or reordered, as appropriate.

Electron source assembly 340 may include a thermionic source configured to emit electrons upon being supplied thermal energy to overcome the work function of the source, or a field emission source configured to emit electrons upon being exposed to a large electrostatic field, or a photocathode configured to emit electrons upon being exposed to photons (quantum of light), or other suitable electron source. In the case of a field emission source, electron source assembly 340 may be electrically connected to a controller, such as controller 50 of FIG. 2, configured to apply and adjust a voltage signal based on a desired landing energy, sample analysis, source characteristics, among other things. Extractor electrode 302 may be configured to extract or accelerate electrons emitted from a field emission gun, for example, to form primary electron beam 300B1 that forms a virtual or a real primary beam crossover (not illustrated) along primary optical axis 300-1. Primary electron beam 300B1 may be visualized as being emitted from the primary beam crossover. In some embodiments, controller 50 may be configured to apply and adjust a voltage signal to extractor electrode 302 to extract or accelerate electrons generated from electron source assembly 340. An amplitude of the voltage signal applied to extractor electrode 302 may be different from the amplitude of the voltage signal applied to cathode 301.

Apparatus 300 may comprise condenser lens 304 configured to receive a portion of or a substantial portion of primary electron beam 300B1 and to focus primary electron beam 300B1 on beam-limiting aperture array 305. Condenser lens 304 may be substantially similar to condenser lens 226 of FIG. 2 and may perform substantially similar functions. Although shown as a magnetic lens in FIG. 3, condenser lens 304 may be an electrostatic, a magnetic, an electromagnetic, or a compound electromagnetic lens, among others. Condenser lens 304 may be electrically coupled with controller 50, as illustrated in FIG. 2. In some embodiments, controller 350 may apply an electrical excitation signal to condenser lens 304 to adjust the focusing power of condenser lens 304 based on factors including, but are not limited to, operation mode, application, desired analysis, sample material being inspected, among other things.

Apparatus 300 may further comprise beam-limiting aperture array 305 configured to limit beam current of primary electron beam 300B1 passing through one of a plurality of beam-limiting apertures of beam-limiting aperture array 305. Although, only one beam-limiting aperture is illustrated in FIG. 3, beam-limiting aperture array 305 may include any number of apertures having uniform or non-uniform aperture size, cross-section, or pitch. In some embodiments, beam-limiting aperture array 305 may be disposed downstream of condenser lens 304 or immediately downstream of condenser lens 304 and substantially perpendicular to primary optical axis 300-1. In some embodiments, beam-limiting aperture array 305 may be configured as an electrically conducting structure comprising a plurality of beam-limiting apertures. Beam-limiting aperture array 305 may be electrically connected via a connector (not illustrated) with controller 350, which may be configured to instruct that a voltage be supplied to beam-limiting aperture array 305. The supplied voltage may be a reference voltage such as, for example, ground potential. Controller 350 may also be configured to maintain or adjust the supplied voltage. Controller 50 may be configured to adjust the position of beam-limiting aperture array 305.

Apparatus 300 may comprise one or more signal electron detectors 306A, 306B, or 313. Signal electron detectors 306A, 306B, or 313 may be configured to detect secondary electrons and backscattered electrons based on the emission energy, emission polar angle, emission azimuthal angle of the backscattered electrons, among other things. In some embodiments, signal electron detectors 306A, 306B, or 313 may be configured to detect secondary electrons, backscattered electrons, or auger electrons. Signal electron detector 313 may be disposed downstream of signal electron detector 306. Signal electrons having low emission energy (typically ≤50 eV) or small emission polar angles, emitted from sample 315 may comprise secondary electron beam(s) 300B4, and signal electrons having high emission energy (typically >50 eV) and medium emission polar angles may comprise backscattered electrons. Electron detector 306B may be an in-lens detector configured to detect a portion of secondary and backscattered electrons based on characteristics including, but not limited to, the emission energy, or emission angle of the signal electrons. In some embodiments, 300B4 may comprise secondary electrons, low-energy backscattered electrons, or high-energy backscattered electrons with small emission polar angles. It is appreciated that although not illustrated, a portion of backscattered electrons may be detected by electron detector 306A, and a portion of secondary electrons may be detected by electron detector 306B. In overlay metrology and inspection applications, electron detector 306A may be useful to detect secondary electrons generated from a surface layer and backscattered electrons generated from the underlying deeper layers, such as deep trenches or high aspect-ratio holes.

Apparatus 300 may further include objective lens assembly 307 configured to focus primary electron beam 300B1 on a surface of sample 315. Controller 350 may apply an electrical excitation signal to the coils 307C of objective lens assembly 307 to adjust the focusing power of objective lens assembly 307 based on factors including, but are not limited to, primary beam energy, application need, desired analysis, sample material being inspected, among other things. Objective lens assembly 307 may be further configured to focus signal electrons, such as secondary electrons having low emission energies, or backscattered electrons having high emission energies, on a detection surface of electron detectors 306A or 306B. In some embodiments, objective lens assembly 307 may be substantially similar to or perform substantially similar functions as objective lens assembly 232 of FIG. 2. In some embodiments, objective lens assembly 307 may be a compound objective lens comprising a magnetic lens 307M, and an electrostatic lens (not illustrated) formed by control electrode 314 and sample 315.

Apparatus 300 may further include a scanning deflection unit comprising primary electron beam deflectors 308, 309, 310, and 311, configured to dynamically deflect primary electron beam 300B1 on a surface of sample 315. In some embodiments, scanning deflection unit comprising primary electron beam deflectors 308, 309, 310, and 311 may be referred to as a beam manipulator or a beam manipulator assembly. The dynamic deflection of primary electron beam 300B1 may cause a desired area or a desired region of interest of sample 315 to be scanned, for example in a raster scan pattern, to generate SEs and BSEs for sample inspection. One or more primary electron beam deflectors 308, 309, 310, and 311 may be configured to deflect primary electron beam 300B1 in X-axis or Y-axis, or a combination of X- and Y-axes. As used herein, X-axis and Y-axis form Cartesian coordinates, and primary electron beam 300B1 propagates along Z-axis or primary optical axis 300-1.

Electrons are negatively charged particles and travel through the electron-optical column, and may do so at high energy and high speeds. One way to deflect the electrons is to pass them through an electric field or a magnetic field generated, for example, by a pair of plates held at two different potentials, or passing current through deflection coils, among other techniques. Varying the electric field or the magnetic field across a deflector (e.g., primary electron beam deflectors 308, 309, 310, and 311 of FIG. 3) may vary the deflection angle of electrons in primary electron beam 300B1 based on factors including, but are not limited to, electron energy, magnitude of the electric field applied, dimensions of deflectors, among other things.

Apparatus 300 may further include optical source 320 configured to generate an optical beam 322. In some embodiments, optical beam 322 may be a pulsed optical beam comprising one or more excitation pulses 321. As used herein, an excitation pulse refers to a pulse of optical energy (a flash of light) generated by an optical source (e.g., optical source 320 of FIG. 3) and configured to impart energy to or "excite" a portion of a sample (e.g., sample 315 of FIG. 3) upon interaction. In the context of this disclosure, excitation refers to photoionization—a physical interaction of electromagnetic radiation with matter resulting in the dissociation of that matter into electrically charged particles. The excitation pulse may be represented by a pulse waveform having a pulse width, a pulse frequency, a pulse energy, and a pulse repetition rate, among other characteristics.

In some embodiments, optical source 320 may comprise a solid-state laser, a semiconductor laser, a gas laser, a dye laser, a chemical laser, a diode-pumped fiber laser, a gain-switched laser, or gain-switched laser diodes coupled with fiber amplifiers. In some embodiments, optical source 320 may comprise a femtosecond laser source configured to generate ultrashort optical pulses having a pulse width, also referred to herein as pulse duration, of less than 1 picosecond (<10-12 seconds). A femtosecond (fs) laser may generate sub-picosecond optical pulses with a pulse duration in the range of 1 to 1000 fs (1 fs=10-15 seconds). In some embodiments, the generated excitation pulse may have a pulse duration of <500 fs, preferably <400 fs. In some embodiments, the pulse duration may be adjusted or selected based on, but not limited to, a time constant of a transient effect to be investigated, among other things. For example, detecting a change in resistance or capacitance of an electronic circuit of an IC chip having ultrafast discharge times.

In some embodiments, such as the embodiment illustrated in FIG. 3, controller 350 may be configured to activate/deactivate optical source 320. Activation of optical source 320 may include applying an electrical signal 323 to cause optical source 320 to generate pulsed optical beam 322. Additionally, or alternatively, controller 350 may be configured to adjust characteristics of pulsed optical beam 322 generated by optical source 320. For example, in a broad-spectrum laser, controller 350 may adjust the wavelength of light emitted from optical source 320 by activating appropriate optical filters, or in a monochromatic laser source, controller 350 may fine-tune the bandwidth of the emitted optical beam 322 by adjusting characteristics of electrical signal 323.

As is commonly known in the art, photoionization is a probabilistic phenomenon involving interaction of an electromagnetic radiation (e.g., an optical beam) with a surface to generate electrically charged particles, such as electrons. The electrons generated by the interaction of the optical beam and atoms of the target surface are referred to as photoelectrons. The probability of ionization may depend on factors including, but are not limited to, the beam wavelength, beam energy, number of photons present at a specific time interval and location within a volume of the sample, among other things. As an example, the energy of a photon of an optical beam in the ultra-violet (UV) wavelength domain (~345 nm) is approximately 3.59 eV, which may be inadequate to eject electrons from a metal having a work function >4.5 eV. However, two photons of the optical beam may be simultaneously absorbed by an atom or a molecule of the sample such that the combined energy imparted is greater than the threshold energy required to eject an electron from the metal atom, thereby generating photoelectrons. In another example, if the optical beam has a wavelength in the infra-red (IR) domain (~1035 nm), the energy of a photon of the optical beam is approximately 1.2 eV. In such a case, multiple photons may be simultaneously absorbed by a metal atom to cause photoionization of the metal to generate photoelectrons. It is to be appreciated photoelectrons may be generated by two-photon absorption, multiphoton absorption, or a combination thereof, based on factors including, but not limited to, the target material, wavelength of optical beam used, absorption coefficient, among other things.

Controller 350 may comprise a synchronous digital circuit. The digital circuit may include a clock generator circuit, a duty cycle clock, a frequency divider circuit, clock multiplier circuit, among other suitable components configured to perform functions associated with synchronizing the operations of controller 350. The synchronous digital circuit may comprise an electronic oscillator configured to generate a string of pulses, also referred to as "clock signals." The clock signal may be a symmetrical or an asymmetrical square wave, a sine wave, a triangular wave, or any other wave type suitable for synchronizing different parts of the circuit, or different circuits in a system. As an example, a synchronous digital circuit of controller 350 may generate and apply electrical signals 323 and 324 to optical source 320 and signal electron detector 306A, respectively. In some embodiments, electrical signals 323 and 324 may have the same frequency, but a different phase to cause a time delay between the detection pulse (described later) associated with a signal electron detector (e.g., signal electron detector 306A) and excitation pulse associated with optical source 320. In some embodiments, controller 350 may be an asynchronous digital circuit, a master clock, or other suitable driver circuit configured to synchronize charging of sample using excitation pulse and detection of signal electrons using electron detectors.

In some embodiments, controller 350 may adjust the excitation pulse characteristics by adjusting electrical signal 323 to optical source 320. Adjustment of the excitation pulse characteristics may include an adjustment of the pulse duration, pulse energy, pulse repetition rate, among other things. In some embodiments, controller 350 may generate the electrical signal 323 based on user input received using a user interface. The user input may comprise information associated with a desired set of characteristics of excitation pulse 321. As an example, the user may desire a pulsed optical beam with a pulse duration of 400 fs, a pulse energy of 1 microJoule (μJ), a pulse repetition rate of 50 MHz, and an average power of 1.25 W. In such a case, controller 350 may generate an output signal to be applied to optical source 320 such that the characteristics of excitation pulse 321 generated by optical source 320 are in accordance with the desired values.

Controller 350 may be further configured to apply an electrical signal, referred to as a detection pulse 324, to one or more of signal electron detectors 306A, 306B, or 313. In some embodiments, synchronous digital circuit of controller 350 may be configured to generate and apply detection pulse 324 to one or more of signal electron detectors 306A, 306B, or 313. Detection pulse 324 may comprise a symmetrical or an asymmetrical square wave, a triangular wave, a rectangular wave, or any combination thereof.

In some embodiments, controller 350 may be further configured to apply a control signal 325 (also referred to as a control signal) to charged-particle source assembly 340 comprising cathode 301, extractor electrode 302, and anode 303, among other things. Control signal 325 may be applied directly through a wired connection or remotely using a wireless communication protocol. Control signal 325 may be adjusted to generate a continuous beam or a pulsed beam of primary charged-particles comprising a plurality of charged-particle pulses. In the context of this disclosure and in SEMs, the primary charged-particles may comprise electrons, and therefore, the primary charged-particles beam may comprise an electron beam. In some embodiments, characteristics of control signal 325 may be adjusted to vary the characteristics such as timing, frequency, energy, acceleration, among other things, of the charged-particle beam generated from charged-particle source assembly 340. In some embodiments, controller 350 may be configured to synchronize primary electron beam 300B1 and optical beam 322 by adjusting electrical signal 323 and control signal 325 simultaneously. In some embodiments, synchronization of primary electron beam 300B1 and optical beam 322 may include adjusting the phase, frequency, pulse width, repetition rate, among other things, of excitation pulses 321 or pulsed electron beam.

Figure 4A:
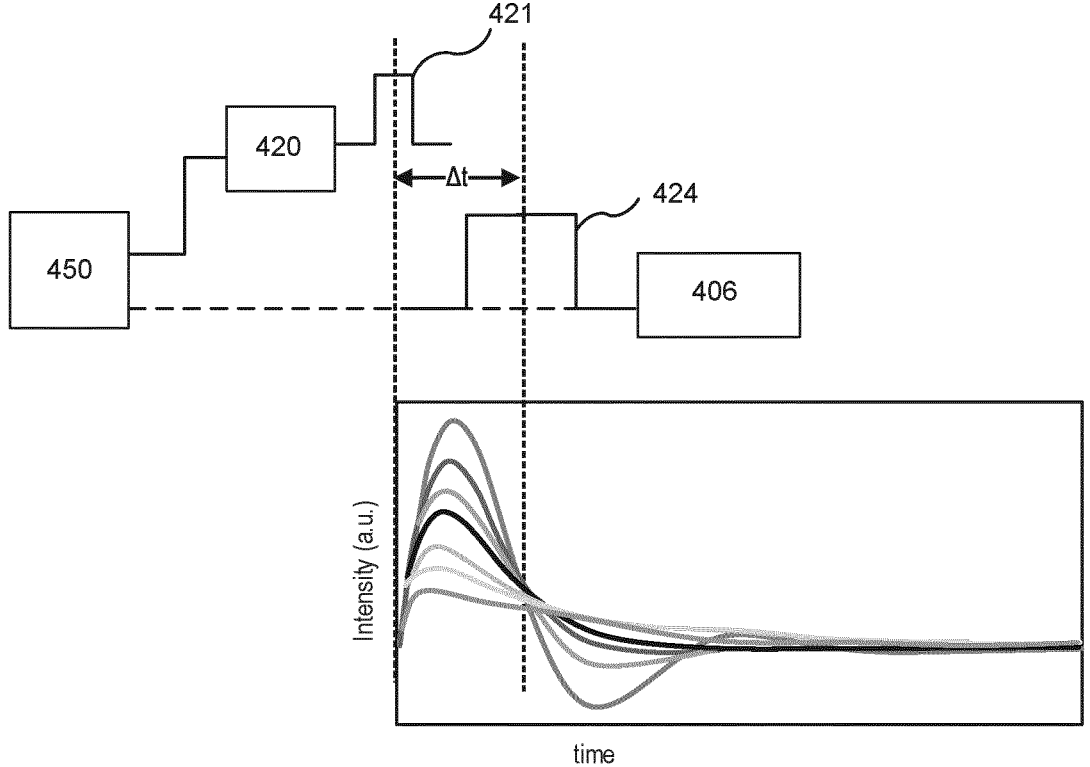
FIG. 4A is a schematic diagram of an exemplary configuration of a photon source and a controller in the charged-particle beam apparatus of FIG. 3, consistent with embodiments of the present disclosure.

Reference is now made to FIG. 4A, which illustrates a schematic diagram of an exemplary configuration of controller 450, an optical source 420, and a signal electron detection system 406 in a charged-particle beam apparatus, consistent with embodiments of the present disclosure. Controller 450 and optical source 420 may be substantially similar to and may perform substantially similar functions as controller 350 and optical source 320, respectively. Signal electron detection system 406 may comprise one or more signal electron detectors such as signal electron detectors 306A, 306B, or 313 of FIG. 3. It is to be appreciated that signal electron detection system 406, in communication with controller 450, may comprise one or more signal electron detectors. In a case where multiple signal electron detectors are employed, the signal electron detectors may be connected in parallel such that each signal electron detector simultaneously receives a signal applied by controller 450.

Optical source 420 may be configured to generate an excitation pulse 421, analogous to excitation pulse 321 of FIG. 3. A plurality of excitation pulses 421 may form a pulsed optical beam such as pulsed optical beam 322 of FIG. 3. The excitation pulses 421 may be pulsed at a frequency, and each excitation pulse may have a pulse duration. In the context of this disclosure, pulse width of the excitation pulse waveform is referred to as pulse duration. Pulsed optical beam may comprise excitation pulses 421 having a pulse duration in a range of 100 fs to 1 ps. In some preferred embodiments, the pulse duration of excitation pulse 421 is <500 fs. In VLSI (Very Large Scale Integration) circuits, the time constants of electronic circuits and components is in the order of sub-picoseconds to microseconds. Using a pulsed laser source with an ultra-short pulse duration such as <500 fs may be desirable to detect the transient defects in VLSI circuits and components. The pulse frequency, also referred to as the pulse repetition rate, is the number of pulses emitted per second. In some embodiments, the pulse repetition rate may be in a range of 1 MHz to 1 GHz and the pulse duration may be in a range of 0.05 ps to 1 nanosecond (ns).

Figure 4B:
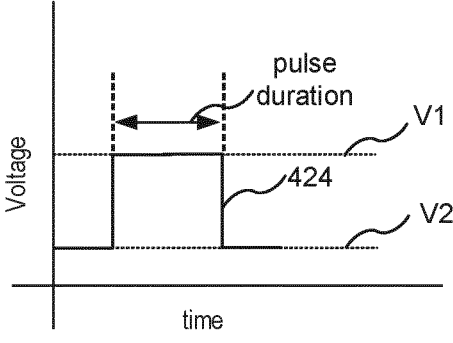
FIG. 4B illustrates an exemplary pulse waveform of a detection signal applied to a signal electron detector of FIG. 3, consistent with embodiments of the present disclosure.

Controller 450, analogous to controller 350 of FIG. 3, may be configured to apply an electrical signal, referred to herein as detection pulse 424, to signal electron detector 406. As illustrated in FIG. 4B, detection pulse 424 may have a rectangular or a square waveform, representing a two-level voltage output signal. Voltage level V1 may represent the high voltage or the ON-voltage, and voltage level V2 may represent the low voltage or the OFF-voltage of the waveform. The duration for which the voltage level V1 is maintained is referred to as pulse duration, or pulse width. In the context of this disclosure, the pulse duration of detection pulse 424 may be the "detection window" referred to as the time during which signal electron detection system 406 may be activated to acquire and detect signal electrons generated from the sample. Electron detection system 406 may comprise an electronic circuit such as a read-out circuit, configured to read charges collected by one or more of signal electron detectors within the detection window time frame. In some embodiments, a ring oscillator (not illustrated) may be configured to generate a plurality of detection pulses 424.

Referring back to FIG. 4A, controller 450 may be configured to apply detection pulse 424 to signal electron detection system 406. In some embodiments, while frequency of detection pulse 424 may be similar to or substantially similar to frequency of excitation pulse 421, controller 450 may adjust detection pulse 424 such that excitation pulse 421 and detection pulse 424 are out-of-phase with each other. In the context of this disclosure, two signals may be "out-of-phase" if there is a phase difference between the two signal waveforms. As used herein, phase specifies the location of a point within a wave cycle of a repetitive waveform. The phase difference between two waveforms or wave signals of the same frequency moving past a fixed location is the time difference between the same positions within the wave cycles of the two waves, expressed as a fraction of one wave cycle. For example, if one of the two waves of the same frequency is shifted by one-half cycle relative to the other, the waves are said to be "out-of-phase." In general terms, phase difference between two waves is the difference in their starting points.

Adjusting the phase of detection pulse 424 with respect to excitation pulse 421 may allow setting a time delay between the excitation or charging of the sample (e.g., sample 315 of FIG. 3) and detection window. As illustrated in FIG. 4A, $\Delta t$ indicates a time delay between excitation pulse 421 and detection pulse 424. Controller 450 may be configured to adjust the time delay to synchronize the sample charging and signal detection. The timing of charging the sample to generate free charged particles (e.g., photoelectrons) and detection of signal electrons may be adjusted to detect transient defects having time constants in the range of sub-picoseconds or several femtoseconds. FIG. 4A also illustrates a graph showing temporal response of an oscillator circuit being probed in a manner consistent with embodiments of the present disclosure. Controller 450 may be configured to adjust the time delay $\Delta t$ between the sample charging and electron detection, based on factors including, but not limited to, amplitude, slope, or decay rate of the response signal, among other things. The time delay $\Delta t$ may be adjusted to adjust the sensitivity to detect a defect.

Figure 5:
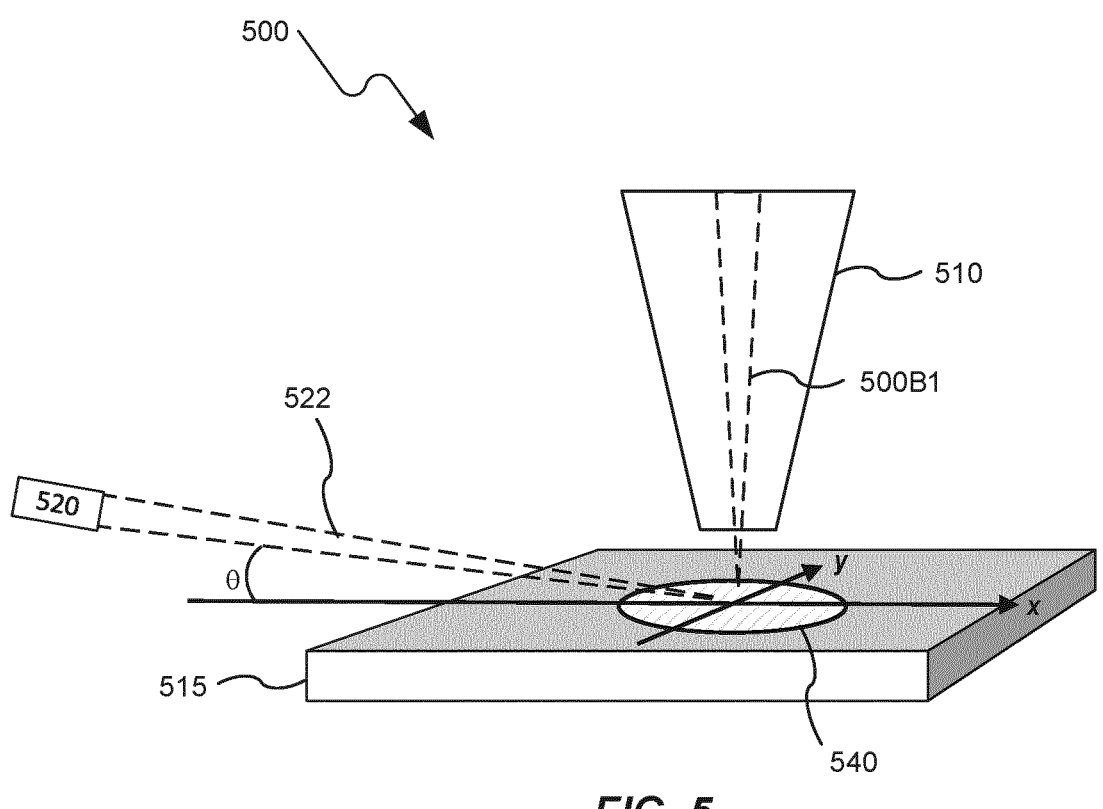
FIG. 5 is a schematic diagram of an exemplary configuration of a photon source in the charged-particle beam apparatus of FIG. 3, consistent with embodiments of the present disclosure.

Reference is now made to FIG. 5, which illustrates a side view of a charged-particle beam apparatus 500, consistent with embodiments of the present disclosure. As shown, apparatus 500 includes an electron beam tool 510, substantially similar to and performing similar functions as electron beam tool 40 of FIG. 1, an optical source 520, a sample 515 to be inspected. Sample 515 may be disposed on a stage or a sample holder, neither of which are illustrated. Electron beam tool 510 may be configured to emit a primary electron beam 500B1 onto an area of interest on sample 515, and collect secondary electrons emanated from the sample surface to form an image of the area of interest on sample 515. Optical source 520 may comprise a pulsed laser source positioned at a small angle $\theta$, and configured to emit a light beam 522 (e.g., laser beam) onto a region on sample 515 and form a beam spot 540 of light beam 522 on the sample surface. When primary electron beam 500B1 irradiates the area of interest on sample 515, which may coincide partially or substantially with beam spot 540, charges may be accumulated due to a large electron beam current. Light beam 522 emitted from optical source 520 may be configured to regulate the accumulated charges due to photoconductivity or photoelectric effect, or a combination of photoconductivity and photoelectric effect, among others. In some embodiments, beam spot 540 may comprise a rectangular, circular, elliptical, triangular, or a polygonal portion of the sample surface illuminated with a portion of optical beam 522. In some embodiments, the size and cross-section of beam spot 540 may vary based on the angle of incidence of optical beam 522 with respect to the sample surface.

Optical source 520 may be positioned at an incidence angle θ with respect to the plane of incident surface of sample 515. Incident angle θ may be less than 30°, preferably less than 15°, in order to project light beam 522 onto a portion of sample 515 without landing on or being blocked by the column components of electron beam tool 510. In some embodiments, incident angle θ may be determined based on the distance between the sample and the objective lens such that light beam 522 may irradiate the sample without being blocked by the objective lens. In some embodiments, the incident angle θ is configurable and may be less than 10°, or less than 9°, or less than 8°, or less than 7°, or less than 5° depending on the configuration of the components in charged-particle beam apparatus 500. In some embodiments, incident angle θ may be the angle of positioning of optical source 520 and may be adjustable to adjust the size and cross-section of beam spot 540, for example.

Optical source 520 may be substantially similar to or may perform substantially similar functions as optical source 320 of FIG. 3. As an example, optical source 520 may comprise a laser source configured to emit photons in the UV domain, having a wavelength of 345 nm and a corresponding photon energy of ~3.59 eV. The number of photoelectrons generated by a pulse of optical beam 522 irradiating the sample may be approximated based on factors including, but not limited to, wavelength of the photon, pulse duration, pulse energy, photon absorption coefficient, angle of incidence, numerical aperture, laser power, sample thickness, sample type, among other factors. For example, a 345 nm wavelength photon pulse having a pulse duration of 400 fs, pulse energy of ~1 μJ, laser power of ~25 W, a two-photon absorption coefficient ~10-9 cm/W, irradiating a region on the sample may generate more than 10 million free electrons, assuming 25% of the region comprises a metal or highly conductive material. In practice, however, the average laser power may need to be adjusted to be less than 1 W to minimize electrical or physical damage to sample 515. In such a case, the number of free electrons generated by interaction of optical beam 522 and the sample may be comparable to the number of electrons generated by a 100 nA flooding electron beam for a duration of 10 ns. In some embodiments, the average laser power may be adjusted in a range from 0.1 to 25 W based on the desired interaction levels, sample type, detection sensitivity, type of defect, among other things. It is appreciated that, in some cases, the laser power may be more than 25 W based on the application, desired information, sample material, among other things.

Electrical defects can be characterized as defects that cause a finite change in measurable electrical characteristics such as capacitance, or resistance, among other things. In some cases, a physical defect such as an unetched layer of a buried dielectric film on a contact metal, may manifest as an electrical defect because it may cause the resistance of the contact metal to increase. Because the layer is buried, detecting the defect using conventional electron beam scanning may be challenging. One of several ways to detect buried or on-surface electrical defects in such devices is by using a voltage contrast method in a SEM. In this method, electrical conductivity differences in materials, structures, or regions of a sample cause contrast differences in SEM images thereof. In the context of defect detection, an electrical defect under the sample surface may generate a charging variation on the sample surface, so the electrical defect can be detected by a contrast in the SEM image of the sample surface. To enhance the voltage contrast, pre-charging or flooding may be employed in which the region of interest of the sample may be exposed to a large beam current before performing an inspection using a small beam current.

Defect inspection by voltage contrast techniques in a SEM may include, among other things, pre-charging the sample using a flooding beam, detecting signal electrons from the sample, and forming images of the region of interest based on the number and type of signal electrons detected by an electron detector. In currently existing inspection systems, the time period between pre-charging the sample and acquiring images based on the detected signal is in the order of milliseconds to several microseconds. In some cases, reducing the time period between pre-charging and detection using line scan averages and spot-to-spot comparisons may be beneficial to detect transient defects with fast decay rates. Although shorter time periods between pre-charging and detection may result in the ability to detect defects associated with small changes in circuit resistance or capacitance, doing so may negatively affect the detection signal-to-noise ratio.

An IC chip such as an ASIC (Application Specific Integrated Circuit) chip may comprise circuitry components including transistors, capacitors, diodes, SRAM and/or DRAM memory cells, oscillators, among other things. The time constant of an R-C(Resistor-Capacitor) circuit is referred to as the time required to charge a capacitor, through a resistor, from an initial charge voltage of 0 to 63.2% of the applied voltage, or the time required to discharge the capacitor to approximately 36.8% of its initial charge voltage. In an ASIC chip, based on the application, the time constant of an RC circuit may be several femtoseconds. Even if there is a high-resistance defect in the RC circuit causing the capacitor to discharge slower and increasing the time constant to several picoseconds, the existing techniques may be unable to detect the defect. In addition, if a defect causes only a transient change in the surface charging effect, the change in secondary electron signal may be undetectable because of the low signal-to-noise ratio. Therefore, for voltage contrast defect detection, it may be desirable to enhance the voltage contrast signal in the time frame relevant to the detection of transient defects present in a device to improve defect sensitivity while maintaining the inspection throughput.

Figure 6:
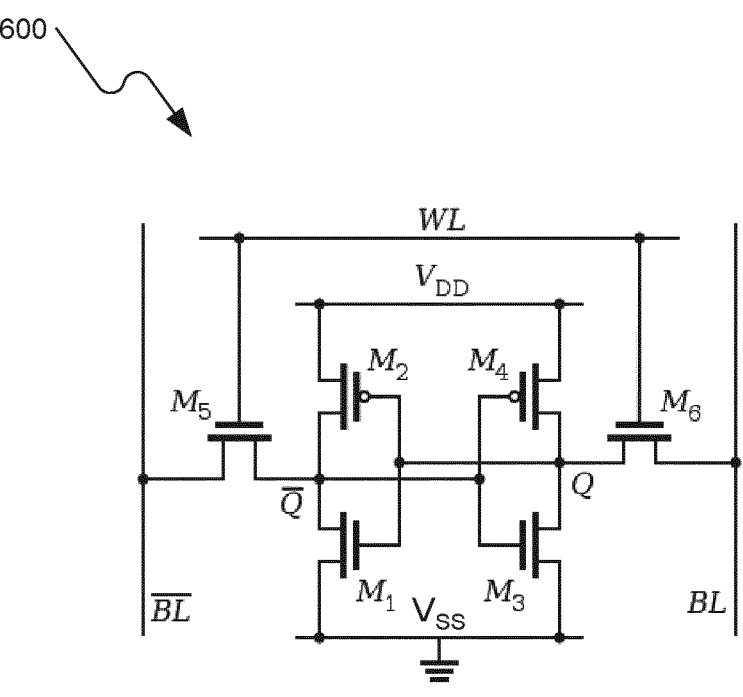
FIG. 6 is a schematic diagram of an exemplary 6T SRAM cell of an integrated chip.

Reference is now made to FIG. 6, which illustrates a schematic diagram of an exemplary 6T SRAM (Static Random Access Memory) cell 600. As illustrated in FIG. 6, SRAM cell 600 may comprise six field-effect transistors (6T). In a typical SRAM cell, each bit is stored on four transistors (M1-M4) that form two cross-coupled inverters and two additional access transistors M5 and M6 serve to control the access to a storage cell during read and write operations. The bit line acts as input while performing the write operation. The value to be written into the memory cell is provided with the help of bit lines. However, the bit lines act as output during the read operation. The information is stored in the SRAM memory cell until power is supplied. To initiate the read operation, the word lines are activated and bit lines are pre-charged. In read mode, the stored value of either 0 or 1 in the SRAM cell is extracted. The word line is activated, which starts the access transistors M5 and M6. The voltage drop in the BL is sensed by a sense amplifier. In the write mode, the new value is stored in the SRAM cell by applying a 0 or 1 at Q. In the standby mode, the word lines WL are disabled, which in turn deactivates the access transistors M5 and M6, thereby retaining the value stored in the SRAM cell. As illustrated, VSS source contact may be connected to the ground voltage, or a reference voltage, and VDD drain contact may be configured to apply a positive voltage to transistors M2 and M4. It is appreciated that SRAM devices may comprise four, six, eight, or ten, or any number of transistors, based on the application or end-use, for example.

Figure 7:
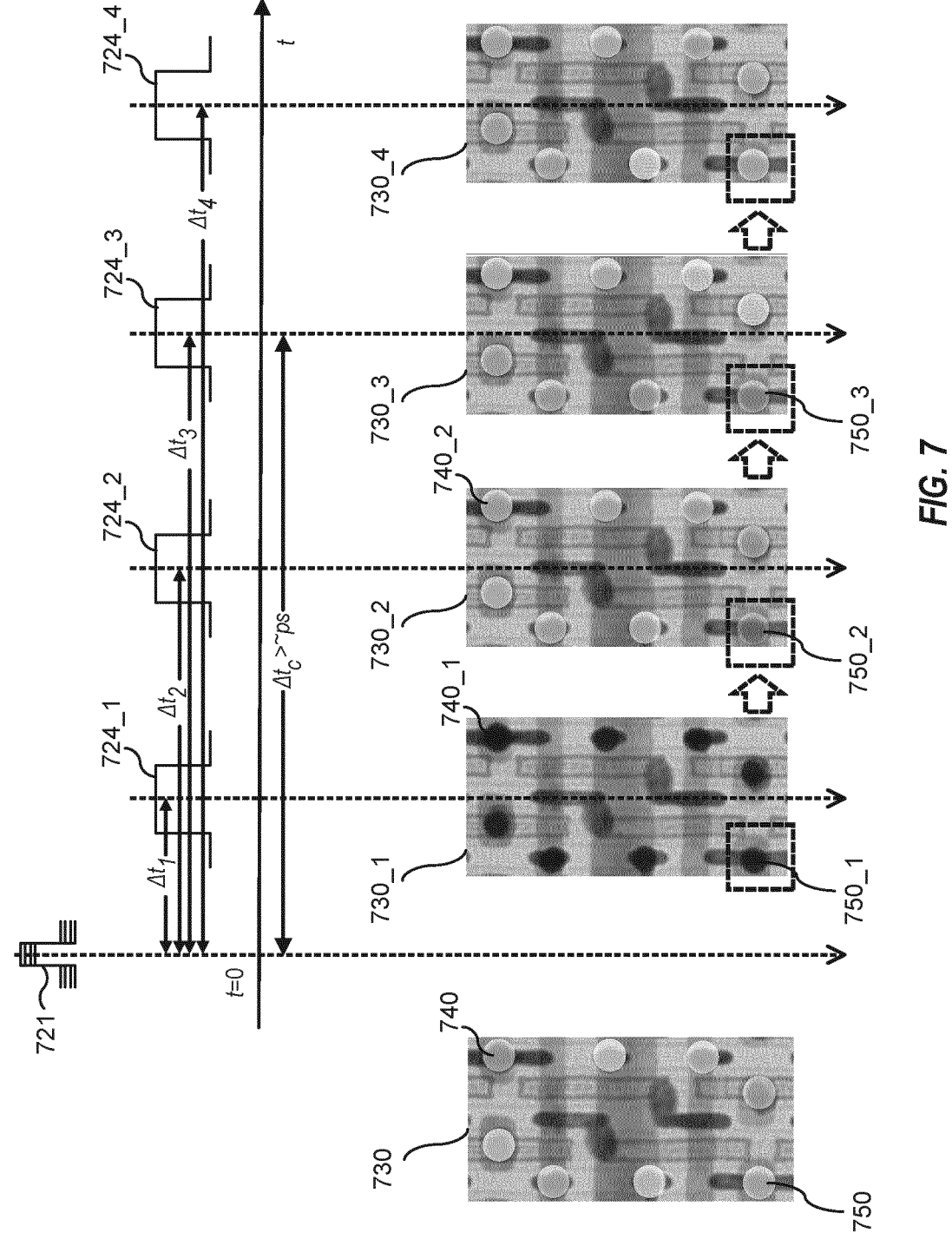
FIG. 7 is a schematic illustration of an exemplary methodology to detect defects using enhanced voltage contrast signal, consistent with embodiments of the present disclosure.

Reference is now made to FIG. 7, which illustrates a defect detection methodology using enhanced voltage contrast signal in a charged-particle beam apparatus, consistent with embodiments of the present disclosure. As illustrated, excitation pulses 721, analogous to excitation pulse 321 of FIG. 3, may be incident on a sample such that the interaction of excitation pulses 321 and the sample surface irradiated with the photons of excitation pulses 721 may generate charged-particles such as photoelectrons. The number of charged-particles generated may depend on factors including, but not limited to, incident photon energy, incident photon absorption coefficient, incident photon wavelength, volume of interaction, sample type, sample composition, among other things. Detection pulses 724, analogous to detection pulse 324, may comprise an electrical signal applied to signal electron detection system configured to detect secondary electrons generated from the sample and after interaction with photoelectrons. Although four detection pulses 724_1, 724_2, 724_3, and 724_4 are illustrated, it is appreciated that in practice, however, there may be any number of detection pulses.

As described earlier with reference to FIG. 4, $\Delta t$ may be the time delay between excitation pulse 721 and detection pulse 724. A controller such as controller 450 of FIG. 4 may be configured to adjust the time delay $\Delta t$ to adjust the sensitivity of defect detection. As shown, $\Delta t1$ may be the time delay between excitation pulse 721 and detection pulse 724_1, $\Delta t2$ may be the time delay between excitation pulse 721 and detection pulse 724_2, $\Delta t3$ may be the time delay between excitation pulse 721 and detection pulse 724_3, and $\Delta t4$ may be the time delay between excitation pulse 721 and detection pulse 724_4. Although only four detection pulses are shown, it is to be appreciated that there may be any number of pulses.

As shown in FIG. 7, image 730 is a high-resolution image a portion of a SRAM cell (e.g., SRAM cell 600 of FIG. 6) comprising contacts 740 to cell components including transistors, among other things. In some embodiments, electrical contacts 740 may comprise electrically conducting contact pads or terminals made from materials including, but not limited to, metals, alloys, semiconductors, or any suitable electrically conducting material. Image 730 represents a SEM image of a portion of SRAM cell prior to the interaction with optical beam 522, where the bright circular pads indicate metallic contacts. Electrical contact 750 may comprise a contact connected to the ground or reference voltage, also referred to herein as VSS contact.

As an example, image 730_1 is the image formed by an image acquisition system of a controller (e.g., controller 50 of FIG. 2) based on the signal electrons detected by a signal electron detection system (e.g., signal electron detection system 406 of FIG. 4) within a detection window at time delay $\Delta t1$ Images 730_2, 730_3, and 730_4 may represent images formed by the image acquisition system based on the signal electrons detected by the signal electron detection system at time delays $\Delta t2$, $\Delta t3$, and $\Delta t4$, respectively. In some embodiments, images 730_1-730_4 may be high-resolution optical images, high-resolution backscattered electron images, high-resolution SEM images, or any suitable image for defect detection. It is to be appreciated that although contacts 740 and 750 in image 730_1 are shown to have substantially similar contrast (dark circles), in practice, however, different voltages may be applied to different electrical contacts 740, causing a larger variation in contrast.

Image 730_1 illustrates a high-resolution SEM image of a portion of a SRAM cell immediately upon interaction with excitation pulses 721. In comparison with image 730, in image 730_1, electrical contacts 740_1 and VSS contact 750_1 appear to have a darker contrast. This is because excitation with a pulsed optical beam such as a pulsed laser causes ejection of electrons from metal atoms on the surface of the sample. The ejection of electrons from the sample creates a positive surface potential with respect to the bulk of the sample. The positive surface potential reduces the number of primary electrons from primary electron beam (e.g., primary electron beam 300B1 of FIG. 3) incident on the sample, generating fewer signal electrons to be detected, and thereby appearing darker in comparison with electrical contacts 740. In some embodiments, electrons may be ejected from the metal atoms of a sample (e.g., sample 315 of FIG. 3) based on the work function of the metal, incident photon wavelength, incident photon energy, or power of optical beam 322, among other things.

As described earlier, VSS contact 750 may be connected to the ground such that the surface potential, after charging the surface, may be restored within the discharge time constant (R-C time constant or R-L-C time constant). For a typical SRAM cell, the RC time constant for a VSS contact may be in the order of 200 fs to 500 fs. However, if there is a high-resistance defect, impeding the flow of charges from the source (ground) to the contact, it may take longer than the time constant for the charges to dissipate, causing a reduction in the number of secondary electrons detectable by the signal electron detection system. The high-resistance defect may have a transient-defect time constant $\Delta tc$ in the range of several picoseconds. Some embodiments of the present disclosure provide systems and methods to detect the high-resistance defects by enhancing the voltage contrast signal in relevant time scales, using ultra-short pulsed laser excitation.

Image 730_2 corresponds to the image formed by the image acquisition system at time delay $\Delta t2$. In comparison with image 730_1, the surface potential of a defective VSS contact 750_2 (analogous to VSS contact 750_1), for example, is not fully restored within the characteristic time constant. Due to the increased resistance, the flow of charges from the ground to the VSS contact is impeded. The delayed restoration of surface potential can be observed in image 730_2 showing VSS contact 750_2 having a darker contrast compared to the defect-free electrical contacts such as 740_2. Image 730_3 corresponds to the image formed by the image acquisition system at time delay $\Delta t3$. In comparison with images 730_1 and 730_2, the surface potential of electrical contact 750_3 (analogous to VSS contact 750_1) is fully restored or substantially restored and the contrast is substantially similar to the contrast of the defect-free electrical contacts. In this case, the transient-defect time constant $\Delta tc$ may be determined based on a comparison of the images 730_1-730_4, or based on the time delay $\Delta t3$ between excitation pulse 721 and detection pulse 724_3.

Figure 8:
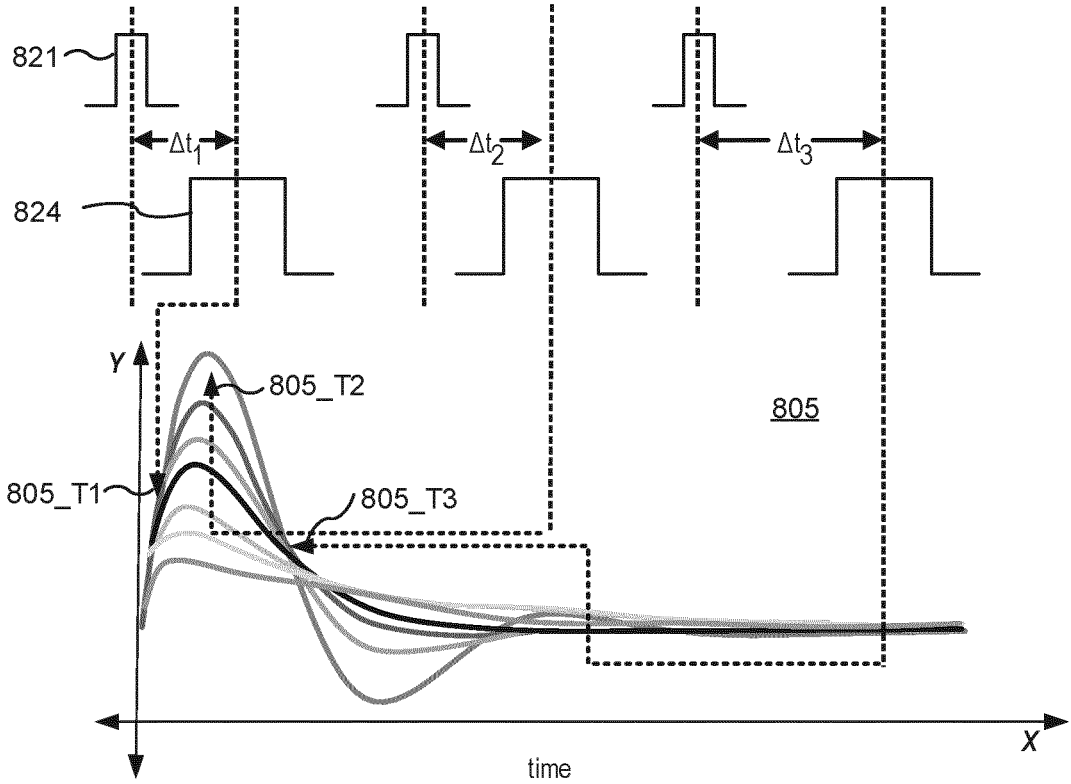
FIG. 8 is a schematic illustration of an exemplary methodology to detect defects using enhanced voltage contrast signal, consistent with embodiments of the present disclosure.

Reference is now made to FIG. 8, which illustrates a methodology to characterize a characteristic of a circuit component using enhanced voltage contrast signal in a charged-particle beam apparatus, consistent with embodiments of the present disclosure. In some embodiments, characteristics of a circuit component may include, but are not limited to, frequency response, charge leakage, charging and discharging time, RC time constant, among other things.

In some embodiments, an ultra-short pulsed laser beam comprising excitation pulses 821 may be directed to a specific location on the IC chip to characterize a circuit or a circuit component. The specific location may comprise a circuit such as a ring oscillator, or a circuit component such as a transistor, diode, capacitor, inductor, among other things. In some embodiments, an electrical measurement of the detected signal from a specific location such as a circuit or a circuit component, may be repeated while adjusting the time delay Δt between the excitation pulse 821 and detection pulse 824. Adjustment of the time delay Δt may include increasing or reducing the time delay between excitation pulse 821 and subsequent detection pulses 824 while the signal electrons are being detected repeatedly from the same or substantially the same location. In some embodiments, the pulse frequency or the pulse repetition rate of excitation pulse 821 may be different from the pulse frequency of detection pulse 824. In some embodiments, the pulse frequency of excitation pulse 821 may be larger than the pulse frequency of detection pulse 824.

As shown in FIG. 8, the methodology may be used to characterize a full temporal response of a circuit such as the frequency response of a ring oscillator. As illustrated, data plot 805 represents an exemplary temporal response of a ring oscillator, showing a measured quantity in Y-axis as a function of time, shown in X-axis. Region 805_T1 on data plot 805 represents the signal detected at time 805_T1, and may correspond to signal measured after a time delay Δt1 between a first excitation pulse 821 and a first detection pulse 824, and within the detection window of first detection pulse 824. To obtain the temporal response, subsequent measurements may be taken after time delay Δt2 and Δt3 at the same location on the sample. The signals detected at time 805_T2 and 805_T3 may correspond to signal measured after a time delay Δt2 and Δt3. Although only three repetitions with increasing time delays are illustrated in FIG. 8, it is to be appreciated that any number of repetitions may be used to characterize the full temporal response of a circuit, or a circuit component. In some embodiments, time delays Δt1, Δt2, and Δt3 may be different such that Δt3>Δt2>Δt1 or Δt3<Δt2<Δt1, or other combinations. In some embodiments, absolute values of two or more time delays may be different.

In some embodiments, a method of characterizing a response of a circuit or a circuit component may include operating a pulsed optical beam (e.g., optical beam 522 of FIG. 5) at a pulse repetition rate that is offset compared to the detection pulse rate. Doing so, may create a variable delay between the excitation and detection window, from pulse-to-pulse. In some embodiments, such a method may be used to probe a large array of devices on the sample (e.g., sample 515 of FIG. 5) with an offset between the excitation pulse repetition rate and detection pulse repetition rate. The temporal response of a circuit may be mapped into a spatial scanning of the array of devices, allowing characterization of the speed of a circuit array(s).

In some embodiments, the noise associated with the ultra-short pulsed optical beam used for charging a sample may be reduced by filtering out noise from the signal using techniques including, but not limited to, homodyne, heterodyne, lock-in amplification techniques, or a combination thereof. Filtering the noise associated with excitation source such as the pulsed optical beam, may improve the signal-to-noise ratio, thereby increasing sensitivity and capture rate of defects detected using the voltage contrast detection technique.

Figure 9:
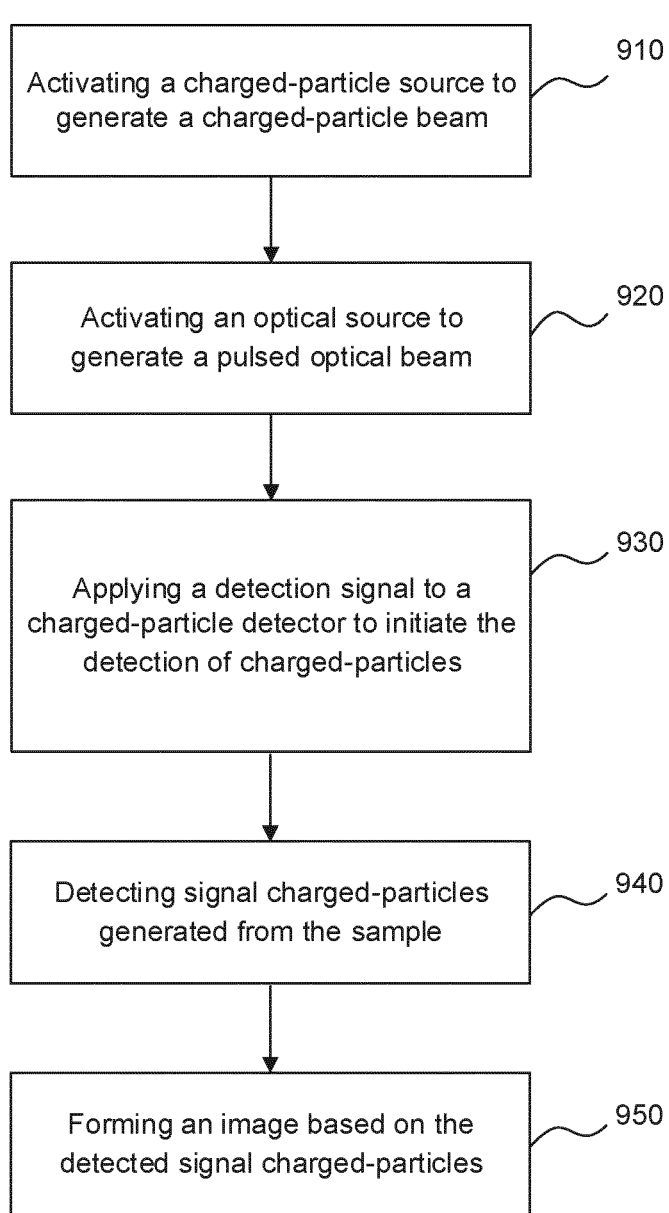
FIG. 9 is a process flowchart representing an exemplary method of observing a sample using charged-particle beam apparatus of FIG. 3, consistent with embodiments of the present disclosure.

Reference is now made to FIG. 9, which illustrates a process flowchart representing an exemplary method 900 of observing a sample using a charged-particle beam apparatus such as apparatus 500, consistent with embodiments of the present disclosure. Some functions of method 900 may be performed by a controller (e.g., controller 50 of EBI system 100, as shown in FIG. 1, or controller 350 of FIG. 3, or controller 450 of FIG. 4). The controller may be programmed to perform one or more steps of method 900. For example, the controller may apply an electrical signal to activate a charged-particle source, to activate an optical source, and carry out other functions.

In step 910, a charged-particle source assembly (e.g., charged-particle source assembly 340 of FIG. 3) may be activated to generate a charged particle beam (e.g., primary electron beam 204 of FIG. 2). In some embodiments, the charged-particles may comprise electrons and the charged-particle source assembly may comprise an electron source. The electron source may be activated by the controller. For example, the electron source may be controlled to emit primary electrons to form an electron beam along a primary optical axis (e.g., primary optical axis 201 of FIG. 2). The electron source may be activated remotely, for example, by using software, an application, or a set of instructions for a processor of a controller to power the electron source through a control circuitry. The primary electron beam may be directed through the electron beam tool to be incident on a surface of a sample (e.g., sample 315 of FIG. 3), forming a probe spot. Upon interaction with the sample, the primary electron beam may generate a plurality of signal electrons such as secondary electrons, backscattered electrons, or auger electrons, among other things.

In step 920, an optical source (e.g., optical source 320 of FIG. 3) may be activated to generate an optical beam (e.g., optical beam 322 of FIG. 3). The optical source may be configured to generate the optical beam comprising a plurality of excitation pulses (e.g., excitation pulse 321 of FIG. 3). In some embodiments, the optical beam may be a pulsed optical beam comprising a plurality of excitation pulses. The excitation pulses may be represented by a pulse waveform having a pulse width, a pulse frequency, a pulse energy, and a pulse repetition rate. The optical source may comprise a solid-state laser, a semiconductor laser, a gas laser, a dye laser, a chemical laser, a diode-pumped fiber laser, a gain-switched laser, or gain-switched laser diodes coupled with fiber amplifiers. In some embodiments, optical source may comprise a femtosecond laser source configured to generate ultrashort optical pulses having a pulse width of less than 1 picosecond (<10-12 seconds). A femtosecond (fs) laser may generate sub-picosecond optical pulses with a pulse width or pulse duration in the range of 1 to 1000 fs (1 fs=10-15 seconds). In some embodiments, the generated excitation pulse may have a pulse duration of <500 fs, preferably <400 fs.

Upon interaction with the sample, the excitation pulses may impart energy to or "excite" a portion of the sample (e.g., beam spot 540 of FIG. 5). The beam spot may be a rectangular, circular, elliptical, triangular, or a polygonal portion of the sample surface illuminated with the optical beam. In some embodiments, the size and cross-section of the beam spot may be based on the angle of incidence of the optical beam with respect to the sample surface. In some embodiments, the beam spot may be larger in size compared to the probe spot formed by the primary electron beam. For example, the beam spot may be a rectangular area of 100 μm×200 μm, while the probe spot may be less than 1 μm. In some embodiments, a portion of the beam spot may substantially overlap with the probe spot.

Excitation of the sample refers to photoionization—a physical interaction of electromagnetic radiation with matter resulting in the dissociation of that matter into electrically charged particles, such as electrons. The electrons generated by the interaction of the optical beam and atoms of the target surface are referred to as photoelectrons. The probability of ionization may depend on factors including, but are not limited to, the beam wavelength, beam energy, number of photons present at a specific time interval and location within a volume of the sample, among other things. The photoelectrons generated by the interaction of the optical beam with the sample may increase the total number of charged-particles on the surface of the sample, thereby "pre-charging" or "flooding" the sample to enhance voltage contrast for defect detection.

In step 930, the controller may be configured to apply a detection signal to a charged-particle detector (e.g., signal electron detection system 406 of FIG. 4). The detection signal may comprise a plurality of detection pulses (e.g., detection pulse 424 of FIG. 4). The detection pulses may have a rectangular or a square waveform, representing a two-level voltage output signal, for example. Voltage level V1 may represent the high voltage or the ON-voltage, and voltage level V2 may represent the low voltage or the OFF-voltage of the waveform. The duration for which the voltage level V1 is maintained is referred to as pulse duration, or pulse width of the detection pulse. The pulse duration of detection pulse may be the "detection window" referred to as the time during which signal electron detection system may be activated to acquire and detect signal electrons generated from the sample.

In some embodiments, while the frequency of detection pulse may be similar or substantially similar to frequency of excitation pulse, the controller may adjust detection pulse such that excitation pulse and detection pulse are out-of-phase with each other. Adjusting the phase of detection pulse with respect to excitation pulse may allow setting a time delay between the excitation or charging of the sample and detection window. As described earlier, Δt indicates a time delay between excitation pulse and detection pulse. The controller may be configured to adjust the time delay to synchronize the sample charging and signal detection. The timing of charging the sample to generate free charged particles (e.g., photoelectrons) and detection of signal electrons may be adjusted to detect transient defects having time constants in the range of sub-picoseconds or several femto-seconds. The controller may be configured to adjust the time delay Δt between the sample charging and electron detection, based on factors including, but not limited to, amplitude, slope, or decay rate of the response signal, among other things. The time delay Δt may be adjusted to adjust the sensitivity to detect a defect.

In step 940, the charged-particle detector may be configured to detect the signal electrons comprising the secondary electrons generated from the sample and modified by the interaction with the photoelectrons. The charged-particle detector may comprise one or more signal electron detectors such as signal electron detectors 306A, 306B, or 313 of FIG. 3. In a case where multiple signal electron detectors are employed, the signal electron detectors may be connected in parallel such that each signal electron detector simultaneously receives a signal applied by the controller.

In step 950, an image may be formed based on the signal detected by the charged-particle detector. The controller may comprise an image processing system that includes an image acquirer and a storage. The image acquirer may comprise one or more processors. For example, the image acquirer may comprise a computer, server, mainframe host, terminals, personal computer, any kind of mobile computing devices, and the like, or a combination thereof. The image acquirer may be communicatively coupled to the signal electron detector through a medium such as an electrical conductor, optical fiber cable, portable storage media, IR, Bluetooth, internet, wireless network, wireless radio, among others, or a combination thereof. The image acquirer may receive a signal from the signal electron detector and may construct an image. The image acquirer may thus acquire images of regions of the sample. The image acquirer may also perform various post-processing functions, such as generating contours, superimposing indicators on an acquired image, and the like. The image acquirer may be configured to perform adjustments of brightness and contrast, among other things, of acquired images. In some embodiments, the storage may be a storage medium such as a hard disk, flash drive, cloud storage, random access memory (RAM), other types of computer readable memory, and the like. The storage may be coupled with the image acquirer and may be used for saving scanned raw image data as original images, and post-processed images.

Reference is now made to FIG. 10, which illustrates a process flowchart representing an exemplary method 1000 of observing a sample using a charged-particle beam apparatus such as apparatus 500, consistent with embodiments of the present disclosure. Some functions of method 1000 may be performed by a controller (e.g., controller 50 of EBI system 100, as shown in FIG. 1, or controller 350 of FIG. 3, or controller 450 of FIG. 4). The controller may be programmed to perform one or more steps of method 1000. For example, the controller may apply an electrical signal to activate a charged-particle source, to activate an optical source, and carry out other functions.

In step 1010, a charged-particle source may be activated to generate a charged particle beam (e.g., primary electron beam 204 of FIG. 2). In some embodiments, the charged-particles may comprise electrons and the charged-particle source may comprise an electron source. The electron source may be activated by the controller. For example, the electron source may be controlled to emit primary electrons to form an electron beam along a primary optical axis (e.g., primary optical axis 201 of FIG. 2). The electron source may be activated remotely, for example, by using software, an application, or a set of instructions for a processor of a controller to power the electron source through a control circuitry. The primary electron beam may be directed through the electron beam tool to be incident on a surface of a sample (e.g., sample 315 of FIG. 3), forming a probe spot. Upon interaction with the sample, the primary electron beam may generate a plurality of signal electrons such as secondary electrons, backscattered electrons, or auger electrons, among other things.

In step 1020, an optical source (e.g., optical source 320 of FIG. 3) may be activated to generate an optical beam (e.g., optical beam 322 of FIG. 3). The optical source may be configured to generate the optical beam comprising a plurality of excitation pulses (e.g., excitation pulse 321 of FIG. 3). In some embodiments, the optical beam may be a pulsed optical beam comprising a plurality of excitation pulses. The excitation pulses may be represented by a pulse waveform having a pulse width, a pulse frequency, a pulse energy, and a pulse repetition rate. The optical source may comprise a solid-state laser, a semiconductor laser, a gas laser, a dye laser, a chemical laser, a diode-pumped fiber laser, a gain-switched laser, or gain-switched laser diodes coupled with fiber amplifiers. In some embodiments, optical source may comprise a femtosecond laser source configured to generate ultrashort optical pulses having a pulse width of less than 1 picosecond (<10-12 seconds). A femtosecond (fs) laser may generate sub-picosecond optical pulses with a pulse width or pulse duration in the range of 1 to 1000 fs (1 fs=10-15 seconds). In some embodiments, the generated excitation pulse may have a pulse duration of <500 fs, preferably <400 fs.

In step 1030, the controller may be configured to apply a detection signal to a charged-particle detector (e.g., signal electron detection system 406 of FIG. 4). The detection signal may comprise a plurality of detection pulses (e.g., detection pulse 424 of FIG. 4). The detection pulses may have a rectangular or a square waveform, representing a two-level voltage output signal, for example. Voltage level V1 may represent the high voltage or the ON-voltage, and voltage level V2 may represent the low voltage or the OFF-voltage of the waveform. The duration for which the voltage level V1 is maintained is referred to as pulse duration, or pulse width of the detection pulse. The pulse duration of detection pulse may be the "detection window" referred to as the time during which signal electron detection system may be activated to acquire and detect signal electrons generated from the sample.

In step 1040, the controller may be configured to adjust a time delay between the excitation pulses and the subsequent detection pulses. An electrical measurement of the detected signal from a specific location such as a circuit or a circuit component, may be repeated while adjusting the time delay Δt between the excitation pulse and detection pulse. Adjustment of the time delay Δt may include increasing the time delay between excitation pulse and subsequent detection pulses while the signal electrons are being detected repeatedly from the same or substantially the same location. In some embodiments, the pulse frequency or the pulse repetition rate of excitation pulse may be different from the pulse frequency of detection pulse. In some embodiments, the pulse frequency of excitation pulse may be larger than the pulse frequency of detection pulse. In some embodiments, this methodology may be used to characterize a full temporal response of a circuit, such as the frequency response of a ring oscillator.

In step 1050, an image may be formed based on the signal detected by the charged-particle detector. The controller may comprise an image processing system that includes an image acquirer and a storage. The image acquirer may comprise one or more processors. For example, the image acquirer may comprise a computer, server, mainframe host, terminals, personal computer, any kind of mobile computing devices, and the like, or a combination thereof. The image acquirer may be communicatively coupled to the signal electron detector through a medium such as an electrical conductor, optical fiber cable, portable storage media, IR, Bluetooth, internet, wireless network, wireless radio, among others, or a combination thereof. The image acquirer may receive a signal from the signal electron detector and may construct an image. The image acquirer may thus acquire images of regions of the sample. The image acquirer may also perform various post-processing functions, such as generating contours, superimposing indicators on an acquired image, and the like. The image acquirer may be configured to perform adjustments of brightness and contrast, among other things, of acquired images. In some embodiments, the storage may be a storage medium such as a hard disk, flash drive, cloud storage, random access memory (RAM), other types of computer readable memory, and the like. The storage may be coupled with the image acquirer and may be used for saving scanned raw image data as original images, and post-processed images.

Figure 11:
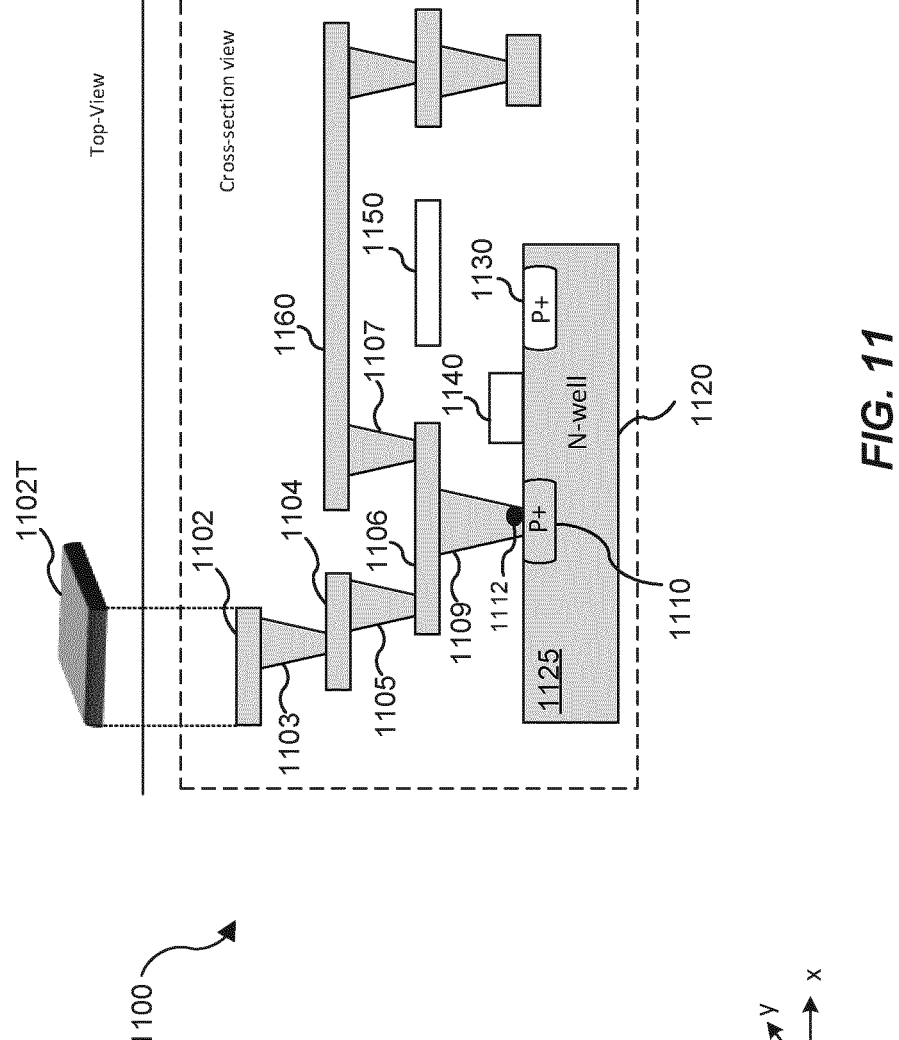
FIG. 11 is a schematic illustration of an exemplary electrical node, consistent with embodiments of the present disclosure.

Reference is now made to FIG. 11, which illustrates an exemplary node 1100, consistent with embodiments of the present disclosure. As disclosed herein, a node (e.g., node 1100) is an electrical node comprising a set of structures such as, but not limited to, metal lines, contact pads, vias, gate, source, drain, interconnects, or substrate, that are electrically connected together. As an example, node 1100 may include metal lines 1102, 1104, and 1106, vias 1103, 1105, and 1107, contact pad 1109 connecting metal line 1106 to source 1110 of a transistor 1125, semiconductor substrate 1120, or an interconnect 1160. A via (e.g., vias 1103, 1105, or 1107) may be used to connect structures located at different depths (Z-axis) within the same node or structures located at different locations (X-Y axes) within the same node. For example, via 1105 may connect metal lines 1104 and 1106, and via 1107 may connect metal line 1106 to interconnect 1160. It is appreciated that structures such as drain 1130, gate 1140, and component 1150 are not electrically connected in the positive mode of operation, and therefore, are not a part of node 1100. Component 1150 may be a structure associated with a neighboring or an adjacent node, electrically isolated from node 1100.

In some embodiments, node 1100 may include electrically connected structures based on a mode of operation or charge flow configuration. For example, as illustrated in FIG. 11, in a positive mode or extraction mode of electron beam inspection, the source (e.g., source 1110) to substrate (e.g., semiconductor substrate 1120) junction (P+/N-well junction) is forward biased, allowing conduction of electrons between source 1110 and substrate 1120. In such a configuration, structures including, but not limited to, metal lines 1102, 1104, and 1106, vias 1103, 1105, and 1107, contact pad 1109, source 1110, N-well 1120, and interconnect 1160, among other structures, may form the electrical node.

In some embodiments, one or more structures may be associated with a node (e.g., node 1100). A structure may constitute a node in its entirety, such that the structure is the node. As an example, structure 1102T corresponding to metal line 1102, as seen in the top view, may be referred to as the node. In such a case, structure 1102T may represent the node, and the structures associated with the node may include the underlying and electrically connected structures, as seen in the cross-section view of FIG. 11. It is appreciated that other structures such as, but not limited to, source (e.g., source 1110), metal lines (e.g., metal lines 1102, 1104, or 1106), vias (e.g., vias 1103, 1105, or 1107) may form the entire node as well.

In some embodiments, a structure associated with node 1100 may comprise a component of node 1100. As an example, via 1103, which may modulate the transient behavior of node 1100, may be the associated structure. In the context of this disclosure, and in the context of electrical devices, a transient behavior refers to the electrical behavior of a system which is not constant in time nor happening periodically in a controlled and desired manner. A transient response may include the response of a system to a change from an equilibrium or a steady state, such as damped oscillation signals, capacitor voltage during charge and discharge, or the like.

In some embodiments, characteristics of a structure associated with node 1100 may include, but are not limited to, geometrical and physical dimensions, electrical characteristics such as resistance or capacitance, material, composition, atomic arrangement, defects, among other things. One or more of the characteristics of the structure may affect the transient behavior of node 1100. As an example, geometrical and physical characteristics of a via may include the taper angle, height, length, width, or a critical dimension of the via at the junction between the via and a metal line (e.g., width of via 1103 at the junction between via 1103 and metal line 1104). As another example, electrical characteristics of a structure may include, but are not limited to, contact resistance, dielectric capacitance, parasitic capacitance. Existence of an undesired defect such as an interfacial layer or a void, may affect the electrical characteristics, for example. As another example, the material, the composition, the stoichiometric configuration, or the crystallinity of the material in the structure may affect the transient behavior of a node. As another example, thickness of the dielectric layer, dielectric strength of the material of the dielectric layer, or the dielectric material between structures of a node or neighboring nodes may affect the transient behavior of a node.

In some embodiments, defect 1112 may be a void or a gap defect. In the context of this disclosure, a void is referred to as a volume of missing material within a structure, a layer, or a thin film. Presence of a void in a structure of a device can alter the physical, mechanical, or electrical properties, among other properties, and in some instances may cause device failure. Therefore, it may be desirable to detect defects frequently during device fabrication to minimize device failure and improve throughput. However, in some semiconductor devices with complex 3-dimensional (3D) architecture, it may be challenging to detect voids (e.g., defect 1112) in high aspect ratio structures such as contact pad 1109, using physical or optical detection techniques such as optical imaging, or electron-beam inspection.

In some embodiments, defect 1112 may be a physical defect such as a void, or a contamination particle, that can be detected, for example, by measuring a change in electrical characteristics of contact pad 1109 comprising defect 1112, or the electrical characteristics of node 1100 comprising contact pad 1109. One of several ways to measure electrical characteristics of high aspect ratio structures and detect defects in such structures is by using a voltage contrast (VC) method in a SEM. In this method, electrical conductivity differences in materials, structures, or regions of a sample, upon interaction with an electron beam, cause contrast differences in SEM images thereof. In the context of defect detection, an electrical defect under the sample surface may generate a charging variation on the sample surface, so the electrical defect can be detected by a contrast in the SEM image of the sample surface. To enhance the voltage contrast, pre-charging or flooding may be employed in which the region of interest of the sample may be exposed to a large beam current before performing an inspection using a small beam current. However, as the semiconductor technology node gets smaller, the device geometries are becoming increasingly complex and multi-dimensional, rendering detection of defects using existing voltage-contrast methods inadequate. As an example, some of the defect types including voids buried in a contact pad may cause a partial open or a partial short in a device. The contrast difference between a normal contact pad and a void-containing defective contact pad may be insufficient to identify the defect. In addition, currently existing voltage-contrast defect detection methods fail to provide critical dimension (CD) measurements and compositional or stoichiometric measurements of a sample.

Figure 12:
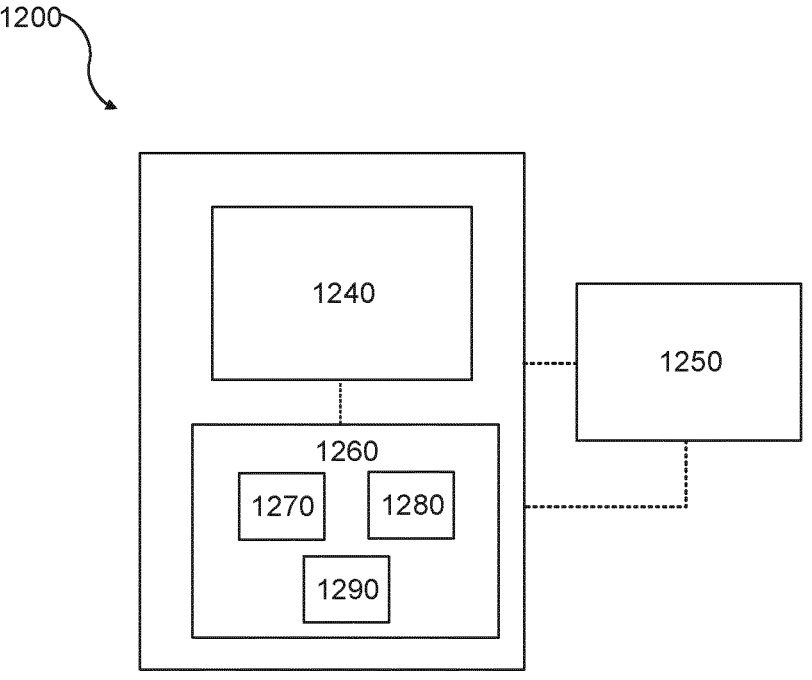
FIG. 12 is a schematic illustration of an exemplary electron beam inspection apparatus including an image processing system, an image acquisition system, and a controller, consistent with embodiments of the present disclosure.

Reference is now made to FIG. 12, which illustrates an exemplary electron beam inspection apparatus 1200, consistent with embodiments of the present disclosure. Electron beam inspection apparatus 1200, also referred to as apparatus 1200, may be substantially similar to EBI apparatus 100. Apparatus 1200 may include an electron beam tool 1240, a controller 1250, an image processing system 1260 comprising an image acquisition mechanism 1270, an image processor 1280, and a storage mechanism 1290.

Controller 1250 may be electronically connected to electron beam tool 1240 and may be electronically connected to other components as well. Controller 1250 may comprise a computer configured to execute various controls of electron beam inspection apparatus 1200. Controller 1250 may also include processing circuitry configured to execute various signal and image processing functions, or activate the electron source, or activate the electron detector to detect secondary electrons generated from the sample, among other functions. While controller 1250 is shown in FIG. 12 as being outside of the structure that includes electron beam tool 1240 and image processing system 1260, it is appreciated that controller 1250 can be part of the structure as well. Further, while image processing system 1260 is shown as a stand-alone unit externally connected with electron beam tool 1240 and controller 1250, it is appreciated that image processing system 1260 may be part of controller 1250.

In some embodiments, image processing system 1260 may include image acquisition mechanism 1270 configured to capture one or more images of the sample based on the signal electrons such as secondary electrons, backscattered electrons, auger electrons, or the like, detected by an electron detector. In some embodiments, image acquisition mechanism 1270 may receive a signal from an electron detector (e.g., electron detector 244 of FIG. 2) and may construct an image or a plurality of images. Image acquisition mechanism 1270 may acquire images of regions of interest on a sample (e.g., sample 250 of FIG. 2) based on the application and desired use. Image acquisition mechanism 1270 may be communicatively coupled to electron detector 244 of apparatus 40, for example, through a communication medium such as an electrical conductor, optical fiber cable, portable storage media, IR, Bluetooth, internet, wireless network, wireless radio, among others, or a combination thereof. In some embodiments, image acquisition mechanism 1270 may be configured to sequentially acquire a plurality of images and to adjust a time delay between consecutively acquired images.

Image processing system 1260 may further comprise image processor 1280. For example, image processor 1280 may be a computer, server, mainframe host, a terminal, a personal computer, or any kind of mobile computing device, or the like, configured to perform various post-processing functions, such as generating contours, superimposing indicators on an acquired image, extracting and determining gray levels of structures, comparing image features to trained image features, identifying features, or the like. In some embodiments, image processor 1280 may be configured to receive data associated with trained images or trained images from a machine learning network (not shown). The machine learning network may be trained to identify features of an image based on the gray level. For example, in an optical or a SEM image of a SRAM cell, different structures may have different gray levels based on their electrical properties. The machine learning network may be trained, for example, by deep learning, artificial intelligence, neural processing, among other techniques, to identify structures of a SRAM cell. It is appreciated that gray level, gray scale level, gray scale value, or grayscale, or grayscale intensity may be interchangeably used herein.

In some embodiments, identification of a structure from an acquired image may be based on a comparison between the acquired image and a reference image comprising the structure having a reference gray level. The reference image may comprise a SEM image, or a trained image formed using a machine learning network. In a SEM reference image, acquired under optimized acquisition conditions, the structure may have a reference gray level based on factors including, but not limited to, a process, a material, a tool, a facility, a dimension of the structure, among other things. For example, the gray level of a structure in a reference image of a 50:1 aspect ratio Tungsten (W) contact pad fabricated using a plasma deposition process may vary from the gray level of a reference image of a 50:1 aspect ratio Cobalt (Co) contact pad fabricated using the plasma deposition process in the same chamber.

In some embodiments, image processor 1280 may be configured to extract gray levels of a feature of an acquired image. In an 8-bit grayscale image, there may be 256 discrete gray scale levels and each pixel may be assigned a gray scale value between "0" and "255", where gray level 0 indicates a black pixel and gray level 255 indicates a white pixel. Image processor 1280 may perform extraction algorithms using a software or an executable application such as Matlab, Simulink, or the like, to determine the gray scale level of a pixel or a group of pixels representing a feature. In some embodiments, image processor 1280 may be configured to perform image processing functions including, but not limited to, image filtering, or image warping.

In some embodiments, image processor 1280 may be configured to identify a feature or a structure such as, for example, a contact plug (Vdd) in an acquired image. Image processor 1280 may be further configured to identify all occurrences of a feature having a gray scale value or a range of gray scale values in the acquired image. As an example, if a pixel value of the contact plug in an acquired image is 220, image processor 1280 may identify substantially all pixels having a value 220 as contact plugs. In some instances, further image filtering or image processing may be desirable to enhance accuracy and minimize identification errors.

In some embodiments, image processor 1280 may be configured to determine a variation of gray level of a feature, or a rate of variation of gray level of the feature in images captured using image acquisition mechanism 1270. As an example, image processor 1280 may determine a gray level variation gradient with respect to number of images or the time duration of image acquisition. The rate of gray level variation, also referred to as the degree of gray level variation, may be determined based on the difference in gray levels of a feature between two or more images of the feature. The rate of gray level variation may exhibit a linear trend or a non-linear trend such as a polynomial decay, or an exponential decay. In some embodiments, image processor 1280 may be configured to determine an average gradient of gray level variation in a region of the sample based on the gray level variation gradient of multiple features within the region.

Image processing system 1260 may further comprise storage mechanism 1290. In some embodiments, storage mechanism 1290 may comprise a data storage medium such as a hard disk, flash drive, cloud storage, random access memory (RAM), other types of computer readable memory, and the like. The storage mechanism 1290 may be coupled with image acquisition mechanism 1270 and may be used for saving scanned raw image data as original images, as well as post-processed images. In some embodiments, storage mechanism 1290 may be configured to store trained images received from machine learning network, temporarily or permanently. Although storage mechanism 1290 is shown as part of image processing system 1260, it is appreciated that storage mechanism 1290 may be a remote storage mechanism in communication with image processing system 1260, or controller 1250.

Figure 13:
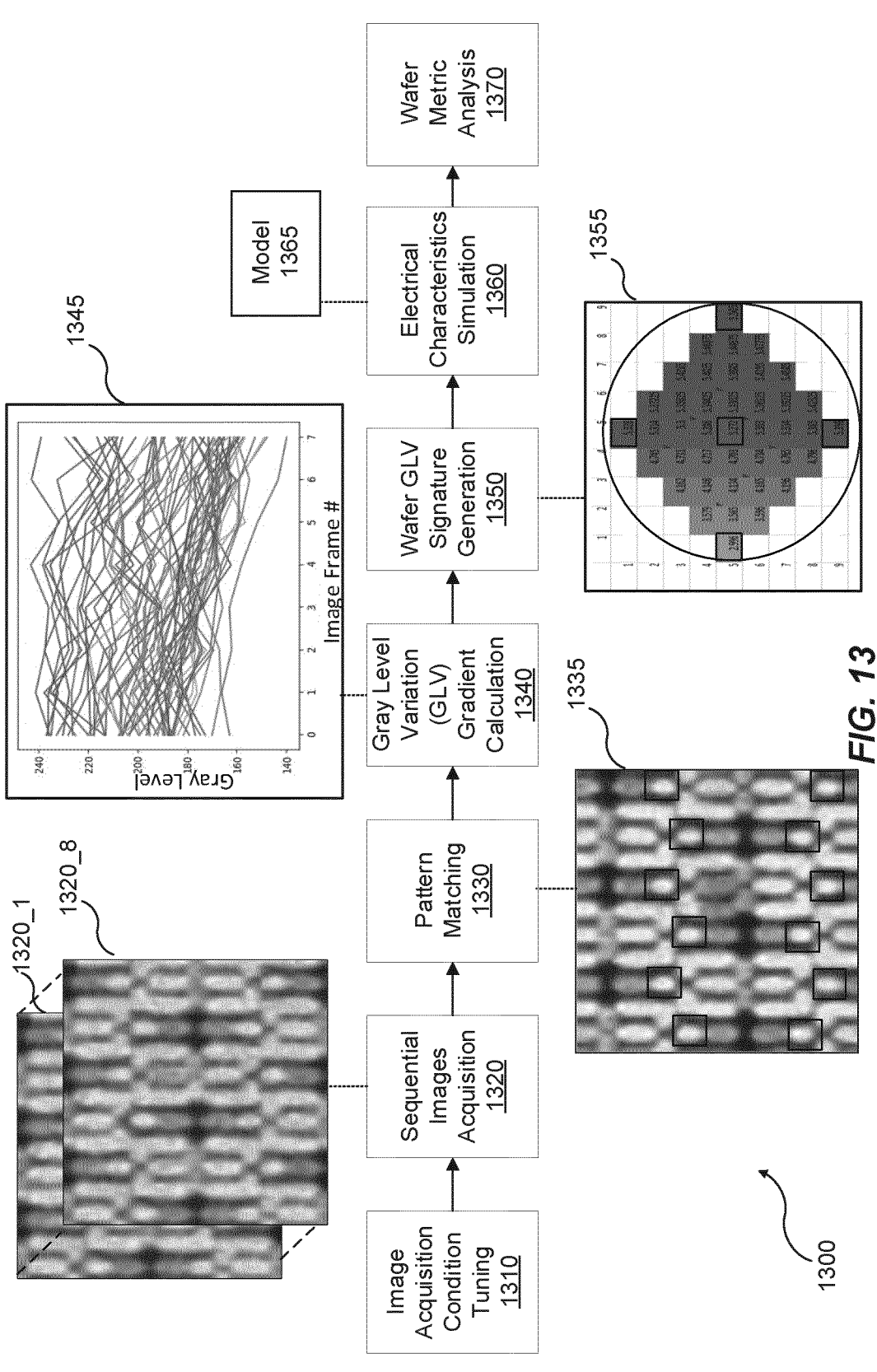
FIG. 13 is a process flowchart of an exemplary method of determining a characteristic of a structure or a semiconductor node on a sample, consistent with embodiments of the present disclosure.

Reference is now made to FIG. 13, which illustrates a process flowchart of an exemplary method 1300 for determining a characteristic of a structure on a wafer using electron beam inspection apparatus 1200, consistent with embodiments of the present disclosure. Some functions of method 1300 may be performed by a controller (e.g., controller 1250 of FIG. 12). The controller may be programmed to perform one or more steps of method 1300. For example, the controller may apply an electrical signal to activate an electron source, or to initiate detection of secondary electrons using the electron detector and carry out other functions. Some functions may be performed by a processor in communication with the controller. The processor may be a part of the controller, or a stand-alone processing device in communication with the controller. It is appreciated that electron beam inspection apparatus 1200 may be operated in voltage-contrast inspection mode to perform one or more functions of method 1300. In VC inspection mode of operation, pre-charging or flooding may be employed in which the region of interest of the sample may be exposed to a large beam current before performing an inspection using a small beam current.

In step 1310, conditions or parameters for acquisition of an image or a plurality of images of a desired region may be adjusted. Adjusting conditions of image acquisition may include adjusting a beam current of a primary electron beam (e.g., primary electron beam 300B1 of FIG. 3), a landing energy of the incident electrons of the primary electron beam, or an electric field associated with the sample, among other things. In some embodiments, controller 1250 may comprise circuitry configured to control primary beam characteristics or electron beam tool parameters.

In some embodiments, adjusting the image acquisition condition may include adjusting charging parameters of a feature for voltage-contrast inspection including, but not limited to, the amount of charges deposited on the feature, the rate of charging of the feature, the charging frequency, among other parameters. The amount of charges deposited on the feature and the rate of charging may depend on the beam current of the incoming primary electron beam, among other things. For example, if the beam current is high, a large amount of charges may be deposited in a short time period. Although high beam current may result in better image quality due to more secondary electrons generated, however it may also charge the semiconductor node too quickly or cause damage to the structures. It may be desirable to adjust the beam current of the primary electron beam to obtain high quality images while maintaining a low rate of charging as well as less damage.

In some embodiments, adjusting the image acquisition condition may further include adjusting the landing energy of the incident electrons. At low landing energy (less than 1 keV), the interaction volume between the incident electrons and the sample may be small, probing the top surface or near-top superficial layers of the sample. The secondary electrons thus generated may provide surface information at a high resolution, but may lack compositional information. At higher landing energy, the interaction volume is larger, thus providing more compositional and less topographical information. Therefore, the landing energy of the incident electrons may be adjusted to obtain high resolution or high quality images.

In some embodiments, adjusting the image acquisition condition may include adjusting the electric field close to the sample, or associated with the sample. The secondary electrons, generated upon interaction of the primary electrons with a sample surface, may be accelerated or decelerated out of the sample, based on the magnitude and direction of electric field influencing the sample. As an example, an electrode charged positively with respect to the sample may provide an accelerating electric field for the secondary electrons, while a negatively charged electrode close to the sample may provide a retarding electric field for the generated secondary electrons. The electrode potential may be adjusted to modify the electric field influencing the energy and velocity of the secondary electrons, thereby adjusting the resolution and quality of the acquired images.

In some embodiments, the image acquisition condition may be adjusted based on the desired characteristics of the acquired image including, but not limited to, brightness, contrast, field of view, magnification, or the like. In some embodiments, the desired characteristics of the acquired image may be determined based on the characteristics of the image used by image processor 1280 to identify a feature. For example, if image processor 1280 is configured to identify a feature in an image having a brightness and a contrast level, or a range of brightness and contrast levels, the desired brightness and contrast levels of the acquired image may be adjusted accordingly.

In step 1320, multiple images of the region of interest may be acquired using image acquisition conditions determined in step 1310. As used herein, a region of interest refers to a region of the sample comprising a semiconductor node or structures of a semiconductor node. In some embodiments, multiple images may be sequentially captured with a time delay between consecutive images. Time delay, as used herein, refers to the time interval or the time difference between acquisition of two consecutive images. For example, if a first image is acquired at time t1 and a second image is acquired at time t2, the time delay or the time interval is (t2–t1) seconds. In some embodiments, the time delay may be adjustable in a range from 1 millisecond (ms) to 1 nanosecond (ns).

In some embodiments, image acquisition mechanism 1270 may be configured to sequentially capture 8 images 1320_1-1320_8, as illustrated in FIG. 13, and may be further configured to cause the time delay between acquisition of consecutive images. Although FIG. 13 illustrates acquisition of 8 images, it is appreciated that any number of images may be acquired based on the application, analysis, material, among other things. The time delay between consecutive images, for example, images 1320_1 and 1320_2 may be determined based on the rate of charging or discharging of the structure, among other things. In some embodiments, the time delay between consecutive images may be uniform. For example, time delay between first image 1320_1 and second image 1320_2 may be 2 ns, and time delay between second image 1320_2 and third image 1320_3 may be 2 ns. In some embodiments, the time delay between consecutive images is configurable and may be non-uniform. For example, time delay between first image 1320_1 and second image 1320_2 may be 2 ns, and time delay between second image 1320_2 and third image 1320_3 may be 4 ns. The time delay of 1 ns between two images may result in a high rate of charging or a charge build-up in comparison to a time delay of 1 ms, due to shorter time interval between two images. In some embodiments, the time delay between images may be adjusted based on a desired application or a target analysis.

In step 1330, a pattern, a structure, or a semiconductor node may be identified from an acquired image comprising the semiconductor node. FIG. 13 shows an exemplary acquired image 1335 of a region of a SRAM. Acquired image 1335 may comprise a high resolution SEM image, an optical image, or a low resolution SEM image, acquired using image acquisition conditions based on the desired image characteristics, rate of charging of the structure, beam current of the primary electron beam, or the like.

Image processor 1280 may be configured to receive information associated with acquired image 1335 and reconstruct the image. In some embodiments, image processor 1280 may be configured to identify a structure, for example, contact plug Vdd, based on the gray level of the pixels depicting the structure. Image 1335 may comprise multiple Vdd structures, Vss structures, or other structures of the semiconductor node having representative pixel gray level values. In some embodiments, image processor 1280 may identify a structure by further performing image filtering or feature extraction algorithms using 3×3 kernels such as Prewitt kernel, Sobel kernel, or the like, in X- and Y-directions. It is appreciated that other image filtering or feature extraction algorithms may be used as well.

In some embodiments, a machine learning network may be trained to identify a structure or a feature of an image, or extract feature information from an acquired image based on a trained image. The trained image may comprise a reference image of the feature, acquired by image acquisition mechanism 1270 or other mechanism, under substantially similar acquisition conditions as acquired image 1335, for example. The acquisition of trained image and extraction of trained features using machine-learning network may be performed offline, such that these steps do not adversely impact the overall inspection throughput.

Machine learning network may include, for example, an artificial intelligence system, a neural network, or a deep-learning technique, a software implemented algorithm, or the like. The feature extraction architecture of machine learning network may comprise a convolutional neural network, for example. In some embodiments, a linear classifier network of deep learning architecture may be adopted as a starting point to train and build feature extraction architecture of machine learning network.

In some embodiments, a machine learning network may include multiple layers. For example, the architecture of a convolutional neural network may comprise an input, a first convolution, a first pooling, a second convolution, a second pooling, one or more hidden layers, an activation layer, and output layers. Based on the nature and complexity of the features, each layer of the architecture may have different numbers of sub-samples generated. After the first convolution operation, there may be less than 10 sub-samples generated in a first pool. While after the second convolution operation, the second layer may have more than 10 sub-samples generated in a second pool. In some embodiments, variation between layers may be introduced by the complexity of geometric features in the layout. Features having more geometric information may have a higher probability to generate more sub-samples. For example, a complex feature may exhibit various sub-shapes that may be broken up and analyzed as individual attributes.

In some embodiments, machine learning techniques such as deep learning, neural network processing, or the like, may be used to extract and analyze information related to resistance and capacitance parameters of node 1100, or of structures associated with node 1100, based on information obtained from acquired SEM images. As an example, a machine learning network may be trained to form a reference image of a structure based on information from a database of acquired images of the structure. The machine learning network may be further trained to compare acquired images to corresponding reference images and identify the structures in the acquired image based on the gray level intensity comparison of the structures. In some embodiments, the machine learning network may be further trained to determine the gray level variation of the identified structure between multiple images, to determine the trend of gray level variation of the structure, and to compute a gradient of the gray level variation of the structure based on the determined trend. In some embodiments, the machine learning network may be further trained to obtain information associated with the geometry, dimensions, or in-line process and measurement data of the structure from a database, and extract the information associated with resistance or capacitance of the structure predicted based on a simulation model.

In some embodiments, image processor 1280 may be configured to locate, upon identification of the structure, a plurality of the same structures in image 1335. As an example, image processor 1280 may be configured to identify and locate substantially all of the contact plugs Vdd in image 1335, based on the gray level intensity of the pixel representing the plug. As an example, image 1335 comprises 60 contact plugs Vdd arranged in a rectangular 12×5 matrix. The number of contact plugs may vary based on the field of view, magnification, region of interest, among other things. In some embodiments, image processor 1280 may be configured to identify and locate a plurality of different structures in image 1335 such as contact plugs Vss, gate contact plugs, bit lines, word lines, among other structures, based on the pixel gray level intensities.

In step 1340, a gradient of gray level value of a structure in a region of the sample is determined. In a SEM, "charging" refers to the build-up of either positive or negative potential at or near the surface of a sample while it is being irradiated by primary electrons. Although charging may result in a number of undesirable consequences, it may be advantageously used, for example, in voltage-contrast inspection mode and electron beam induced conductivity (EBIC) in insulating or samples. Charged surfaces appear brighter in a SEM image and as the charges dissipate due to leakage, conduction, or other mechanism, the surface appears darker. The change in brightness manifests as a variation in gray level intensity of the pixels in a SEM image. Gray level intensity or the pixel intensity refers to the intensity or brightness of the pixel. On a brightness scale of 0-255, smaller numbers (closer to 0) represent black, and larger numbers (closer to 255) represent white pixels. Numbers between 0 and 255 represent shades of gray.

In some embodiments, upon identification of the structures such as contact plugs Vdd in one or more images 1320_1-1320_8, image processor 1280 may store location information and gray level intensities of the identified contact plugs. The location information of contact plugs and their corresponding gray level intensity information may be stored in storage mechanism 1290. In some embodiments, location information and the corresponding gray level intensity information of each of 8 images (1320_1-1320_8) may be recorded and stored. In other embodiments, location information and the corresponding gray level intensity information of two or more images may be recorded and stored. Storage mechanism 1290 may comprise a storage medium such as a hard disk, cloud storage, random access memory (RAM), a database, a network, a computer, a server, or other types of computer readable memory.

Image processor 1280 may be further configured to determine the gray level variation of identified contact plugs with respect to time or image frame number (e.g., image 1320_1, 1320_2, 1320_3, 1320_4, 1320_5, 1320_6, 1320_7, and 1320_8). With reference to sequential imaging or sequential image capturing, image frame number may represent the number of the image of the plurality of images and the order of image capture. For example, image frame number 1320_3 represents the third image captured of the plurality of images and is captured after the second frame 1320_2 and before the fourth frame 1320_4. It is appreciated that any identification or labeling method for frame numbers may be used. As illustrated in FIG. 13, image 1345 shows a graph depicting the gray level of 60 contact plugs in eight frames (e.g., 1320_1-1320_8), labeled frame number 0 to 7.

In some embodiments, image processor 1280 may be further configured to determine the gradient of gray level variation of each contact plug based on the gray level intensity information with respect to image frame number. In some embodiments, the information associated with image frame number may be translated into time based on the information associated with the time of image capture and the time delay between consecutive images. For example, if the capture time t0 for the first frame (frame #0) is the reference time t0=0, and the time delay between successive images is 2 ns, the image capture time t1=2 ns, t2=4 ns, t3=6 ns, t4=8 ns, t5=10 ns, t6=12 ns, and t7=14 ns. In some embodiments, image processor 1280 may be further configured to determine an average gradient of gray level variation of a structure (e.g., contact plug Vdd) of a region of the sample. Image processor 1280 may be further configured to determine an absolute value of the average gradient of gray level variation of a structure.

In some embodiments, the gradient or the slope of the gray level variation may be determined using data-fitting techniques such as linear fitting, polynomial fitting, curve fitting, or the like. Image processor 1280 may be configured to perform data-fitting to extract parameters including, but not limited to, the gradient, decay constant, or other parameters based on the gray level variation of a structure.

In some embodiments, the gray level variation, or the rate (gradient) of gray level variation may be utilized to determine electrical characteristics such as resistance or capacitance of electrical nodes, or geometric characteristics such as critical dimensions, overlay, etc. As used herein, a "critical dimension" refers to the size of a feature or a structure of an electrical node that impacts the electrical properties of a device. The dimensions of each of the components of a field-effect transistor are critical dimensions. These dimensions can all influence the electrical performance of the device because they may contribute parasitic capacitance and resistance. For example, a channel of a field-effect transistor has a length and a width, the electrodes have specific geometries, the gate may have different dimensions compared to the channel and may not span the full width of the channel.

In step 1350, image processor 1280 may be further configured to generate a pattern comprising average gradients of gray level variation of a structure across multiple regions of the sample based on the determined absolute values of average gradients of gray level variation of a region of the sample and location information of the corresponding region. In some embodiments, image processor 1280 may be configured to determine average gradients of gray level variation of a predetermined number of regions at predetermined locations on the sample. For example, image processor 1280 may be configured to determine the average gradient of gray level variation of a structure at five locations including a center die, a left die, a right die, a top die, and a bottom die of a wafer. In some embodiments, image processor 1280 may be configured to interpolate the average gradient of gray level variation of the sample based on the average gradients of the predetermined five locations, as illustrated in image 1355 of FIG. 13. In some embodiments, image processor 1280 may be further configured to determine a gray level signal decay time constant, an initial gray level, and a final gray level for each electrical node or semiconductor node based on gray level variation data.

In step 1360, the electrical characteristics of a semiconductor node may be predicted, by simulation, based on information associated with average gradients of gray level variation determined in step 1350. A model 1365 (discussed later with reference to FIG. 14) may be used to simulate the electrical characteristics including, but not limited to, resistance, dielectric capacitance, or RC time constant of a semiconductor node or of a structure associated with the semiconductor node. In some embodiments, model 1365 may be executable by image processor 1280, controller 1250, image processing system 1260, or any processor configured to execute software-implemented algorithms.

In step 1370, physical characteristics of the semiconductor node or a structure associated with the node may be predicted based on the electrical characteristics. Physical characteristics may comprise critical dimensions, bottom critical dimensions, overlay, or the like. In some embodiments, compositional information or stoichiometric information may be predicted based on the electrical characteristics of the node.

Figure 14:
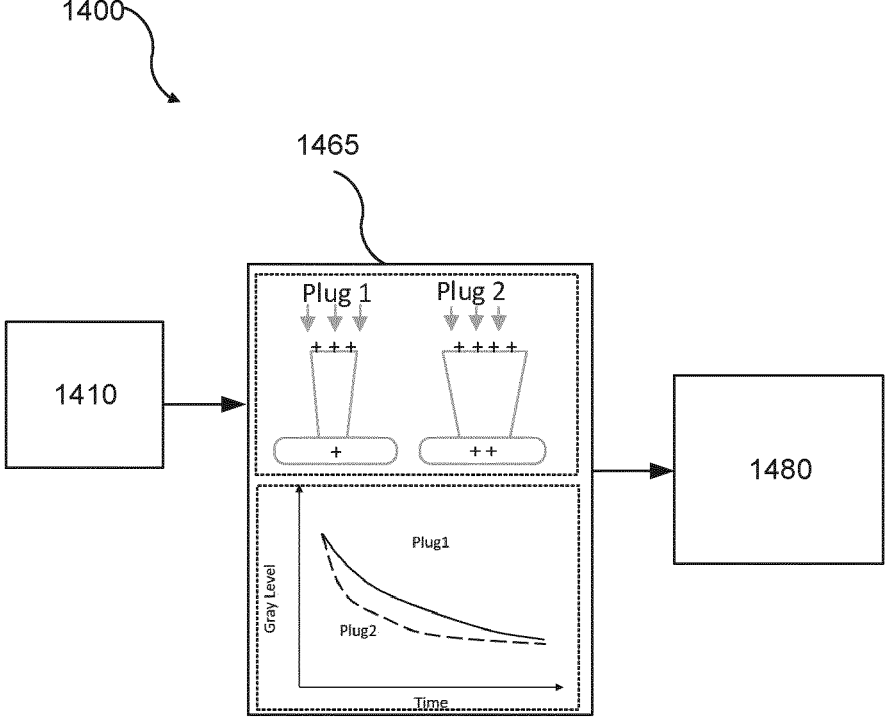
FIG. 14 is a schematic illustration of an exemplary configuration of a model to simulate electrical characteristics of a sample based on gray level variation of the sample, consistent with embodiments of the present disclosure.

Reference is now made to FIG. 14, which illustrates an exemplary configuration 1400 of a model to simulate electrical characteristics of a sample based on gray level variation of the sample, consistent with embodiments of the present disclosure. Model 1465, analogous to model 1365 of FIG. 13, may be configured to simulate the resistance, capacitance, RC time constant, or other electrical characteristics of a structure associated with an electrical node based on the gray level variation information. Configuration 1400 includes a model 1465 configured to receive input data 1410. A simulation process may be performed using model 1465 to predict electrical characteristics of a structure on a sample and generate output data 1480 comprising information associated with the predicted electrical characteristics. Output data 1480 may be further used to predict physical characteristics of the sample or may be stored in a storage mechanism (e.g., storage mechanism 1290 of FIG. 12). In some embodiments, model 1465 may comprise an electrical circuit model comprising the structure or structures associated with the node. The electrical circuit model or model 1465 may include the structures associated with the node such as a resistor, a capacitor, an inductor, contact plugs, a transistor, metal interconnects, power source, or the like, as arranged in the sample, or in the region of interest.

The charging and discharging behavior of a structure exposed to an electron beam during voltage contrast inspection may vary based on the characteristics of the structure including, but not limited to, geometry, composition, location within the device, resistance, capacitance, or processing history, among other things. Therefore, an analysis of the charging and discharging behavior may be desirable to extract information associated with one or more of the characteristics affecting the charging and discharging behavior. As an example, in FIG. 14, the gray level variation for plugs 1 and 2 may vary based on their size, resistance, or composition. For a given composition, the difference in contact resistance of plug 1 and plug 2 with the underlying feature may be related to the difference in size or geometry including critical dimensions, bottom CDs, presence of a defect such as a void or an interfacial layer, or the stoichiometric and atomic arrangement. Therefore, a correlation between the gray level variation and change in resistance or critical dimensions may be desirable for defect inspection, among other things.

Input data 1410 may comprise information associated with gray level variation of a structure, geometry of the structure, composition of the structure, processing history of the structure, or the like. In some embodiments, model 1465 may simulate the electrical characteristics of a contact plug at a process step based on the processing history of the structure in the FAB. For example, voltage contrast inspection may be performed at Tungsten Chemical Mechanical Polishing (WCMP) process step to determine defects in contact plugs, among other things. In such cases, model 1465 may utilize information associated with the deposition process, the etching process, the thickness measurements, the tool history, the sample history, etc. to simulate the electrical characteristics of the structure based on the gray level variation.

Output data 1480 may comprise information associated with electrical characteristics of a structure such as resistance, or capacitance, and physical characteristics of the structure such as bottom CD, overlay, or the like. A simulation process, using model 1465, may be performed to simulate electrical and physical characteristics of a sample based on input data 1410. In some embodiments, image processor 1280 may be configured to generate a pattern of the simulated electrical or physical characteristics of the structure based on the predicted electrical characteristics using model 1465 and location information of the structure. In some embodiments, image processor 1280 may be configured to correlate the pattern comprising average gradients of gray level variation of a structure (e.g., image 1355 of FIG. 13) and the pattern of the simulated electrical or physical characteristics of the structure. In some embodiments, upon training, model 1465 may be configured to predict the electrical or physical characteristics of a structure based on a pattern comprising average gradients of gray level variation of the structure.

Figure 15:
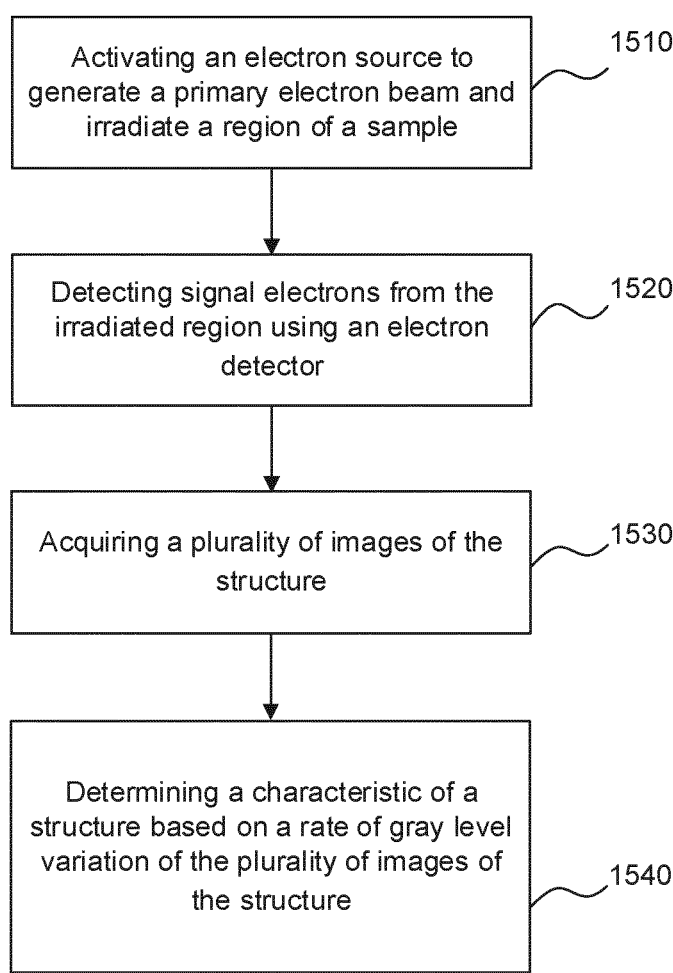
FIG. 15 is a process flowchart representing an exemplary method of determining a characteristic of a structure, consistent with embodiments of the present disclosure.

Reference is now made to FIG. 15, which illustrates a process flowchart representing an exemplary method 1500 of determining a characteristic of a structure, consistent with embodiments of the present disclosure. Some functions of method 1500 may be performed by a controller (e.g., controller 1250 of EBI apparatus 1200, as shown in FIG. 12). The controller may be programmed to perform one or more steps of method 1500. For example, the controller may apply an electrical signal to activate an electron source or carry out other functions.

In step 1510, an electron source may be activated to generate a primary electron beam (e.g., primary electron beam 204 of FIG. 2). The electron source may be activated by the controller. For example, the electron source may be controlled to emit primary electrons to form an electron beam along a primary optical axis. The electron source may be activated remotely, for example, by using a software, an application, or a set of instructions for a processor of a controller to power the electron source through a control circuitry. The primary electron beam may be directed through an electron beam tool (e.g., electron beam tool 1240 of FIG. 12) to be incident on a surface of a sample (e.g., sample 315 of FIG. 3), forming a probe spot. Upon interaction with the sample, the primary electron beam may generate a plurality of signal electrons such as secondary electrons, backscattered electrons, or auger electrons, among other things.

The EBI apparatus (e.g., electron beam inspection apparatus 1200 of FIG. 12) may provide a mechanism to support multiple modes of operation. For example, the electron beam tool may be configured to operate in a flooding mode to highlight a voltage contrast defect by flooding a surface of a sample with charged particles (e.g., electrons), and an inspection mode to analyze defects highlighted during the flooding mode, using high resolution imaging methods. The electron beam tool may be configured to switch between modes of operation. For example, a complete scan of voltage contrast defect detection and analysis may include flooding the surface of the sample for a predetermined time duration, followed by high resolution inspection of any defects identified by flooding.

In step 1520, an electron detector (e.g., charged-particle detectors 306A and 306B of FIG. 3) may be configured to detect the signal electrons comprising the secondary electrons generated from the sample. The electron detector may comprise one or more detectors. An image may be formed based on the signal detected by the electron detector. The EBI apparatus may comprise an image processing system (e.g., image processing system 1260 of FIG. 12) comprising an image acquisition mechanism (e.g., image acquisition mechanism 1270 of FIG. 12), an image processor (e.g., image processor 1280 of FIG. 12) and a storage mechanism (e.g., storage mechanism 1290 of FIG. 12). The image acquirer may comprise one or more processors. For example, the image acquirer may comprise a computer, server, mainframe host, terminals, personal computer, any kind of mobile computing devices, and the like, or a combination thereof. The image acquirer may be communicatively coupled to the signal electron detector through a medium such as an electrical conductor, optical fiber cable, portable storage media, IR, Bluetooth, internet, wireless network, wireless radio, among others, or a combination thereof. The image acquirer may receive a signal from the signal electron detector and may construct an image. The image acquirer may thus acquire images of regions of the sample. The image acquirer may also perform various post-processing functions, such as image filtering, determining gray scale levels, generating contours, superimposing indicators on an acquired image, and the like. The image acquirer may be configured to perform adjustments of brightness and contrast, among other things, of acquired images. In some embodiments, the storage may be a storage medium such as a hard disk, flash drive, cloud storage, random access memory (RAM), other types of computer readable memory, and the like. The storage may be coupled with the image acquirer and may be used for saving scanned raw image data as original images, and post-processed images.

In step 1530, multiple images of a region of interest such as a structure, a semiconductor node, or an electrical node, may be acquired using optimized image acquisition conditions. Multiple images may be sequentially captured with a time delay between consecutive images. For example, if a first image is acquired at time t1 and a second image is acquired at time t2, the time delay or the time interval is (t2–t1) seconds. In some embodiments, the time delay may be adjustable in a range from 1 millisecond (ms) to 1 nanosecond (ns).

In some embodiments, the image acquirer may be configured to sequentially capture 8 images (e.g., images 1320_1-1320_8 of FIG. 13), and may be further configured to cause the time delay between acquisition of consecutive images. The time delay between consecutive images may be adjusted based on the rate of charging or discharging of the structure, among other things. In some embodiments, the time delay between consecutive images may be uniform. For example, time delay between first image 1320_1 and second image 1320_2 may be 2 ns, and time delay between second image 1320_2 and third image 1320_3 may be 2 ns. In some embodiments, the time delay between consecutive images may be non-uniform. For example, time delay between first image 1320_1 and second image 1320_2 may be 2 ns, and time delay between second image 1320_2 and third image 1320_3 may be 4 ns.

In step 1540, a characteristic of a structure associated with the node may be determined based on a rate of gray level variation of the plurality of images of the node. The gray level variation, or the rate (gradient) of gray level variation may be utilized to determine electrical characteristics such as resistance or capacitance of electrical nodes, or physical characteristics such as critical dimensions, overlay, etc. Determining the electrical or physical characteristics of a structure or a semiconductor node may include, but is not limited to, adjusting image acquisition conditions; acquiring a plurality of images of the region of interest; identifying the structure from the acquired image based on a gray level of the pixel representing the structure; locating all the structures in the image, based on the identification from gray levels of the representative pixels; determining the gray level variation of the structure in the plurality of images; determining the gray level variation of a plurality of structures in each image of the plurality of images; determining the rate of gray level variation with respect to image frame number or time; determining the initial and the final gray level values; predicting the electrical characteristics of a structure, using a model, based on the determined gradient of gray level variation; and predict the physical characteristics of the sample based on the predicted electrical characteristics.

A non-transitory computer readable medium may be provided that stores instructions for a processor of a controller (e.g., controller 50 of FIG. 1) to carry out image inspection, image acquisition, image processing to determine gray levels and gray level gradients between multiple images, activating the charged-particle source, activating an optical source, applying signal to the charged-particle detector, adjusting excitation and detection signals applied by a controller, stage motion control, beam separator excitation, applying scan deflection voltages to beam deflectors, receiving and processing data associated with signal information from electron detectors, configuring an electrostatic element, detecting signal electrons, adjusting the control electrode potential, adjusting the voltages applied to the electron source, extractor electrode, and the sample, etc. The controller may also perform functions including applying a signal to an optical particle source such as a laser, sweeping laser power density, determining a gray level of the images of features, applying signal to a charged-particle detector, storing temporal information of signals applied to particle sources and detectors, applying signals to an electron source to generate pulsed electron beams, adjust time delays between pumping and probing signals, storing temporal information of signals received by an optical detector, etc. Common forms of non-transitory media include, for example, a floppy disk, a flexible disk, hard disk, solid state drive, magnetic tape, or any other magnetic data storage medium, a Compact Disc Read Only Memory (CD-ROM), any other optical data storage medium, any physical medium with patterns of holes, a Random Access Memory (RAM), a Programmable Read Only Memory (PROM), and Erasable Programmable Read Only Memory (EPROM), a FLASH-EPROM or any other flash memory, Non-Volatile Random Access Memory (NVRAM), a cache, a register, any other memory chip or cartridge, and networked versions of the same.

Figure 16A:
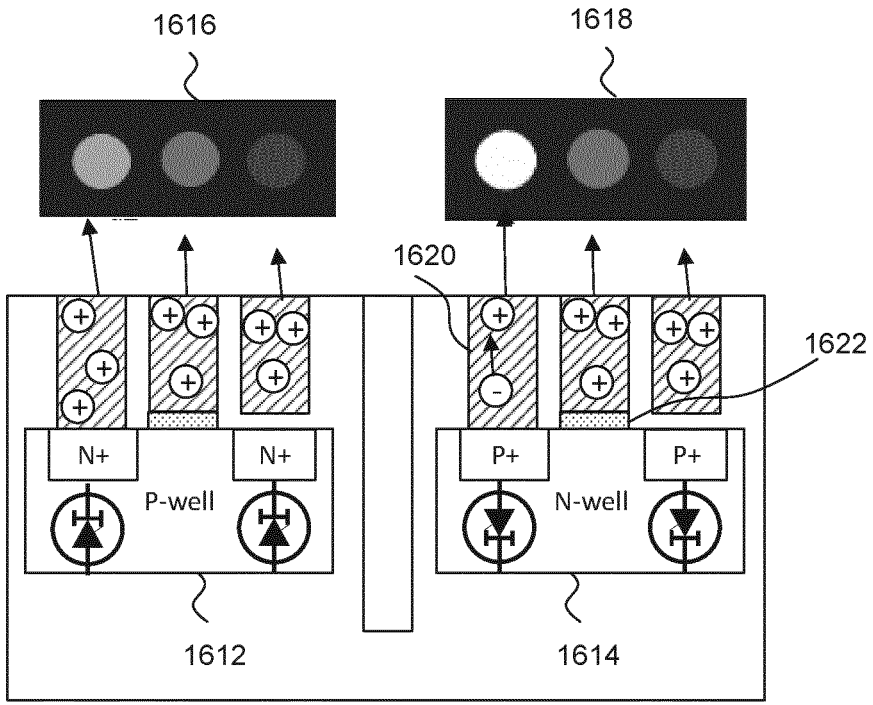
FIG. 16A is a schematic illustration of exemplary normal and open metal contacts to NMOS and PMOS device structures, consistent with embodiments of the present disclosure.

Reference is now made to FIG. 16A, which illustrates exemplary metal contacts in an N-type metal-oxide semiconductor (NMOS) device 1612 and a P-type metal-oxide semiconductor (PMOS) device 1614, consistent with embodiments of the present disclosure. Upon electron beam inspection, PMOS device 1614 including a p+/n well junction may be forward-biased, allowing the electrons to flow from the p-doped semiconductor region into a metal contact 1620. NMOS device 1612 including a n+/p well junction may be reverse biased, blocking the flow of electrons from the n-doped semiconductor region into metal contact 1620. Scanning electron microscopy images 1616 and 1618 of NMOS device 1612 and PMOS device 1614, respectively, illustrate a comparison of voltage contrast in the images of metal contact 1620. For example, in PMOS device 1614, metal contact 1620 making a full contact with the doped semiconductor region appears brighter than a high-resistance metal contact with a defect 1622 such as, but not limited to, a dielectric layer, interfacing the semiconductor. An "open" metal contact appears the darkest because the complete blockage of the passage of electrons into the metal contact results in accumulation of the positive charges, thereby reducing the secondary electron signal that may be detected.

Figure 16B:
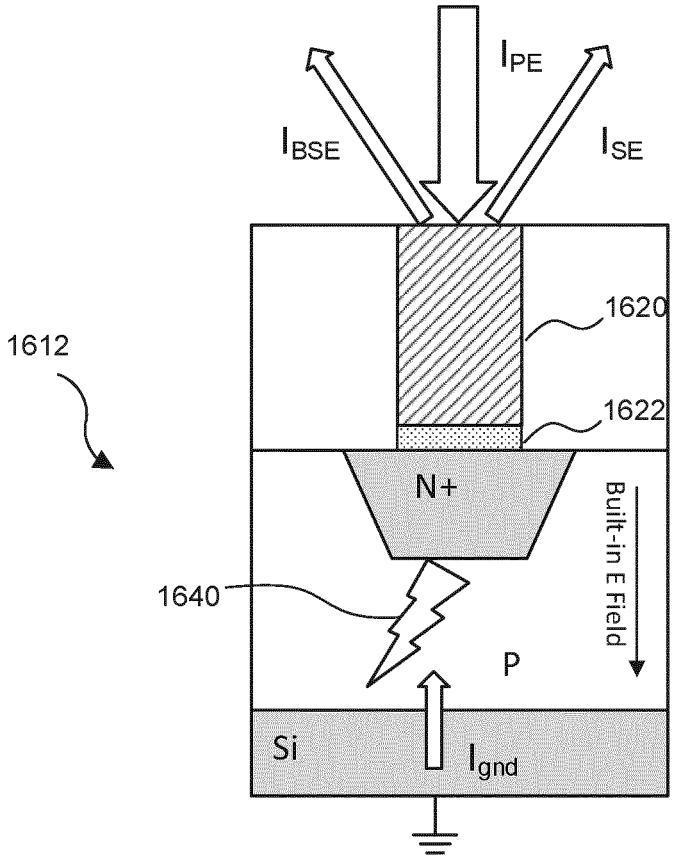
FIG. 16B is a schematic illustration of exemplary defective contact to an N+/P junction in a semiconductor device, consistent with embodiments of the present disclosure.

As an example, in NMOS device 1612 illustrated in FIG. 16B, defect 1622 may impede or substantially block the flow of charges between metal contact 1620 and the doped semiconductor region. It is to be appreciated that in reverse-biased NMOS devices such as NMOS device 1612, the voltage contrast in SEM images of metal contact 1620 with or without a defect is not high. As alluded earlier, one of several ways to overcome this issue may include generating an abundance of charge carriers such as, but not limited to, electron-hole pairs, to neutralize the charges generated during electron beam inspection. Electron-hole pairs may be generated, for example, by illuminating a semiconductor sample with light having photon energies higher than the energy gap of the semiconductor. Photocurrent 1640, as shown in FIG. 16B, may be generated by illuminating the n+/p well junction with a laser source having photon energy higher than the energy gap of the semiconductor. It is to be appreciated that electron-hole pairs may be generated using other optical sources and other methods employing alternative optical sources as well.

Although optical sources such as, but not limited to, a laser, may be used to improve the contrast difference between a normal contact (e.g., metal contact 1620 of FIG. 16A) and a defective contact (e.g., metal contact 1620 with defect 1622 of FIG. 16B) in a NMOS device 1612 during electron beam inspection, it may be challenging to differentiate between a normal contact and a leaky contact, because they may both appear bright, with marginal contrast difference. Further, it may also be challenging to differentiate between a high-resistance contact with a resistance in the range of 100 MΩ-1000 MΩ, and an open contact, because they may both appear dark, with marginal contrast difference in the corresponding SEM images. It is to be appreciated that although FIGS. 16A and 16B illustrate a reverse-biased NMOS device 1612 blocking the flow of current when an electron beam landing energy causes positive charging of metal contact 1620, electrical defects such as leakages, may be detected in PMOS device 1614 by adjusting the electron beam landing energy such that metal contact may be negatively charged.

Figure 17:
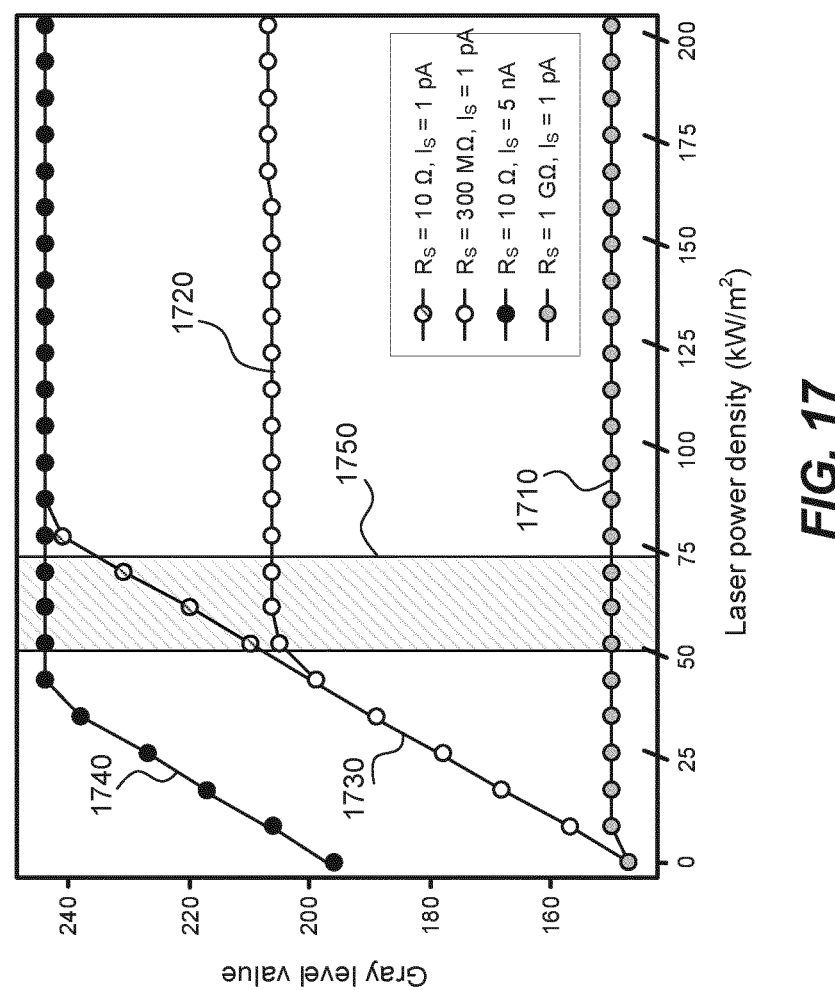
FIG. 17 illustrates a data graph representing numerical data of gray level values of metal contacts plotted as a function of laser power density in a semiconductor device of FIG. 16, consistent with embodiments of the present disclosure.

Reference is now made to FIG. 17, which illustrates a data graph 1700 representing numerical data of gray level values of metal contacts plotted as a function of laser power density, consistent with embodiments of the present disclosure. As previously described, in a 8-bit grayscale image, there may be 256 discrete gray scale levels and each pixel may be assigned a gray scale value between "0" and "255", where a gray level 0 indicates a black pixel and a gray level 255 indicates a white pixel. The laser power density, as used herein, refers to the irradiance or the ratio of total power (in Watts, W or kiloWatts, kW) passing through a cross-section area (cm2 or m2). The gray level values plotted in FIG. 17 represent a monotonous function of the surface potential of a metal contact corresponding to a range of laser power density, in a semiconductor device. The numerical data illustrated in data graph 1700 is obtained for a SEM beam current of 20 nanoAmperes (nA), no bias on wafer deflector, a landing energy for which the secondary electron yield is 1.2, and the backscattered electron yield is 0.3. It is to be appreciated that these parameters and conditions are exemplary and may vary based on a number of factors including, but not limited to, device type, material, equipment status, equipment type, operation mode of the SEM, inspection parameters, defects, among other parameters.

As shown in FIG. 17, data set 1710 represents a change in gray level values (e.g., on a scale of 0 to 255) of an exemplary defect (e.g., open) as a function of laser power density expressed in kW/m2. An "open", as used herein, refers to an electrical defect which may cause an interrupted flow of charges in a circuit, often resulting in device failure. The resistance to charge flow offered by an open may be extremely large, typically in GΩ (109Ω) or more, and a saturation current of a device having an open may be extremely small, typically in picoAmperes (1 pA=10-12 A).

Data set 1720 represents a change in gray level values of a contact having a defect with high-resistance, typically 100 MΩ or more, as a function of laser power density expressed in kW/m2, data set 1730 represents a change in gray level values of a normal contact, substantially free of defects, as a function of laser power density, and data set 1740 represents a change in gray level values of a leaky contact, as a function of laser power density. A "leaky" contact, as used herein and in the context of electrical circuits, refers to a contact having an undesirable leakage path for the charges. The amount of charges flowing through a leaky contact may be several orders of magnitude larger than a normal, defect-free contact, under substantially similar voltage gradient.

In currently existing laser-assisted voltage contrast SEM (VC-SEM) techniques for electrical testing of circuits, one of several ways to mitigate the challenges associated with poor contrast between a normal contact and a defective contact may include illuminating the sample with higher laser power densities, typically 100 kW/m2. Although useful in limited applications, employing high laser power densities may be inadequate, and even misleading, for isolating leakage defects from a normal contact or isolating a very high-resistance defect from an open contact. This may be because at high laser power densities (e.g., 75 kW/m2 or higher), the gray level values for a leaky contact may be similar or substantially similar to a normal contact. For example, as illustrated in FIG. 17, data set 1730 and data set 1740 representing a normal contact and a leaky contact, respectively, are indistinguishable at laser power density of 90 kW/m2 or higher. In other words, at high laser power densities, a leaky contact and a normal contact may appear to have similar brightness (e.g., gray level value of 250 or higher) with no resolvable contrast difference, thus rendering the technique inadequate. As another example, at high laser power densities (e.g., 90 kW/m2 or more), as the resistance of a high-resistance contact approaches the resistance of an open contact (typically in G$\Omega$), the gray level value decreases closer to the gray level value exhibited by an open contact. Therefore, a laser-assisted VC-SEM defect detection technique may be desirable to resolve and identify electrical defects in a semiconductor device.

In some embodiments, a charged-particle beam apparatus (e.g., charged-particle beam apparatus 300 of FIG. 3) may comprise an optical source (e.g., optical source 320 of FIG. 3) configured to generate an optical beam (e.g., optical beam 322 of FIG. 3). The generated optical beam may be a continuous optical beam, or a pulsed optical beam comprising one or more excitation pulses (e.g., excitation pulse 321 of FIG. 3). As previously described in reference to FIG. 3, the optical source may comprise a solid-state laser, a semiconductor laser, a gas laser, a dye laser, a chemical laser, a diode-pumped fiber laser, a gain-switched laser, or gain-switched laser diodes coupled with fiber amplifiers. In some embodiments, the generated optical beam may be a laser beam having a characteristic photon wavelength (nm), photon frequency (Hz), power (W), power density (W/cm2 of kW/m2), energy density (J/cm2), among other things. In some embodiments, the optical source may be an independently controllable, stand-alone optical source. For example, the optical source may not be a part of apparatus 300 and may be independently operable to generate the optical beam.

In some embodiments, the detection of secondary charged-particles generated upon interaction of primary charged-particles with a region of a sample may be based on a surface potential of the region of the sample. A region of the sample, as used herein, may refer to a circuit, a circuit component, a portion of a die, a die, a scribe line, a device, a contact pad, or any feature fabricated or disposed on the sample. The surface potential of a region may be based on, among other factors, availability of neutralizing charges in the region, presence of defects, quality of contact, device processing conditions, etc. For example, upon irradiating a surface of the sample comprising a p-n junction in a reverse-biased NMOS device (e.g., NMOS device 1612 of FIG. 16A) with electrons from an electron source of a SEM, the flow of electrons through the p-n junction may be impeded, thereby causing the positive charges to accumulate. The accumulation of positive charges may reduce the surface potential and may restrict the secondary electrons from escaping out of the surface. This may result in a poor signal detected by the secondary electron detector, and thus, a poor contrast in the detected signals. To overcome this challenge, an optical source such as a laser, may be used to illuminate or flood the region of the sample so that an abundance of charge carriers such as electron-hole pairs may be generated in the region. The generated charged carriers may neutralize the accumulated charges in the region, thereby increasing the surface potential, and resultantly enhancing the contrast in images.

In some embodiments, a characteristic of the optical beam (e.g., optical beam 322 of FIG. 3) may be adjusted to cause a variation in a characteristic of the generated secondary charged-particles. The characteristic of the optical beam may include, but is not limited to, energy density, power density, frequency, wavelength, total power, or total energy. In some embodiments, adjusting the characteristic of the optical beam may include sweeping the laser power density from 0 to 400 kW/m2, or 0 to 300 kW/m2, or 0 to 250 kW/m2, or 0 to 200 kW/m2, or 0 to 150 kW/m2, or 0 to 100 kW/m2, or 0 to 75 kW/m2, or 0 to 50 kW/m2, or 0 to 40 kW/m2, or other suitable ranges, as appropriate. In a preferred embodiment, the laser power density may be swept from 0 to 100 kW/m2, including 0 kW/m2 as a lower limit of the sweep scan and 100 kW/m2 as a upper limit for the sweep scan.

In some embodiments, adjusting the characteristic of the optical beam may include adjusting the laser power density incrementally. Incremental adjustment of the laser power density may include increasing the power density of the incident optical beam in a regular interval step function, irregular interval step function, continuous function, among other function profiles of sweeping laser power density. In some embodiments, the laser power density may be incrementally swept in one direction. For example, in a step function, the laser power density may be higher than any preceding value of applied laser power density. In some embodiments, a characteristic of the generated secondary charged-particles may include, but is not limited to, a trajectory, an energy, an intensity, or a number of secondary charged-particles. The presence of accumulated charges on a surface of a sample may impact one or more characteristics of the secondary charged-particles, thereby impacting the detected signal charged-particles by a detector.

As an example, FIG. 17 illustrates a data graph of the change in gray level values of the SEM image of a metal contact pad of a semiconductor device as the power density of the optical beam is swept from 0 kW/m2 to >200 kW/m2. As shown, the determined gray level values of a feature (e.g., metal contact pad 1620 of FIG. 16A) of a semiconductor device on the sample may be distinguishable and resolvable at a range 1750 (represented by a shaded band for visual aid only) of laser power density. For example, within range 1750 of laser power density, an open contact having extremely high resistance, in G$\Omega$, represented by data set 1710, may appear dark with gray level value below 150. A high resistance contact having resistance in M$\Omega$, represented by data set 1720, may appear brighter than the open contact, with gray level value between 200-205. Further, a normal contact substantially free of defects having resistance in Q, represented by data set 1730, may appear brighter than the high-resistance contact (represented by data set 1720), with gray level value between 210-230, and a leaky contact having leakage defects may appear the brightest, represented by data set 1740, with the highest gray level value of 255. Therefore, an electrical defect may be identified and detected based on the determined gray level value of the feature comprising the defect and being examined by the charged-particle beam apparatus in voltage contrast mode.

Reference is now made to FIG. 18, which illustrates a process flow chart representing an exemplary method 1800 of identifying a defect in a sample, consistent with embodiments of the present disclosure. Some functions of method 1800 may be performed by a controller (e.g., controller 1250 of EBI apparatus 1200, as shown in FIG. 12). The controller may be programmed to perform one or more steps of method 1800. For example, the controller may apply an electrical signal to activate an electron source or activate an optical source to generate an optical beam, or carry out other functions.

In step 1810, an electron source may be activated to generate a primary electron beam (e.g., primary electron beam 204 of FIG. 2). The electron source may be activated by the controller. For example, the electron source may be controlled to emit primary electrons to form an electron beam along a primary optical axis. The electron source may be activated remotely, for example, by using a software, an application, or a set of instructions for a processor of a controller to power the electron source through a control circuitry. The primary electron beam may be directed through an electron beam tool (e.g., electron beam tool 1240 of FIG. 12) to be incident on a surface of a sample (e.g., sample 315 of FIG. 3), forming a probe spot. Upon interaction with the sample, the primary electron beam may generate a plurality of signal electrons such as secondary electrons, backscattered electrons, or auger electrons, among other charged-particles.

The EBI apparatus (e.g., electron beam inspection apparatus 1200 of FIG. 12) may provide a mechanism to support multiple modes of operation. For example, the electron beam tool may be configured to operate in a flooding mode to highlight a voltage contrast defect by flooding a surface of a sample with electrons or photons, and an inspection mode to analyze defects highlighted during the flooding mode, using high resolution imaging methods. The electron beam tool may be configured to switch between modes of operation. For example, a complete scan of voltage contrast defect detection and analysis may include flooding the surface of the sample for a predetermined time duration, followed by high resolution inspection of any defects identified by flooding.

In step 1820, an optical source (e.g., optical source 320 of FIG. 3) may be activated to generate an optical beam (e.g., optical beam 322 of FIG. 3). The optical source may be configured to generate the optical beam comprising a plurality of excitation pulses (e.g., excitation pulse 321 of FIG. 3). In some embodiments, the optical beam may be a pulsed optical beam comprising a plurality of excitation pulses or a continuous optical beam. The excitation pulses may be represented by a pulse waveform having a pulse width, a pulse frequency, a pulse energy, and a pulse repetition rate. The optical source may comprise a solid-state laser, a semiconductor laser, a gas laser, a dye laser, a chemical laser, a diode-pumped fiber laser, a gain-switched laser, or gain-switched laser diodes coupled with fiber amplifiers. In some embodiments, the optical source may comprise a femtosecond laser source configured to generate ultrashort optical pulses having a pulse width of less than 1 picosecond (<10-12 seconds). A femtosecond (fs) laser may generate sub-picosecond optical pulses with a pulse width or pulse duration in the range of 1 to 1000 fs (1 fs=10-15 seconds). In some embodiments, the generated excitation pulse may have a pulse duration of <500 fs, preferably <400 fs.

The optical beam may illuminate a second region of the sample, different from the first region of the sample. In some embodiments, the second region of the sample illuminated by the optical beam may include a portion of the first region or the entirety of the first region of the sample irradiated by the primary electron beam. In some embodiments, the first region of the sample may include a portion of the sample comprising a semiconductor device, a feature of a semiconductor device, a circuitry comprising multiple semiconductor devices such as transistors, diodes, capacitors, resistors, among other things. In some embodiments, the second region of the sample may include a portion of the sample adjacent the first region, surrounding the first region, partially overlapping the first region, or a distance away from the first region.

The optical beam generated by the optical source may be configured to generate charge carriers such as electron-hole pairs in the second region of the sample based on a characteristic of the optical beam. For example, if the power density of the optical beam is high, a larger number of electron-hole pairs may be generated in comparison to an optical beam with lower power density.

In step 1830, an electron detector (e.g., charged-particle detectors 306A and 306B of FIG. 3) may be configured to detect the signal electrons comprising the secondary electrons generated from the sample. The electron detector may comprise one or more detectors. An image may be formed based on the signal detected by the electron detector. The EBI apparatus may comprise an image processing system (e.g., image processing system 1260 of FIG. 12) comprising an image acquisition mechanism (e.g., image acquisition mechanism 1270 of FIG. 12), an image processor (e.g., image processor 1280 of FIG. 12) and a storage mechanism (e.g., storage mechanism 1290 of FIG. 12). The image acquirer may comprise one or more processors. For example, the image acquirer may comprise a computer, server, mainframe host, terminals, personal computer, any kind of mobile computing devices, and the like, or a combination thereof. The image acquirer may be communicatively coupled to the signal electron detector through a medium such as an electrical conductor, optical fiber cable, portable storage media, IR, Bluetooth, internet, wireless network, wireless radio, among others, or a combination thereof. The image acquirer may receive a signal from the signal electron detector and may construct an image. The image acquirer may thus acquire images of regions of the sample. The image acquirer may also perform various post-processing functions, such as image filtering, determining gray level values, generating contours, superimposing indicators on an acquired image, and the like. The image acquirer may be configured to perform adjustments of brightness and contrast, among other things, of acquired images. In some embodiments, the storage may be a storage medium such as a hard disk, flash drive, cloud storage, random access memory (RAM), other types of computer readable memory, and the like. The storage may be coupled with the image acquirer and may be used for saving scanned raw image data as original images, and post-processed images.

Adjusting the power density of the optical beam may cause a variation in the characteristic of the secondary charged-particles generated from the first region of the sample, including a change in their trajectory, energy, or an intensity.

In step 1840, multiple images of a region of interest such as a structure, a feature of a semiconductor device, a semiconductor device, a circuit, or components of a circuit, may be acquired using an image acquisition system. Multiple images may be sequentially captured with or without a time delay between consecutive images. For example, if a first image is acquired at time t1 and a second image is acquired at time t2, the time delay or the time interval is (t2−t1) seconds. In some embodiments, the time delay may be adjustable in a range from 1 millisecond (ms) to 1 nanosecond (ns).

In step 1850, a characteristic of a structure may be determined based on a gray level variation of the plurality of images of the first region of the sample or a plurality of images of the feature in the first region. The gray level values and their variation may be utilized to determine electrical characteristics such as resistance or capacitance, or to determine and identify a defect in the sample. The defect may be a physical defect causing a change in electrical characteristics or an electrical defect.

Figure 19:
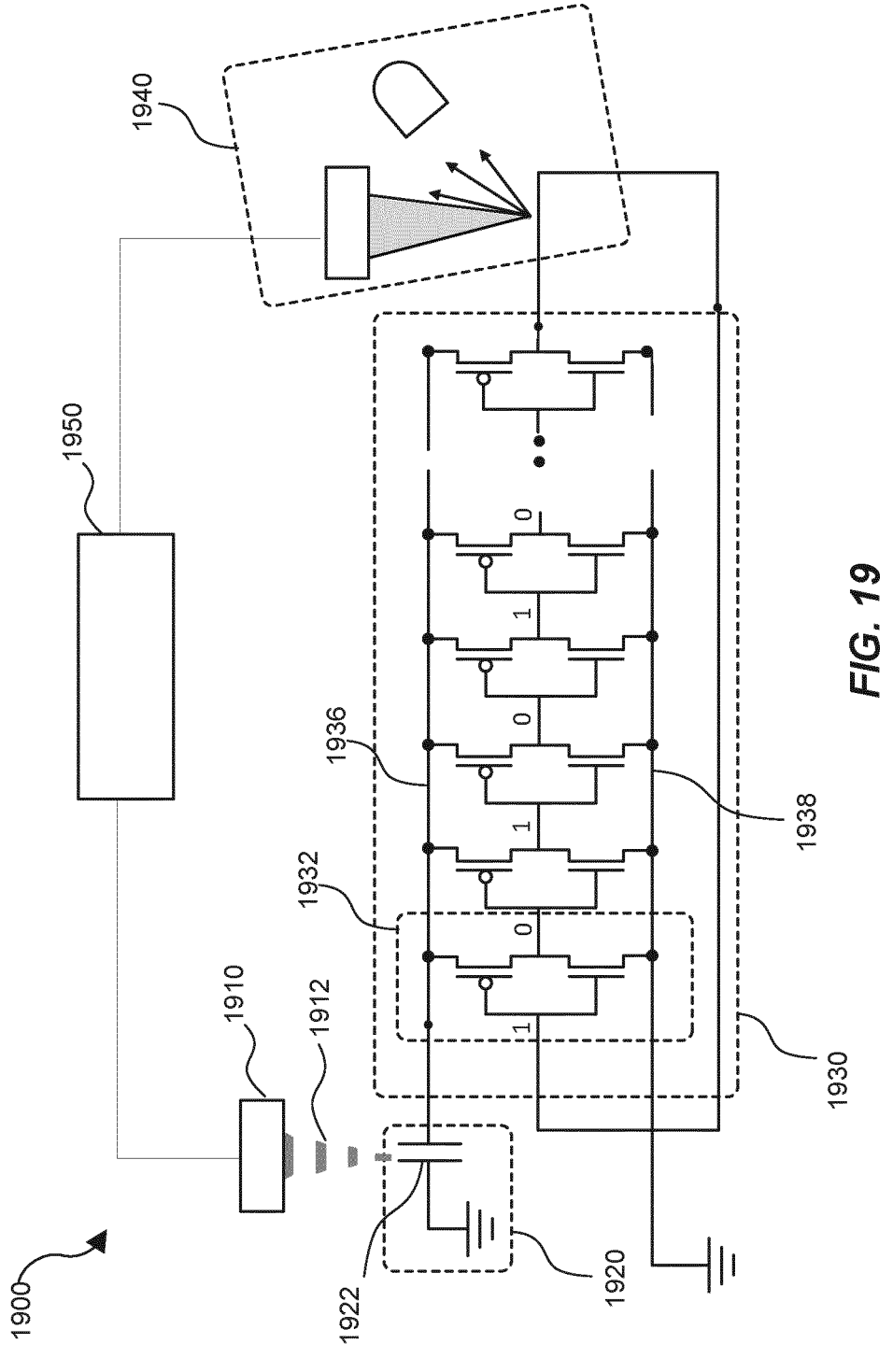
FIG. 19 is a schematic illustration of an exemplary apparatus for defect detection using voltage-contrast (VC) techniques, consistent with embodiments of the present disclosure.

Reference is now made to FIG. 19, which is a schematic illustration of an exemplary apparatus 1900 for defect detection using voltage-contrast (VC) techniques, consistent with embodiments of the present disclosure. Apparatus 1900 may include a particle source 1910 configured to generate a particle beam 1912, a power source 1920 associated with a test structure 1930, a charged-particle beam apparatus 1940, and a controller 1950. Though not illustrated, apparatus 1900 may include fewer or more components, as appropriate.

In some embodiments, particle source 1910 may comprise an optical source, a charged-particle source, or an uncharged particle source. In some embodiments, particle source 1910 may be an optical source (e.g., a laser) substantially similar to optical source 320 of FIG. 3 and may perform substantially similar functions. In some embodiments, particle source 1910 may be an optical source configured to generate a pulsed optical beam comprising a plurality of pulses, each pulse of the plurality of pulses may be represented by a pulse waveform having a pulse width, a pulse frequency, a pulse energy, and a pulse repetition rate, among other characteristics. The photons of the optical beam may have a characteristic wavelength, a characteristic frequency, or characteristic energy. In some embodiments, optical source may be a femtosecond laser source configured to generate ultrashort optical pulses having a pulse width of less than 1 picosecond. It is to be appreciated that the optical source may be configured to generate a continuous optical beam as well.

In some embodiments, particle source 1910 may comprise a charged-particle source (e.g., an electron source) substantially similar to electron source of FIG. 2 and may perform substantially similar functions. The electron source may be configured to generate a pulsed electron beam or a continuous electron beam. Pulsed electron beam may comprise a plurality of ultrashort electron pulses (~pulse duration 100 femtoseconds) generated by illuminating a photocathode with femtosecond laser pulses, or by chopping a continuous electron beam using a fast blanker such as a microwave cavity, and an aperture. In some embodiments, particle source 1910 may comprise an electron source separate from a primary electron source of charged-particle beam apparatus 1940.

Apparatus 1900 may include power source 1920 associated with test structure 1930 and configured to receive energy from particle source 1910. In some embodiments, power source 1920 may comprise a capacitor, which upon receiving energy from particle source 1910, may store the charge and provide power to test structure 1930, as desired.

In some embodiments, test structure 1930 may comprise a ring oscillator or a closed-loop ring oscillator having a plurality of inverters 1932 connected in series to form a closed loop with positive feedback. Test structure 1930 may comprise an odd number of inverters 1932 and the output of the last inverter may be fed back into the first inverter, forming a closed loop. It is to be appreciated that a ring oscillator circuit is an exemplary test structure and other electrical test structures may be used as well. As illustrated in FIG. 19, test structure 1930 includes plurality of inverters 1932 connected input-to-output. For example, inverter 1932 comprises a P-type metal oxide semiconductor field effect transistor (PMOSFET) connected to positive power Vdd line 1936 and an N-type metal oxide semiconductor field effect transistor (NMOSFET) connected to ground Vss line 1938. The PMOSFET and the NMOSFET are connected to each other gate-to-gate and drain-to-drain. The drain-to drain connection is the output of the inverter and the gate-to-gate connection is the input of the inverter. It is to be appreciated that although test structure 1930 comprises a ring oscillator configured to detect defects based on the oscillation frequency, other test structures may comprise other circuitry or electrical devices to measure, for example, discharge time of a memory device using capacitors, delays of metal interconnects, transient voltage contrasts to detect electrical defects, etc.

In some embodiments, power may be supplied to Vdd line 1936 via the capacitor of power source 1920. The capacitor output may be connected to an input of inverter 1932 of test structure 1930. In some embodiments, power may be supplied to Vdd line 1936 directly from particle source 1910 (e.g., a laser source or an electron source) to excite the electrons and activate the ring oscillator. FIG. 19 illustrates a ring oscillator without a fault, so when a high voltage signal (1) is applied to the gate of the first inverter, the first inverter outputs a low voltage signal (0). The next inverter in the circuit outputs a high voltage signal (1), and each subsequent inverter outputs an alternating voltage signal level (e.g., 0, 1, 0, 1 . . . ). The closed loop ring oscillator comprises an odd number of inverters so that the input signal to the first inverter in two consecutive cycles is different. For example, in a 3-inverter ring oscillator, if the input signal to the first inverter is a high voltage signal (1) in the first cycle, the output of the third inverter is a low voltage signal (0), which is fed back into the first inverter as the input signal. Therefore, the output of the third inverter changes in every cycle, resulting in oscillations. The frequency with which the oscillations occur may determine the overall performance of the ring oscillator or of a test structure associated with the circuitry in the die.

In some embodiments, if one of the inverters in a ring oscillator is faulty, then the output voltage signal may not change from a 0 to 1 (or, in an alternative case from 1 to 0). For example, if the second inverter in a 3-inverter ring oscillator is faulty, and if a low voltage signal (0) is applied to the first inverter, either directly from particle source 1910 or via the capacitor of power source 1920, the first inverter may output a high voltage signal (1) and the second inverter may also output a high voltage signal (1). Since the output of the first and the second inverters is same, the fault may be readily detected and isolated by detecting two bright spots immediately adjacent in an image generated by a charged-particle beam apparatus such as a SEM operated in the voltage-contrast mode.

Apparatus 1900 may further include charged-particle beam apparatus 1940 configured to be operable in a voltage-contrast setting. In some embodiments, charged-particle beam apparatus 1940 may comprise an electron beam inspection tool substantially similar to electron beam tool 40 of FIG. 2 and may perform substantially similar functions. Charged-particle beam apparatus 1940 may be configured to generate a continuous beam of electrons to probe a region of the sample (e.g., sample 250 of FIG. 2) comprising test structure 1930 or a region of interest for defect detection. In some embodiments, though not illustrated in FIG. 19, charged-particle beam apparatus 1940 may be configured to generate a pulsed beam of electrons.

In some embodiments, a charged-particle detector of charged-particle beam apparatus 1940 may comprise a secondary electron detector substantially similar to electron detector 244 of FIG. 2 or electron detector 306A of FIG. 3 and may perform substantially similar functions. In some embodiments, secondary electron detector of charged-particle beam apparatus 1940 may have a read-out frequency of 1 GHz or less, or 900 MHz or less, or 800 MHz or less. In some embodiments, the read-out frequency of the secondary electron detector may be substantially equal to or higher than the oscillation frequency of test structure 1930 (e.g., ring oscillator). At a read-out frequency of 800 MHz (8×108 frames/second), the pixel dwell time of the secondary electron image is 1.25 nanoseconds (ns), and therefore, multiple frames may be captured to enhance the signal-to-noise ratio.

Apparatus 1940 may further include controller 1950 configured to communicate at least with particle source 1910 and secondary electron detector of charged-particle beam apparatus 1940. In some embodiments, controller 1950 may be an integral part of charged-particle beam apparatus 1940. In some embodiments, controller 1950 may be substantially similar to controller 50 of FIG. 2 and may perform substantially similar functions, in addition to performing communicating with particle source 1910 and secondary electron detector of charged-particle beam apparatus 1940.

Currently existing techniques to measure electrical performance characteristics of dies on a semiconductor wafer may be inaccurate, partly because they may not be designed to test representative parts of a die. For example, the test structures in the scribe lines are located away from the device structures on the die. One of several challenges in fabrication of wafers is the non-uniformity in process conditions across the wafer, which may result in inconsistent device characteristics. Therefore, the performance characteristics of a device may vary based on the location of the device on the wafer or location of the device within a die. Further, in existing techniques, the tests may be performed too infrequently, or the tests may be performed towards the end of the production, or the probe pads physically contacting the device pads may damage the surface of the contact pads, among other issues. Therefore, it may be desirable to measure, using contactless probing, the electrical device characteristics based on test structures within the die, and to perform these tests more frequently, while maintaining the yield and overall throughput. The proposed methods and systems may enable, among other things, contactless probing of electrical test structures to determine device characteristics early in the fabrication process, prior to the first metallization step.

As illustrated in FIG. 19, an exemplary in-die test structure may comprise a ring oscillator having an odd number of inverters connected in series output-to-input. The ring oscillator may be driven or activated using a pulsed particle beam 1912 generated by particle source 1910. The pulsed particle beam 1912 may comprise a pulsed optical beam (e.g., optical beam 322 of FIG. 3) or a pulsed electron beam. In some embodiments, the pulsed optical beam may be a pulsed laser beam comprising a plurality of pulses irradiating a region of the sample.

In some embodiments, the pulsed optical beam incident on the sample or on a ring oscillator fabricated on the sample, may generate photoelectrons and thereby create a driving voltage for electrically activating the ring oscillator such that it oscillates at an oscillation frequency. A charged-particle source (e.g., electron source) of charged-particle beam apparatus 1940 may be configured to generate a continuous primary electron beam having a low probe current. The primary electron beam may be incident on a region of the sample comprising test structure 1930 to generate secondary electrons therefrom. One or more characteristics of the generated secondary electrons such as, but not limited to, number of secondary electrons, trajectory, direction, or energy of the secondary electrons may vary based on the oscillating gate voltage. The probe current of the primary electron beam may be low such that the gate voltage of the transistors in an inverter of the ring oscillator is substantially unaffected.

Controller 1950 may be configured to apply a signal to particle source 1910 to cause particle source 1910 to generate a pulsed beam having a pulse frequency, a pulse duration, a pulse width, and a pulse intensity. In some embodiments, controller 1950 may be further configured to adjust a timing of the pulses of the particle beam and adjust a delay between consecutive pulses of the particle beam. Controller 1950 may be further configured to store information associated with the applied signal to particle source 1910, timing of the pulses, and delay between the pulses of the particle beam. In some embodiments, controller 1950 may be configured to store temporal information associated with the applied signal to particle source 1910 and with the oscillation of the ring oscillator.

In some embodiments, controller 1950 may be configured to apply a signal to the charged-particle detector of charged-particle beam apparatus 1940 to cause the charged-particle detector to detect secondary electrons generated by the interaction of primary electron beam and the sample. The signal applied to the charged-particle detector may be based on the temporal information associated with the signal applied to particle source 1910 and with the oscillation of the ring oscillator.

As described previously, because of the short pixel dwell times, multiple frames may be captured and averaged to enhance the signal-to-noise ratio of the VC-SEM images. In some embodiments, controller 1950 may apply a signal to the charged-particle detector such that the operation of the charged-particle detector is synchronized with the timing of the pulses of the particle beam. For example, in a first cycle (C1) of testing a no-fault ring oscillator, if an input voltage signal (V1) is applied to the gate of a first inverter (I1) at a time (t1), the input signal (V3) applied at a time (t3) to a third inverter (I3) may be similar to input voltage signal (V1), the input signal (V5) applied at a time (t5) to a fifth inverter may be similar to input voltage signal (V1), and so forth. In a ring oscillator comprising an odd number of inverters, the input voltages for inverters I(2n+1) may be similar (all high or all low), and the input voltage for inverters I2n may be similar and alternating voltage level (all low or all high). To avoid averaging out the gray level values associated with the high and the low input or output signals from multiple inverters, it may be desirable to determine the gray level values of I(2n+1) and I(2n) inverters based on their temporal information. The temporal information may comprise at least information associated with the timing, duration, delay between pulses, among other things.

In some embodiments, controller 1950 may be configured to adjust a signal applied to secondary electron detector based on the temporal information associated with the signal applied to particle source 1910 such that the detector may be triggered synchronous with the oscillation frequency of ring oscillator. In some embodiments, adjusting the signal applied to the secondary electron detector of charged-particle beam apparatus 1940 may comprise adjusting the timing of detection or initiation of detection of secondary electrons by the secondary electron detector to synchronize with the timing of the pulses of particle beam 1912 or oscillation of ring oscillator, or both.

In some embodiments, controller 1950 may be further configured to cause charged-particle beam apparatus 1940 to acquire a plurality of images of a region of the sample based on the temporal information associated with the oscillation of test structure 1930 (e.g., closed-loop ring oscillator) and determine an average gray level of the plurality of images of the region of the sample. An image acquisition system of charged-particle beam apparatus 1940 may be configured to capture images of test structure or a component of the test structure such as a contact pad of a transistor. In some embodiments, the read-out frequency of secondary electron detector may determine the number of frames to achieve a desirable signal-to-noise ratio (SNR) for defect identification. For example, if the read-out frequency of a secondary electron detector is 500 MHz, the pixel dwell time may be 2 ns, the number of frames to accumulate a high SNR may be fewer compared to a secondary electron detector with a higher read-out frequency with a smaller dwell time. However, a secondary electron detector with higher read-out frequency may be desirable in some applications to measure high frequency oscillations and high circuit speeds of complex semiconductor devices.

Figure 20:
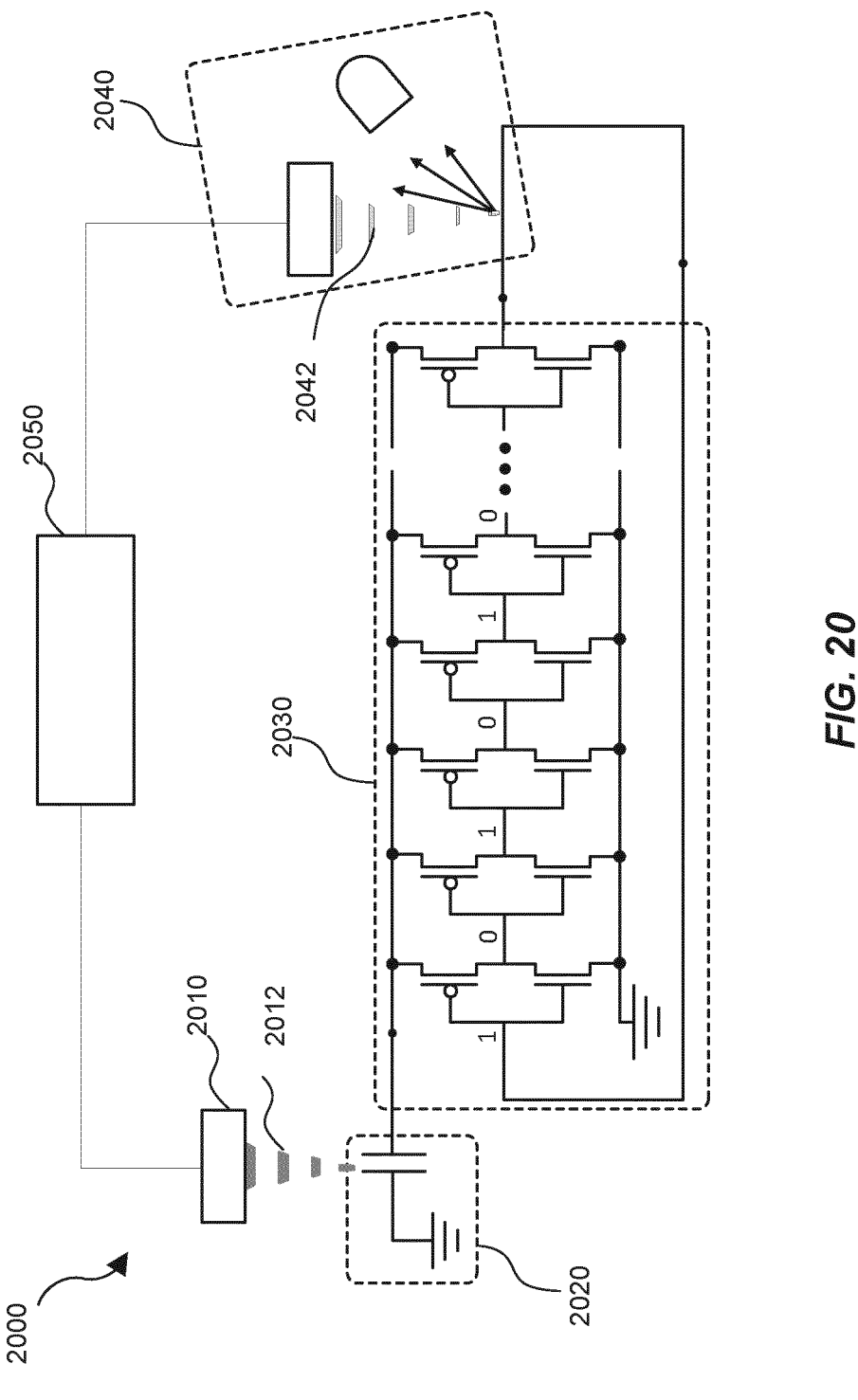
FIG. 20 is a schematic illustration of an exemplary apparatus for defect detection using voltage-contrast (VC) techniques, consistent with embodiments of the present disclosure.

Reference is now made to FIG. 20, which is a schematic illustration of an exemplary apparatus 2000 for defect detection using voltage-contrast (VC) techniques, consistent with embodiments of the present disclosure. Apparatus 2000 may include a particle source 2010 configured to generate a particle beam 2012, a power source 2020 associated with a test structure 2030, a charged-particle beam apparatus 2040 configured to generate a primary charged-particle beam 2042, and a controller 2050.

In some embodiments, the oscillation frequency of a test structure (e.g., test structure 2030) may be higher than the read-out frequency of a secondary electron detector. In such a scenario, the read-out frequency or the maximum operating frequency of a secondary electron detector may limit the detectability of secondary electrons generated from the sample. One of several ways to overcome this issue may include a pump-probe technique using a VC-SEM. The pump-probe technique may include "pumping" using a pulsed particle beam such as a pulsed laser beam, energy either via power source 2020 or directly, into test structure 2030, thus activating the test structure (e.g., closed-loop ring oscillator), and "probing" the structure using a pulsed primary charged-particle beam 2042, such that a pulse width of a pulse of the pulsed charged-particle beam 2042 (e.g., pulsed electron beam) is shorter than the maximum operating frequency of a secondary electron detector.

In some embodiments, the pump-probe technique may further include capturing, using the pulsed electron beam, a voltage state of the ring oscillator at a time interval t1 and a time delay td1 between the timing of the pulsed laser beam and the timing of the pulsed electron beam. In some embodiments, capturing the voltage state of a ring oscillator may include acquiring one or more images of the inverter of the ring oscillator in the sample region being inspected, and determining the voltage state of the ring oscillator based on the gray level of the captured image. In a no-fault ring oscillator, because the voltage state of an inverter is designed to oscillate between a high and a low level in consecutive cycles, the temporal information associated with the pulsed laser beam may be used to determine the timing of the pulses of the pulsed electron beam. For example, in the first cycle C1, a first inverter may be applied a high input voltage signal (1) at a time t1, and in the second cycle C2, the first inverter may be applied an alternating low input voltage signal (0) at a time t2, with a time delay td1 between t1 and t2. (td1=t2− t1), and in the third cycle C3, the first inverter may again be applied a high input voltage signal (1) at a time t3. In some embodiments, controller 2050 may be configured to adjust the signal to charged-particle source such that the timing of the pulsed electron beam is synchronous with the timing t1 and t3 when the inverter is at the same voltage state. After adequate signal may be obtained, by capturing multiple images, to identify the voltage state of an inverter, the time delay between the pulsed laser beam and the pulsed electron beam may be adjusted to capture a voltage state of the adjacent or next inverter. This synchronicity based on temporal information associated with the pulsed laser beam and the pulsed electron beam may enable measurement of oscillation frequencies higher than the maximum operation frequency of the secondary electron detector.

In some embodiments, the pump-probe technique may further enable the use of a "slow" detector (maximum operating frequency ~800 MHz) to measure high oscillation frequencies of a test structure (e.g., test structure 2030). This may be enabled because the probe beam, typically an electron beam in a SEM, may be adjusted based on the temporal information associated with a pulsed optical beam used to activate the test structure, while the secondary electron detector is maintained at an activated (ready to detect) or the detection state to continuously integrate the secondary electron signals during the inspection.

Figure 21:
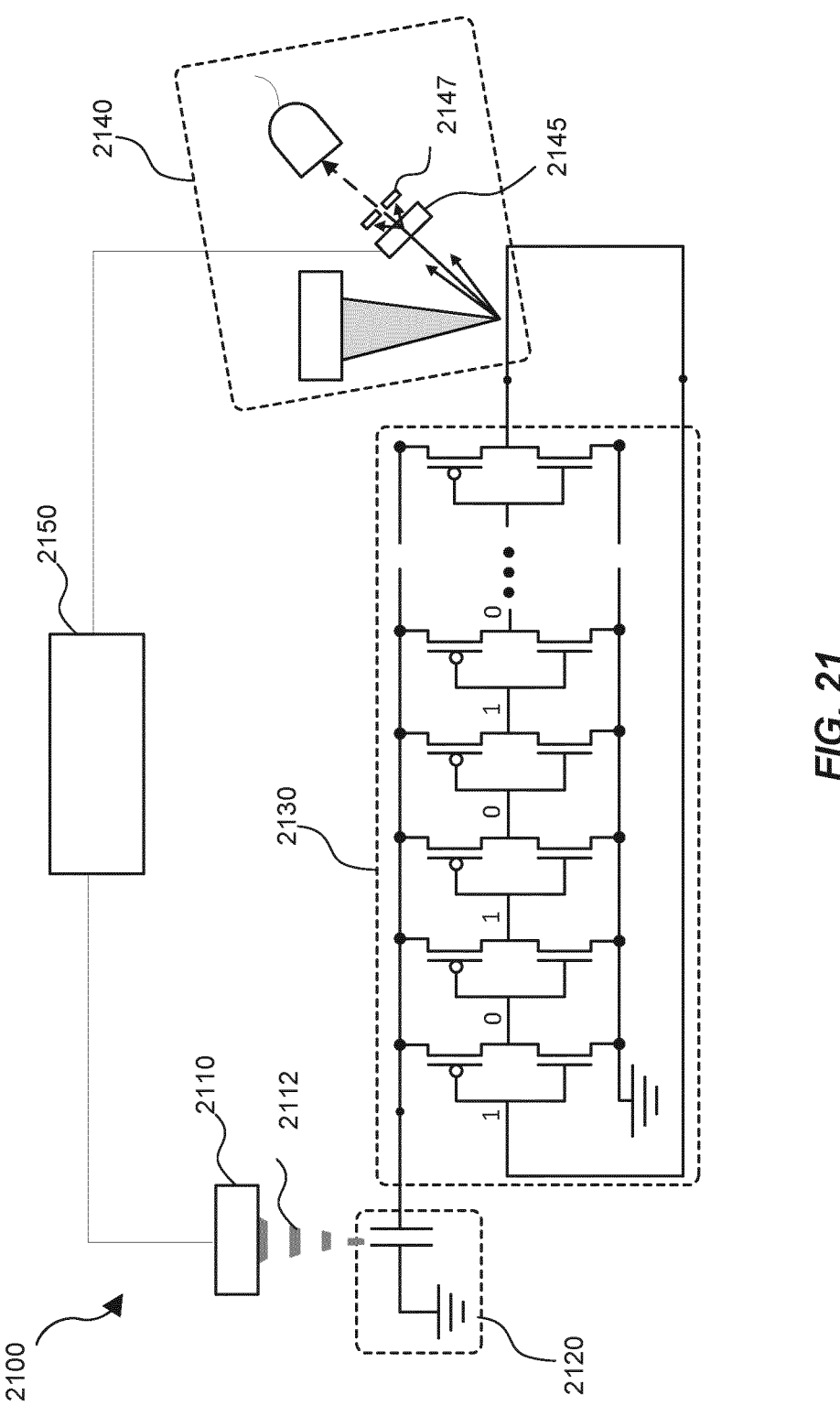
FIG. 21 is a schematic illustration of an exemplary apparatus for defect detection using voltage-contrast (VC) techniques, consistent with embodiments of the present disclosure.

In some embodiments, to measure extremely fast oscillation frequencies and high circuit speeds, the pump-probe technique may include a pulsed pump beam and a continuous probe beam, as illustrated in FIG. 21, which is a schematic illustration of an exemplary apparatus 2000 for defect detection using voltage-contrast (VC) techniques, consistent with embodiments of the present disclosure. Apparatus 2100 may include a particle source 2110 configured to generate a particle beam 2112, a power source 2120 associated with a test structure 2130, a charged-particle beam apparatus 2140 comprising a deflector 2145, and a controller 2150. The pulsed pump beam may include a pulsed optical beam (e.g., pulsed laser beam) or a pulsed electron beam, and the continuous probe beam may comprise a continuous primary electron beam (e.g., primary electron beam of a SEM).

In some embodiments, charged-particle beam apparatus 2140 may include deflector 2145 configured to modify, prior to being detected by a secondary electron detector, a characteristic of the secondary electrons generated by an interaction between the continuous primary electron beam and a region of the sample comprising a portion of test structure 2130. In some embodiments, modifying a characteristic may include generating a plurality of pulses of the secondary electron beam. In some embodiments, controller 2150 may be configured to synchronize deflector 2145 with the pulsed optical beam (e.g., pulsed particle beam 2112). Deflector 2145 may be further configured to streak the incoming secondary electron beam over an aperture 2147, such that multiple pulses of the secondary electrons are generated. In some embodiments, deflector 2145 may comprise a microwave cavity having a resonance frequency of 3 GHz. It is to be appreciated that other deflector structures may be used as well, as appropriate.

In some embodiments, secondary electron detector may be configured to detect one or more of the multiple pulses of the secondary electrons. In some embodiments, based on the temporal information associated with the pulsed optical beam or the oscillation of test structure 2150 (e.g., closed-loop ring oscillator), controller 2150 may adjust the deflection timing and speed of deflector 2145. In some embodiments, secondary electron detector may comprise a pixelated detector. The detection resolution, in some embodiments, may vary based on a distance between aperture 2147 and secondary electron detector, size of an aperture, among other things. In some embodiments, aperture 2147 may comprise a plurality of apertures varying in size. Aperture 2147 may be disposed between deflector 2145 and secondary electron detector. In some embodiments, deflector 2145, aperture 2147, and secondary electron detector may be aligned along a secondary optical axis.

In some embodiments, defects in a test structure (e.g., test structures 1930, 2030, or 2130 of FIGS. 19, 20, and 21, respectively) or a faulty behavior of the test structure may be identified by adjusting a voltage signal applied to the test structure. For example, adjusting the voltage signal applied to power line Vdd (e.g., power Vdd line 1936 of FIG. 19) of the test structure may create an imbalance in the transistor switching speed, causing the ring oscillator circuit to fail. In some embodiments, the voltage signal applied to the test structure may be adjusted by, for example, adjusting the particle source (e.g., optical source or electron source) configured to charge a capacitor (e.g., capacitor 1922 of FIG. 19) of power source (e.g., power source 1920 of FIG. 19). In some embodiments, the variable voltage signal applied to the test structure may be used in combination with one or more of the frequency measurement schemes illustrated in and described with reference to FIGS. 19, 20 and 21, to identify a defect based on the measured frequency of a test structure and associated gray levels in a secondary electron image.

Reference is now made to FIG. 22, which illustrates a process flow chart representing an exemplary method 2200 of identifying a defect in a sample, consistent with embodiments of the present disclosure. Some functions of method 2200 may be performed by a controller (e.g., controller 1950 of apparatus 1900, as shown in FIG. 19). The controller may be programmed to perform one or more steps of method 2200. For example, the controller may apply an electrical signal to activate a particle source, a charged-particle detector, or carry out other functions.

In step 2210, a particle source (e.g., particle source 1910 of FIG. 19) may generate a particle beam (e.g., particle beam 1912 of FIG. 19) comprising a plurality of pulses, each pulse of the plurality of pulses may be represented by a pulse waveform having a pulse width, a pulse frequency, a pulse energy, and a pulse repetition rate, among other characteristics. In some embodiments, the particle source may be an optical source (e.g., a laser) substantially similar to optical source 320 of FIG. 3 and may perform substantially similar functions. The photons of the optical beam may have a characteristic wavelength, a characteristic frequency, or characteristic energy. In some embodiments, optical source may be a femtosecond laser source generating ultrashort optical pulses having a pulse width of less than 1 picosecond. The pulsed particle beam may be configured to supply energy to a test structure (e.g., test structure 1930 of FIG. 19) through a power source (e.g., power source 1920 of FIG. 19). The power source may comprise a capacitor, which upon receiving energy from the particle source, may store the charge and provide power to the test structure, as desired.

In step 2220, a charged-particle source such as an electron source may be activated to generate a continuous primary electron beam (e.g., primary electron beam 204 of FIG. 2). For example, the electron source may be controlled to emit primary electrons to form an electron beam along a primary optical axis. The electron source may be activated remotely, for example, by using a software, an application, or a set of instructions for a processor of a controller to power the electron source through a control circuitry. The primary electron beam may be directed through an electron beam tool (e.g., electron beam tool 1240 of FIG. 12) to be incident on a surface of a sample (e.g., sample 315 of FIG. 3), forming a probe spot. Upon interaction with the sample, the primary electron beam may generate a plurality of signal electrons such as secondary electrons, backscattered electrons, or auger electrons, among other charged-particles. The primary electron beam may be incident on the region of the sample comprising the test structure.

In step 2230, an electron detector (e.g., charged-particle detectors 306A and 306B of FIG. 3) may detect the signal electrons comprising the secondary electrons generated from the sample. The electron detector may comprise one or more detectors. An image may be formed based on the signal detected by the electron detector. The EBI apparatus may comprise an image processing system (e.g., image processing system 1260 of FIG. 12) comprising an image acquisition mechanism (e.g., image acquisition mechanism 1270 of FIG. 12), an image processor (e.g., image processor 1280 of FIG. 12) and a storage mechanism (e.g., storage mechanism 1290 of FIG. 12). The image acquirer may also perform various post-processing functions, such as image filtering, determining gray level values, generating contours, superimposing indicators on an acquired image, and the like. The image acquirer may be configured to perform adjustments of brightness and contrast, among other things, of acquired images. In some embodiments, the storage may be a storage medium such as a hard disk, flash drive, cloud storage, random access memory (RAM), other types of computer readable memory, and the like. The storage may be coupled with the image acquirer and may be used for saving scanned raw image data as original images, and post-processed images.

In step 2240, a controller having circuitry (e.g., controller 1950 of FIG. 19) may apply a signal to the particle source to generate the pulsed beam. The signal may include information associated with a timing of the plurality of pulses, pulse width, delay between pulses, and other temporal information. In some embodiments, the controller may adjust a timing of the pulses of the particle beam and adjust a delay between consecutive pulses of the particle beam, store information associated with the applied signal to particle source such as, but not limited to, timing of the pulses, and delay between the pulses of the particle beam. In some embodiments, the controller may store temporal information associated with the applied signal to the particle source.

In step 2250, the controller may apply a signal to the secondary electron detector based on the temporal information associated with the signal applied to the particle source. Because of the short pixel dwell times in the secondary electron detector operating at 800 MHz, multiple frames may be captured and averaged to enhance the signal-to-noise ratio of the VC-SEM images. To avoid averaging out the gray level values associated with the high and the low input or output signals from multiple inverters, it may be desirable to determine the gray level values of inverters $I(2n+1)$ (where $n=0, 1, 2, 3 \ldots$) in odd positions and inverters $I(2n)$ (where $n=1, 2, 3 \ldots$) in even positions in a ring oscillator, based on their temporal information. The temporal information may comprise at least information associated with the timing, duration, delay between pulses, among other things. In some embodiments, the controller may apply a signal to the charged-particle detector such that the operation of the charged-particle detector is synchronized with the timing of the pulses of the particle beam. In the context of defect inspection, using an electron beam having a voltage contrast setting, the 0 may have a light shade in an image, and the 1 may have a dark shade in the image. Based on the location of the gray level values and temporal information, defects may be isolated. In some embodiments, weak defects or buried defects may be detected as well.

Reference is now made to FIG. 23, which illustrates a process flow chart representing an exemplary method 2300 of identifying a defect in a sample, consistent with embodiments of the present disclosure. Some functions of method 2300 may be performed by a controller (e.g., controller 2050 of apparatus 2000, as shown in FIG. 20). The controller may be programmed to perform one or more steps of method 2300. For example, the controller may apply an electrical signal to activate a particle source, a charged-particle detector, or carry out other functions.

In step 2310, a particle source (e.g., particle source 2010 of FIG. 20) may generate a particle beam (e.g., particle beam 2012 of FIG. 20) comprising a plurality of pulses, each pulse of the plurality of pulses may be represented by a pulse waveform having a pulse width, a pulse frequency, a pulse energy, and a pulse repetition rate, among other characteristics. In some embodiments, the particle source may be an optical source (e.g., a laser) substantially similar to optical source 320 of FIG. 3 and may perform substantially similar functions. The pulsed particle beam may be configured to supply energy to a test structure (e.g., test structure 2030 of FIG. 20) through a power source (e.g., power source 2020 of FIG. 20). The power source may comprise a capacitor, which upon receiving energy from the particle source, may store the charge and provide power to the test structure, as desired.

In step 2320, a charged-particle source such as an electron source may be activated to generate a pulsed primary electron beam. Upon interaction with the sample, the primary electron beam may generate a plurality of signal electrons such as secondary electrons, backscattered electrons, or auger electrons, among other charged-particles. The primary electron beam may be incident on the region of the sample comprising the test structure. The generated electron beam may be a pulsed, low-probe current electron beam.

In step 2330, a controller (e.g., controller 2050 of FIG. 20) may adjust the timing of application of the signal to the pulsed particle beam source and the pulsed electron beam source such that there is a time delay between the two signals. If an oscillation frequency of a test structure (e.g., test structure 2030 of FIG. 20) is higher than the read-out frequency of a secondary electron detector, a pump-probe technique for defect detection may be desirable. The pump-probe technique includes "pumping" using a pulsed particle beam such as a pulsed laser beam, energy either via a power source (e.g., power source 2020 of FIG. 20) or directly into the test structure, thus activating the test structure (e.g., closed-loop ring oscillator), and "probing" the structure using a pulsed primary electron beam (e.g., pulsed primary charged-particle beam 2042 of FIG. 20), such that a pulse width of a pulse of the pulsed electron beam is shorter than the maximum operating frequency of a secondary electron detector.

Reference is now made to FIG. 24, which illustrates a process flow chart representing an exemplary method 2400 of identifying a defect in a sample, consistent with embodiments of the present disclosure. Some functions of method 2400 may be performed by a controller (e.g., controller 2150 of apparatus 2100, as shown in FIG. 21). The controller may be programmed to perform one or more steps of method 2400. For example, the controller may apply an electrical signal to activate a particle source, a charged-particle detector, or carry out other functions.

In step 2410, the controller may apply a signal to a particle source (e.g., particle source 2110 of FIG. 21) to generate a particle beam (e.g., particle beam 2112 of FIG. 21) comprising a plurality of pulses, each pulse of the plurality of pulses may be represented by a pulse waveform having a pulse width, a pulse frequency, a pulse energy, and a pulse repetition rate, among other characteristics. In some embodiments, the particle source may be an optical source (e.g., a laser) substantially similar to optical source 320 of FIG. 3 and may perform substantially similar functions. The pulsed particle beam may be configured to supply energy to a test structure (e.g., test structure 2130 of FIG. 21) including a ring oscillator, through a power source (e.g., power source 2120 of FIG. 21). The power source may comprise a capacitor, which upon receiving energy from the particle source, may store the charge and provide power to the test structure, as desired.

In step 2420, the controller may apply a signal to a charged-particle source such as an electron source to generate a continuous low-probe current primary electron beam. Upon interaction with the sample, the primary electron beam may generate a plurality of signal electrons such as secondary electrons, backscattered electrons, or auger electrons, among other charged-particles. The primary electron beam may be incident on the region of the sample comprising the test structure. The generated electron beam may be a pulsed, low-probe current electron beam.

In step 2430, the controller may adjust the timing of application of the signal to the pulsed particle beam source and the pulsed electron beam source such that there is a time delay between the two signals. If an oscillation frequency of a test structure is higher than the read-out frequency of a secondary electron detector, a pump-probe technique for defect detection may be desirable. The pump-probe technique may include capturing, using the pulsed electron beam, a voltage state of the ring oscillator at a time interval t1 and a time delay td1 between the timing of the pulsed laser beam and the timing of the pulsed electron beam. In some embodiments, capturing the voltage state of a ring oscillator may include acquiring one or more images of the inverter of the ring oscillator in the sample region being inspected, and determining the voltage state of the ring oscillator based on the gray level of the captured image. In a no-fault ring oscillator, because the voltage state of an inverter is designed to oscillate between a high and a low level in consecutive cycles, the temporal information associated with the pulsed laser beam may be used to determine the timing of the pulses of the pulsed electron beam. For example, in the first cycle C1, a first inverter may be applied a high input voltage signal (1) at a time t1, and in the second cycle C2, the first inverter may be applied an alternating low input voltage signal (0) at a time t2, with a time delay td1 between t1 and t2. (td1=t2−t1), and in the third cycle C3, the first inverter may again be applied a high input voltage signal (1) at a time t3. In some embodiments, controller 2050 may be configured to adjust the signal to charged-particle source such that the timing of the pulsed electron beam is synchronous with the timing t1 and t3 when the inverter is at the same voltage state. After adequate SNR is obtained to identify the voltage state of an inverter, by capturing multiple images, the time delay between the pulsed laser beam and the pulsed electron beam may be adjusted to capture a voltage state of the adjacent or next inverter. This synchronicity based on temporal information associated with the pulsed laser beam and the pulsed electron beam may enable measurement of oscillation frequencies higher than the maximum operation frequency of the secondary electron detector.

In step 2440, a secondary electron detector may detect the secondary electrons generated by the interaction of the pulses of the primary electron beam with the test structure disposed on the sample. Secondary electron detector may comprise a deflector (e.g., deflector 2145 of FIG. 21) to modify, prior to being detected by a secondary electron detector, a characteristic of the secondary electrons. In some embodiments, modifying a characteristic may include generating a plurality of pulses of the secondary electron beam. The controller may synchronize the activation of the deflector with the pulsed optical beam. The deflector may further streak the incoming secondary electron beam over an aperture (e.g., aperture 2147 of FIG. 21), such that multiple pulses of the secondary electrons are generated. In some embodiments, the deflector may comprise a microwave cavity having a resonance frequency of 3 GHz. It is to be appreciated that other deflector structures may be used as well, as appropriate.

As the density and complexity of IC chips increases to meet the performance expectations, testing the complementary metal-oxide semiconductor (CMOS) circuits using conventional imaging and electrical tests may be inadequate and/or inefficient. In particular, as available, testing the field-effect transistors (FETs) may involve either testing test structures on the scribe lines, or early in the fabrication process, or probe card testing which may be potentially destructive for the features of the device used as contact pads. Therefore, it may be desirable to inspect test structures more frequently, early in the fabrication process, and non-invasively, preferably contactless probing. In addition, it may be desirable to test multiple in-line test structures simultaneously to maintain the throughput and minimize the associated cost.

In the context of semiconductors and semiconductor devices, "hot" electrons refer to electrons having higher kinetic energy than an equilibrium value. Electrons can be heated by multiple means including, by an electric field, by optical excitation, or by injection through a heterojunction. The kinetic energy of an electron may be increased by accelerating it in an electric field or by simply heating the semiconductor. Hot electrons involved in transient current flows during transistor switching in CMOS circuits, typically emit short pulses of photons. These photons may be detected using an optical detector with spatial and temporal resolution to measure gate dynamics in high-speed CMOS circuit, observe gate delays in ring oscillators, or observe logic switching in circuits, among other things.

Figure 25:
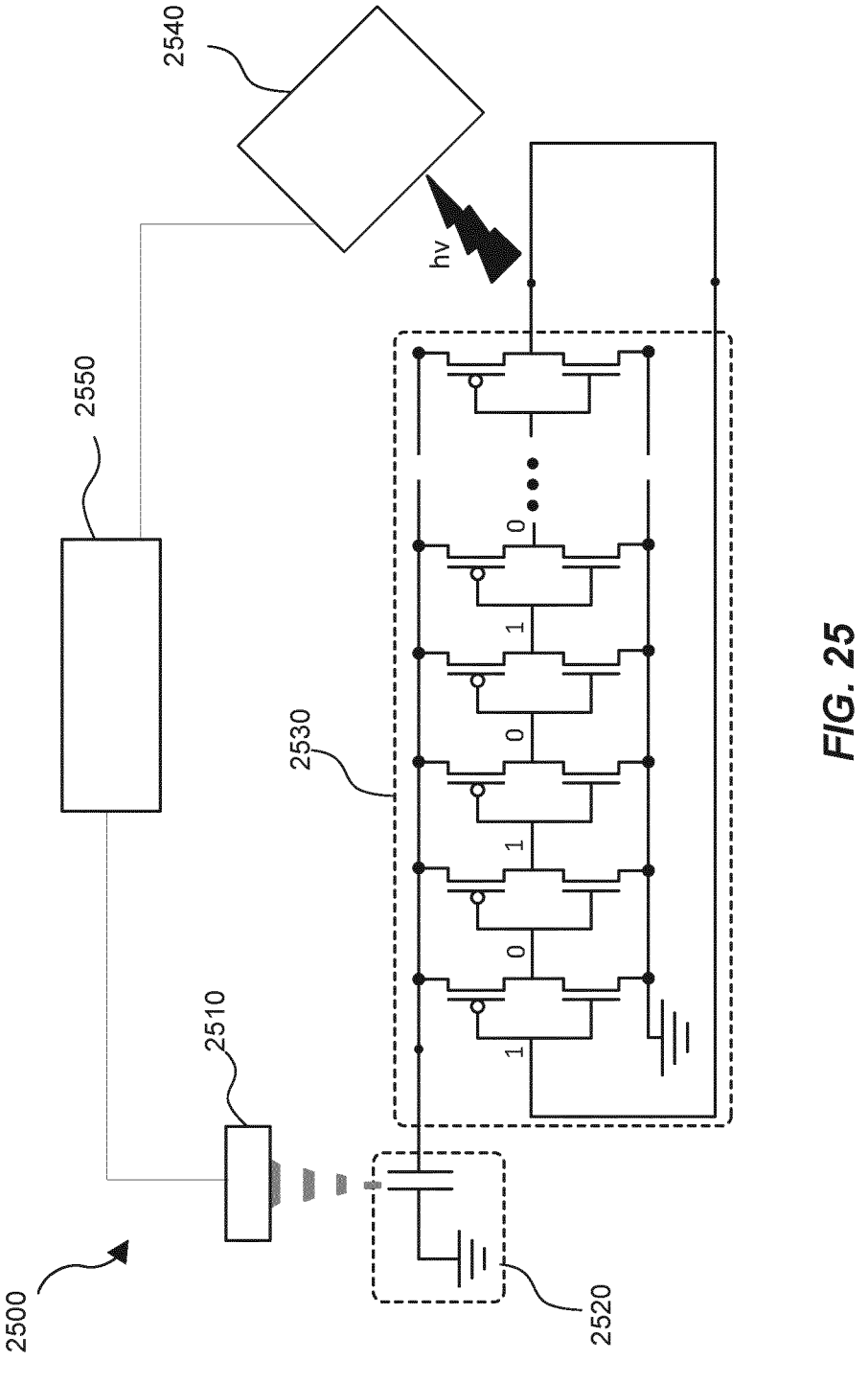
FIG. 25 is a schematic illustration of an exemplary apparatus for testing circuit functionality using a charged-particle beam apparatus, consistent with embodiments of the present disclosure.

Reference is now made to FIG. 25, which is a schematic illustration of an exemplary apparatus 2500 for defect detection using optical detection of hot electron luminescence, consistent with embodiments of the present disclosure. Apparatus 2500 may include a particle source 2510 configured to generate a particle beam 2512, a power source 2520 associated with a test structure 2530, an optical detector 2540 configured to measure short pulses of hot electron luminescence (photons), and a controller 2550. Though not illustrated, apparatus 2500 may include fewer or more components, as appropriate. In some embodiments, apparatus 2500 may comprise an electromagnetic energy detector comprising an antenna configured to detect antenna radiation emitted at the oscillation frequency of the test structure, or electromagnetic pulses.

In some embodiments, optical detector 2540 may comprise a silicon photodiode, a charge-coupled device (CCD), or near-infrared photomultipliers and imagers. Optical detector 2540 may be configured to detect photons emitted from hot electrons. In the context of non-invasive defect inspection using electrical test structures (e.g., test structure 2530), hot electron luminescence may be used in determining an oscillation frequency of the test structure such as a ring oscillator. When a gate of a CMOS transistor in an inverter switches its operation state, transient current may flow, and the transistor pair is briefly in saturation. The transient current may comprise a portion of charges that charge or discharge gate capacitances, and a parasitic portion that flows from power line Vdd to the ground line. The duration of the switching transient may be on the order of 100 picoseconds (ps), consistent with the pulse duration of photon emission from hot electrons.

In some embodiments, optical detector may comprise a photomultiplier having high spatial and temporal resolution to resolve photon timing of 100 ps or more. A gate-switching event in an inverter may emit sub-nanosecond pulses of photons, and the photon may be detected by optical detector 2540. The detected photon may be labeled with an arrival time or a detection timestamp and the temporal information associated with the oscillation of the ring oscillator may be recorded. Determining the oscillation frequency may further include integrating the detected signals over a period. The temporal information may further be used to inspect individual gates using time-resolved microscopy based on the presence or absence of a detected photon.

In some embodiments, spatial information including x-y coordinates of photon emission may be determined, for example, by using a multichannel analyzer. In some embodiments, the signal may be integrated, and the integration time may vary based on, but not limited to, size of the transistors, type of the transistors, supply voltage, resistance, or capacitance of the ring oscillator circuit.

Figure 26:
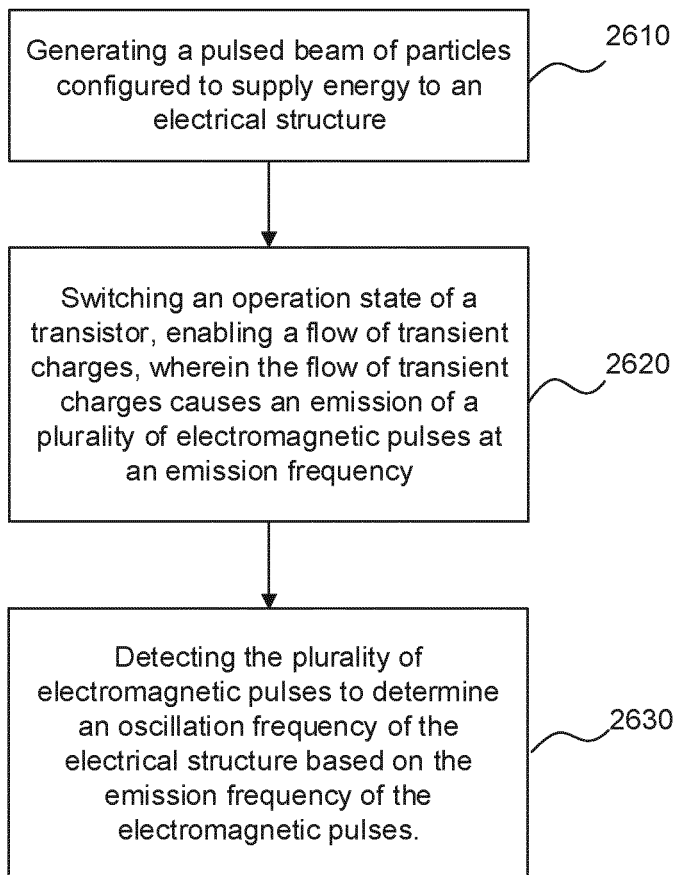
FIG. 26 is a process flowchart of an exemplary method of identifying a defect in a sample using the apparatus of FIG. 25, consistent with embodiments of the present disclosure.

Reference is now made to FIG. 26, which is a process flowchart representing an exemplary method 2600 of identifying a defect in a sample, consistent with embodiments of the present disclosure. Some functions of method 2600 may be performed by a controller (e.g., controller 2550 of apparatus 2500, as shown in FIG. 25). The controller may be programmed to perform one or more steps of method 2600. For example, the controller may apply an electrical signal to activate a particle source, an optical detector, or carry out other functions.

In step 2610, a particle source (e.g., particle source 2510 of FIG. 25) may generate a particle beam (e.g., particle beam 2512 of FIG. 25) comprising a plurality of pulses, each pulse of the plurality of pulses may be represented by a pulse waveform having a pulse width, a pulse frequency, a pulse energy, and a pulse repetition rate, among other characteristics. In some embodiments, the particle source may be an optical source (e.g., a laser) substantially similar to optical source 320 of FIG. 3 and may perform substantially similar functions. The photons of the optical beam may have a characteristic wavelength, a characteristic frequency, or characteristic energy. In some embodiments, the optical source may be a femtosecond laser source generating ultra-short optical pulses having a pulse width of less than 1 picosecond. In some embodiments, the pulsed particle beam may be a pulsed electron beam. The pulsed particle beam may be configured to supply energy to a test structure (e.g., test structure 2530 of FIG. 25) through a power source (e.g., power source 2520 of FIG. 25). The power source may comprise a capacitor, which upon receiving energy from the particle source, may store the charge and provide power to the test structure, as desired.

In step 2620, the power source may receive the energy from the pulsed laser beam or pulsed electron beam and supply the received energy to the test structure to activate the test structure. Activating the test structure may include supplying a voltage signal to switch an operation state of one or more transistors of the plurality of transistors of the test structure. For example, switching a gate of one or more transistors of the inverters in a ring oscillator. In some embodiments, switching the gate of a transistor may enable a flow of transient charges. The transient current pulses may comprise hot electrons, which may emit electromagnetic energy, typically photons. The photon emission may arise from intraband transitions (within conduction band) of hot electrons in the semiconductor. The photons may be emitted at an emission frequency and may have a characteristic photon wavelength and a pulse duration. The duration of the switching transient may be on the order of 100 picoseconds (ps), consistent with the pulse duration of photon emission from hot electrons.

In step 2630, an electromagnetic detector may detect the electromagnetic pulses generated by the transient current flow. The electromagnetic detector may be an optical detector such as a photomultiplier having high spatial and temporal resolution to resolve photon timing of 100 ps, a photocathode, a silicon photodiode, a charge-coupled device (CCD), or near-infrared photomultipliers and imagers. In some embodiments, the electromagnetic detector may comprise an antenna configured to detect antenna radiation emitted at the oscillation frequency of the test structure.

As an example, a gate-switching event in an inverter may emit sub-nanosecond pulses of photons, and the photon may be detected by the optical detector. The detected photon may be labeled with an arrival time or a detection timestamp and the temporal information associated with the oscillation of the ring oscillator may be recorded. Determining the oscillation frequency may further include integrating the detected signals over a period. The temporal information may further be used to inspect individual gates using time-resolved microscopy based on the presence or absence of a detected photon. In some embodiments, spatial information including x-y coordinates of photon emission may be determined, for example, by using a multichannel analyzer. In some embodiments, the signal may be integrated, and the integration time may vary based on, but not limited to, size of the transistors, type of the transistors, supply voltage, resistance, or capacitance of the ring oscillator circuit. The oscillation frequency of the test structure (e.g., ring oscillator) may be determined based on the emission frequency of the photons from the gate-switching of the transistors in the ring oscillator.

The embodiments may further be described using the following clauses:

1. A charged-particle beam apparatus comprising:
   a charged-particle source configured to generate a primary charged-particle beam along a primary optical axis;
   an optical source configured to generate a pulsed optical beam interacting with a sample, the interaction generating a first plurality of charged particles;
   a charged-particle detector configured to detect a second plurality of charged particles generated from a probe spot on the sample formed by the primary charged-particle beam and modified by interaction with a portion of the first plurality of charged particles; and
   a controller having circuitry configured to:
      apply a first signal to cause the optical source to generate the pulsed optical beam; and apply a second signal to the charged-particle detector to initiate the detection of the second plurality of charged particles.

2. The apparatus of clause 1, wherein the first plurality of charged particles comprises photoelectrons and the second plurality of charged particles comprises secondary electrons, backscattered electrons, or auger electrons.

3. The apparatus of any one of clauses 1 and 2, wherein the controller includes circuitry further configured to adjust the first signal to cause an adjustment of a characteristic of an excitation pulse of the pulsed optical beam.

4. The apparatus of clause 3, wherein the characteristic of the excitation pulse comprises an intensity, a width, a repetition rate, or a phase of the excitation pulse.

5. The apparatus of clause 4, wherein the width of the excitation pulse is adjustable and is in a range of 0.05 picoseconds (ps) to 1 nanosecond (ns).

6. The apparatus of any one of clauses 4 and 5, wherein the repetition rate of the excitation pulse is adjustable and is in a range of 100 kHz to 1 GHz.

7. The apparatus of any one of clauses 3-6, wherein the controller includes circuitry configured to adjust the second signal based on the characteristic of the excitation pulse, and wherein the second signal comprises a detection signal that enables detection of the second plurality of charged particles.

8. The apparatus of clause 7, wherein an adjustment of the second signal comprises an adjustment of a repetition rate, a width, or a phase of the detection signal.

9. The apparatus of any one of clauses 7 and 8, wherein the controller includes circuitry further configured to adjust a time delay between the excitation pulse and the detection signal to adjust a sensitivity of the second plurality of charged particles detected by the charged-particle detector.

10. The apparatus of clause 9, wherein an adjustment of the time delay comprises an adjustment of the phase of the detection signal.

11. The apparatus of clause 10, wherein the adjustment of the phase of the detection signal causes the detection signal and the excitation pulse to be out-of-phase with each other.

12. The apparatus of any one of clauses 1-11, wherein the optical source comprises a solid-state laser, a semiconductor laser, a gas laser, a dye laser, a chemical laser, a diode-pumped fiber laser, a gain-switched laser, or gain-switched laser diodes coupled with fiber amplifiers.

13. The apparatus of any one of clauses 1-12, wherein the pulsed optical beam comprises a pulsed laser beam having a photon wavelength in a range of 150 nm to 2 μm.

14. The apparatus of any one of clauses 1-13, wherein a noise associated with the pulsed optical beam is reduced using a technique comprising homodyne detection, heterodyne detection, lock-in amplification, or a combination thereof.

15. The apparatus of any one of clauses 1-14, wherein the controller comprises a synchronous digital circuit, a master clock, or a synchronous driver circuit.

16. The apparatus of any one of clauses 1-15, wherein the pulsed optical beam comprises a plurality of excitation pulses.

17. The apparatus of clause 16, wherein the controller includes circuitry configured to:
   apply the first signal to cause the optical source to generate the plurality of excitation pulses having a first frequency; and
   apply the second signal to the charged-particle detector, the second signal having a second frequency substantially similar to the first frequency.

18. The apparatus of clauses 1-17, wherein the controller includes circuitry further configured to apply a third signal to the charged-particle source to generate a pulsed charged-particle beam comprising a plurality of charged-particle pulses.

19. A charged-particle beam apparatus comprising:

a charged-particle source configured to generate a primary charged-particle beam along a primary optical axis;

an optical source configured to generate a pulsed optical beam comprising:

a first excitation pulse that generates a first portion of a first plurality of charged particles upon interaction with a sample surface; and a second excitation pulse that generates a second portion of the first plurality of charged particles upon interaction with the sample surface;

a charged-particle detector configured to detect a second plurality of charged particles generated from a probe spot on the sample surface formed by the primary charged-particle beam and modified by interaction with the first and the second portions of the first plurality of charged particles; and a controller having circuitry configured to:

adjust a first time delay between the first excitation pulse of the pulsed optical beam and a corresponding first detection pulse; and adjust a second time delay between the second excitation pulse of the pulsed optical beam and a corresponding second detection pulse, wherein the second time delay is different from the first time delay.

20. The apparatus of clause 19, wherein the controller includes circuitry configured to:

apply an excitation signal to cause the optical source to generate the first and the second excitation pulses having a first frequency; and apply a detection signal to the charged-particle detector, the detection signal comprising the corresponding first and second detection pulses having a second frequency different from the first frequency.

21. The apparatus of clause 20, wherein the first frequency is higher than the second frequency.

22. The apparatus of any one of clauses 20 and 21, wherein the controller includes circuitry configured to adjust the excitation signal to adjust a characteristic of an excitation pulse of the pulsed optical beam.

23. The apparatus of clause 22, wherein the characteristic of the excitation pulse comprises an intensity, a width, a repetition rate, or a phase of the excitation pulse.

24. The apparatus of clause 23, wherein the width of the excitation pulse is adjustable and is in a range of 0.05 picoseconds (ps) to 1 nanosecond (ns).

25. The apparatus of any one of clauses 23 and 24, wherein the repetition rate of the excitation pulse is adjustable and is in a range of 100 kHz to 1 GHz.

26. The apparatus of any one of clauses 20-25, wherein the controller includes circuitry configured to adjust the detection signal based on the excitation signal.

27. The apparatus of clause 26, wherein an adjustment of the detection signal comprises an adjustment of at least one of a repetition rate, a width, or a phase of the detection signal.

28. The apparatus of any one of clauses 19-27, wherein the first excitation pulse is out-of-phase with the corresponding first detection pulse and the second excitation pulse is out-of-phase with the corresponding second detection pulse.

29. The apparatus of any one of clauses 19-28, wherein the controller includes circuitry configured to:

adjust a first offset between a first repetition rate of the first detection pulse and a first repetition rate of the first excitation pulse; and adjust a second offset between a second repetition rate of the second detection pulse and a second repetition rate of the second excitation pulse, wherein absolute values of the first and the second offsets are different.

30. The apparatus of any one of clauses 19-29, wherein the optical source comprises a solid-state laser, a semiconductor laser, a gas laser, a dye laser, a chemical laser, a diode-pumped fiber laser, a gain-switched laser, or gain-switched laser diodes coupled with fiber amplifiers.

31. The apparatus of any one of clauses 19-30, wherein the pulsed optical beam comprises a pulsed laser beam having a photon wavelength in a range of 150 nm to 2 μm.

32. The apparatus of any one of clauses 19-31, wherein a noise associated with the pulsed optical beam is reduced using a technique comprising homodyne detection, heterodyne detection, lock-in amplification, or a combination thereof.

33. The apparatus of any one of clauses 19-32, wherein adjustment of the first and the second time delay enables determining a characteristic of a circuit component, the characteristic of the circuit component comprising a frequency response, a charge decay rate, a resistance, or a capacitance of the circuit component.

34. The apparatus of any one of clauses 19-33, wherein the first plurality of charged particles comprises photoelectrons and the second plurality of charged particles comprises secondary electrons, backscattered electrons, or auger electrons.

35. The apparatus of any one of clauses 19-34, wherein the controller comprises a synchronous digital circuit, a master clock, or a synchronous driver circuit.

36. The apparatus of any one of clauses 19-35, wherein the second time delay is longer than the first time delay.

37. The apparatus of any one of clauses 19-35, wherein the second time delay is shorter than the first time delay.

38. The apparatus of clauses 19-37, wherein the controller includes circuitry further configured to apply a control signal to the charged-particle source to generate a pulsed charged-particle beam comprising a plurality of charged-particle pulses.

39. A controller of a charged-particle beam apparatus, the controller comprising:

circuitry configured to:

apply a first signal to cause an optical source configured to generate a pulsed optical beam interacting with a sample, the interaction generating a first plurality of charged particles; and apply a second signal to a charged-particle detector configured to detect a second plurality of charged-particles generated from a probe spot on the sample formed by a primary charged-particle beam and modified by interaction with a portion of the first plurality of charged particles.

40. The controller of clause 39, further comprising circuitry configured to adjust the first signal to adjust a characteristic of an excitation pulse of the pulsed optical beam, the characteristic of the excitation pulse comprising an intensity, a width, a repetition rate, or a phase of the excitation pulse.

41. The controller of clause 40, further comprising circuitry configured to adjust the second signal based on at least one of the characteristics of the excitation pulse, the second signal comprising a detection signal.

42. The controller of clause 41, further comprising circuitry configured to adjust a time delay between the excitation pulse and the detection signal to adjust a sensitivity of the second plurality of charged particles detected by the charged-particle detector.

43. The controller of any one of clauses 39-42, wherein the circuitry comprises a synchronous digital circuit, a master clock, or a synchronous driver circuit.

44. The controller of any one of clauses 39-43, further comprising circuitry configured to:

apply the first signal to cause the optical source to generate a plurality of excitation pulses having a first frequency; and apply the second signal to the charged-particle detector, the second signal having a second frequency substantially similar to the first frequency.

45. The controller of any one of clauses 39-43, further comprising circuitry configured to apply a third signal to the charged-particle source to generate a pulsed charged-particle beam comprising a plurality of charged-particle pulses.

46. A controller of a charged-particle beam apparatus, the controller comprising:

a circuitry configured to:

adjust a first time delay between a first excitation pulse of a pulsed optical beam and a corresponding first detection pulse; and adjust a second time delay between a second excitation pulse of the pulsed optical beam and a corresponding second detection pulse, wherein the second time delay is different from the first time delay.

47. The controller of clause 46, further comprising circuitry configured to:

apply an excitation signal to cause an optical source to generate a pulsed optical beam comprising:

a first excitation pulse that generates a first portion of a first plurality of charged particles upon interaction with a sample surface; and a second excitation pulse that generates a second portion of the first plurality of charged particles upon interaction with the sample surface, the first and the second excitation pulses having a first frequency; and apply a detection signal to a charged-particle detector configured to detect a second plurality of charged particles generated from a probe spot on the sample surface formed by a primary charged-particle beam and modified by interaction with the first and the second portions of the first plurality of charged particles, wherein the detection signal comprises the corresponding first and second detection pulses having a second frequency different from the first frequency.

48. The controller of clause 47, further comprising circuitry configured to adjust the excitation signal to adjust a characteristic of an excitation pulse of the pulsed optical beam.

49. The controller of any one of clauses 47 and 48, further comprising circuitry configured to adjust the detection signal based on the excitation signal, wherein an adjustment of the detection signal comprises an adjustment of at least one of a repetition rate, a width, or a phase of the detection signal.

50. The controller of any one of clauses 46-49, further comprising circuitry configured to:

adjust a first offset between a first repetition rate of the first detection pulse and a first repetition rate of the first excitation pulse; and adjust a second offset between a second repetition rate of the second detection pulse and a second repetition rate of the second excitation pulse, wherein absolute values of the first and the second offsets are different.

51. The controller of any one of clauses 46-50, wherein the circuitry comprises a synchronous digital circuit, a master clock, or a synchronous driver circuit.

52. The controller of any one of clauses 46-51, comprising circuitry further configured to apply a control signal to the charged-particle source to generate a pulsed charged-particle beam comprising a plurality of charged-particle pulses.

53. A method for forming an image of a sample using a charged-particle beam apparatus comprising a charged-particle source, an optical source, a charged-particle detector, and a controller, the method comprising:

activating the charged-particle source to generate a primary charged-particle beam along a primary optical axis;

activating the optical source to generate a pulsed optical beam that interacts with the sample, the interaction generating a first plurality of charged particles;

applying, using the controller, a signal to the charged-particle detector to detect a second plurality of charged-particles generated from a probe spot on the sample formed by the primary charged-particle beam and modified by interaction with a portion of the first plurality of charged particles; and forming an image of the sample based on the detected second plurality of charged-particles.

54. The method of clause 53, further comprising applying, using the controller, an electrical signal to the optical source to generate the pulsed optical beam.

55. The method of clause 54, further comprising adjusting a characteristic of an excitation pulse of the pulsed optical beam by adjusting the electrical signal, the characteristic comprising an intensity, a width, a repetition rate, or a phase of the excitation pulse.

56. The method of clause 55, further comprising adjusting the width of the excitation pulse between 0.05 picoseconds (ps) to 1 nanosecond (ns).

57. The method of any one of clauses 55 and 56, further comprising adjusting the repetition rate of the excitation pulse between 100 kHz to 1 GHz.

58. The method of any one of clauses 55-57, further comprising adjusting the signal to the charged-particle detector based on at least one of the characteristic of the excitation pulse, the signal to the charged-particle detector comprising a detection signal.

59. The method of clause 58, wherein adjusting the detection signal comprises adjusting at least one of a repetition rate, a width, or a phase of the detection signal.

60. The method of any one of clauses 58 and 59, further comprising adjusting, using the controller, a time delay between the excitation pulse and the detection signal to adjust a sensitivity of the second plurality of charged particles detected by the charged-particle detector.

61. The method of clause 60, wherein adjusting the time delay comprises adjusting the phase of the detection signal such that the detection signal and the excitation pulse are out-of-phase with each other.

62. The method of any one of clauses 53-61, further comprising reducing a noise associated with the pulsed optical beam using a technique comprising homodyne detection, heterodyne detection, lock-in amplification, or a combination thereof.

63. The method of any one of clauses 58-62, further comprising:

activating the optical source to generate a plurality of excitation pulses having a first frequency; and applying, using the controller, the detection signal having a second frequency substantially similar to the first frequency.

64. The method of any one of clauses 53-63, further comprising applying, using the controller, a control signal to the charged-particle source to generate a pulsed primary charged-particle beam comprising a plurality of charged-particle pulses.

65. A method for forming an image of a sample using a charged-particle beam apparatus comprising a charged-particle source, an optical source, a charged-particle detector, and a controller, the method comprising:

activating the charged-particle source to generate a primary charged-particle beam along a primary optical axis;

activating the optical source to generate a pulsed optical beam comprising:

a first excitation pulse that generates a first portion of a first plurality of charged particles upon interaction with a sample surface; and a second excitation pulse that generates a second portion of the first plurality of charged particles upon interaction with the sample surface;

detecting, using the charged-particle detector, a second plurality of charged particles generated from a probe spot on the sample surface formed by the primary charged-particle beam and modified by interaction with the first and the second portions of the first plurality of charged particles;

adjusting, using the controller:

a first time delay between the first excitation pulse of the pulsed optical beam and a corresponding first detection pulse; and a second time delay, different from the first time delay, between the second excitation pulse of the pulsed optical beam and a corresponding second detection pulse; and forming an image of the sample based on the detected second plurality of charged particles.

66. The method of clause 65, further comprising applying, using the controller:

an excitation signal to activate the optical source to generate the first and the second excitation pulses having a first frequency; and a detection signal to the charged-particle detector, the detection signal comprising the corresponding first and second detection pulses having a second frequency different from the first frequency.

67. The method of any one of clauses 65 and 66, further comprising applying, using the controller, an electrical signal to activate the optical source to generate the pulsed optical beam.

68. The method of clause 67, further comprising adjusting a characteristic of an excitation pulse of the plurality of excitation pulses by adjusting the electrical signal, the characteristic comprising an intensity, a width, a repetition rate, or a phase of the excitation pulse.

69. The method of clause 68, further comprising adjusting the width of the excitation pulse between 0.05 picoseconds (ps) to 1 nanosecond (ns).

70. The method of any one of clauses 68 and 69, further comprising adjusting the repetition rate of the excitation pulse between 100 kHz to 1 GHz.

71. The method of any one of clauses 68-70, further comprising adjusting the detection signal based on at least one of the characteristic of the excitation pulse.

72. The method of clause 71, wherein adjusting the detection signal comprises adjusting at least one of a repetition rate, a width, or a phase of the corresponding first and second detection pulses.

73. The method of clause 72, wherein adjusting the first time delay comprises adjusting the phase of the corresponding first detection pulse such that the first detection pulse and the first excitation pulse are out-of-phase with each other.

74. The method of any one of clauses 72-73, wherein adjusting the second time delay comprises adjusting the phase of the corresponding second detection pulse such that the second detection pulse and the second excitation pulse are out-of-phase with each other.

75. The method of any one of clauses 65-74, wherein adjusting the first and the second time delays adjusts a sensitivity of the second plurality of charged particles detected by the charged-particle detector.

76. The method of any one of clauses 65-75, further comprising:

adjusting a first offset between a first repetition rate of the first detection pulse and a first repetition rate of the first excitation pulse; and adjusting a second offset between a second repetition rate of the second detection pulse and a second repetition rate of the second excitation pulse, wherein absolute values of the first and the second offsets are different.

77. The method of any one of clauses 65-76, further comprising reducing a noise associated with the pulsed optical beam using a technique comprising homodyne detection, heterodyne detection, lock-in amplification, or a combination thereof.

78. The method of any one of clauses 65-77, wherein the second time delay is longer than the first time delay.

79. The method of any one of clauses 65-77, wherein the second time delay is shorter than the first time delay.

80. The method of any one of clauses 65-79, further comprising applying, using the controller, a control signal to the charged-particle source to generate a pulsed charged-particle beam comprising a plurality of charged-particle pulses.

81. A non-transitory computer readable medium storing a set of instructions that is executable by one or more processors of a charged-particle beam apparatus to cause the charged-particle beam apparatus to perform a method of observing a sample, the method comprising:

activating a charged-particle source to generate a primary charged-particle beam;

activating an optical source to generate a pulsed optical beam interacting with the sample, the interaction generating a first plurality of charged particles;

applying a signal to a charged-particle detector to detect a second plurality of charged-particles generated from a probe spot on the sample formed by the primary charged-particle beam and modified by interaction with a portion of the first plurality of charged particles; and forming an image of the sample based on the detected second plurality of charged-particles.

82. A non-transitory computer readable medium storing a set of instructions that is executable by one or more processors of a charged-particle beam apparatus to cause the charged-particle beam apparatus to perform a method of observing a sample, the method comprising:

activating a charged-particle source to generate a primary charged-particle beam;

activating an optical source to generate a pulsed optical beam comprising:

a first excitation pulse that generates a first portion of a first plurality of charged particles upon interaction with a sample surface; and a second excitation pulse that generates a second portion of the first plurality of charged particles upon interaction with the sample surface;

detecting a second plurality of charged-particles generated from a probe spot on the sample surface formed by the primary charged-particle beam and modified by interaction with a portion of the first plurality of charged particles;

adjusting a first time delay between the first excitation pulse of the plurality of excitation pulses and a corresponding first detection pulse;

adjusting a second time delay between the second excitation pulse of the plurality of excitation pulses and a corresponding second detection pulse, wherein the second time delay is different from the first time delay; and forming an image of the sample based on the detected second plurality of charged-particles.

83. The non-transitory computer readable medium of clause 82, wherein the set of instructions that is executable by one or more processors of the charged-particle beam apparatus causes the charged-particle beam apparatus to further perform:

adjusting a first offset between a first repetition rate of the first detection pulse and a first repetition rate of the first excitation pulse; and adjusting a second offset between a second repetition rate of the second detection pulse and a second repetition rate of the second excitation pulse, wherein absolute values of the first and the second offsets are different.

84. The non-transitory computer readable medium of any one of clauses 82 and 83, wherein the set of instructions that is executable by one or more processors of the charged-particle beam apparatus causes the charged-particle beam apparatus to further perform reducing a noise associated with the pulsed optical beam using a technique comprising homodyne detection, heterodyne detection, lock-in amplification, or a combination thereof.

85. A charged-particle beam apparatus comprising:

a charged-particle source configured to generate a primary charged-particle beam along a primary optical axis;

an optical source configured to generate an optical pulse that irradiates a region of a sample, wherein the irradiation generates a first plurality of charged particles from the region of the sample;

a charged-particle detector configured to detect a second plurality of charged particles generated from a probe spot on the sample formed by the primary charged-particle beam and modified by interaction with a portion of the first plurality of charged particles; and a controller having circuitry configured to:

apply a first signal to cause the optical source to generate the optical pulse;

apply a second signal to the charged-particle detector to detect the second plurality of charged particles; and adjust a time delay between the first and the second signals.

86. The apparatus of clause 85, wherein the controller includes circuitry further configured to:

apply a first portion of the second signal to initiate the detection of the second plurality of charged particles; and apply a second portion of the second signal to terminate the detection of the second plurality of charged particles, wherein the first portion comprises a rising edge of the second signal and the second portion comprises a falling edge of the second signal, with respect to a reference signal.

87. The apparatus of clause 86, wherein the controller includes circuitry further configured to determine information associated with the probe spot of the sample based on an output signal generated by the charged-particle detector, and wherein the output signal is based on the second plurality of charged particles detected in a detection time elapsed between the first and the second portions of the second signal.

88. The apparatus of clause 87, wherein the controller includes circuitry further configured to detect a defect based on determined information associated with the probe spot of the sample.

89. An electron beam inspection apparatus comprising:

an electron source configured to generate a primary electron beam that irradiates a region of a sample, the region comprising a structure;

an electron detector configured to detect a plurality of signal electrons generated from the irradiated region; and a controller having circuitry configured to:

acquire a plurality of images of the structure; and determine a characteristic of the structure based on a rate of gray level variation of the plurality of images of the structure.

90. The apparatus of clause 89, wherein the structure comprises an electrical node.

91. The apparatus of clause 90, wherein the structure is associated with the electrical node.

92. The apparatus of any one of clauses 89-91, wherein the controller includes circuitry further configured to adjust an acquisition parameter of the plurality of images based on information associated with a desired rate of charging of the structure or a desired characteristic of the plurality of images.

93. The system of clause 92, wherein the acquisition parameter comprises a beam current of the primary electron beam, a landing energy of the primary electron beam, or an electric field associated with the sample.

94. The apparatus of any one of clauses 92 and 93, wherein the controller having circuitry is further configured to:

acquire a first image of the plurality of images comprising the structure; and acquire a second image of the plurality of images comprising the structure, wherein a time delay between the acquisition of the first image and the second image is adjusted based on the desired rate of charging of the structure.

95. The apparatus of clause 94, wherein the time delay between the acquisition of the first image and the second image is substantially uniform.

96. The apparatus of clause 94, wherein the time delay between the acquisition of the first image and the second image is non-uniform.

97. The apparatus of clause 94, wherein the time delay between the acquisition of the first image and the second image is adjusted based on a desired application.

98. The apparatus of any one of clauses 94-97, wherein the time delay is adjustable in a range from 1 nanosecond (ns) to 1 millisecond (ms).

99. The apparatus of any one of clauses 94-98, wherein the controller includes circuitry further configured to:
  identify the structure from the first image based on a gray level of the structure;
  determine a first gray level of the structure from the first image and a second gray level of the structure from the second image;
  determine the rate of gray level variation of the structure based on a difference between the first and the second gray level of the structure; and
  determine the characteristic of the structure based on the rate of gray level variation of the structure.

100. The apparatus of clause 99, wherein the controller includes circuitry further configured to:
  determine a third gray level of the structure from a third image of the structure;
  determine the rate of gray level variation of the structure based on a difference between the first, the second, and the third gray level of the structure; and
  determine the characteristic of the structure based on the rate of gray level variation of the structure.

101. The apparatus of clause 100, wherein the rate of gray level variation is linear.

102. The apparatus of clause 100, wherein the rate of gray level variation is non-linear.

103. The apparatus of clause 102, wherein the non-linear rate of gray level variation of the structure comprises a polynomial, or an exponential decay of the gray level of the structure.

104. The apparatus of any one of clauses 99-103, wherein the identification of the structure from the first image is based on a comparison between the first image and a reference image comprising the structure having a reference gray level.

105. The apparatus of clause 104, wherein the reference image comprises a trained image formed using a machine learning network.

106. The apparatus of clause 104, wherein the reference image comprises a secondary electron microscopy image of the structure.

107. The apparatus of any one of clauses 89-106, wherein the controller includes circuitry further configured to determine an average rate of gray level variation of the region of the sample based on a rate of gray level variation of a plurality of structures of the region.

108. The apparatus of any one of clauses 89-107, wherein the controller includes circuitry further configured to:
  determine an average rate of gray level variation of a plurality of regions of the sample; and
  generate a pattern of gray level variation of the sample based on the determined average rate of gray level variation of the plurality of regions, wherein the pattern comprises a spatial signature of the gray level variation of the structure.

109. The apparatus of any one of clauses 89-108, wherein the controller includes circuitry further configured to simulate, using a model, a physical characteristic of the structure based on the determined characteristic of the structure.

110. The apparatus of clause 109, wherein the model comprises an electrical circuit model of the structure.

111. The apparatus of any one of clauses 109 and 110, wherein the physical characteristic of the structure comprises a critical dimension, a bottom critical dimension, an overlay, a material, stoichiometry, or a composition of the structure.

112. The apparatus of any one of clauses 89-111, wherein the controller includes circuitry further configured to:
  determine, based on a rate of gray level variation of a first plurality of images of the structure, a first value of the characteristic of the structure;
  determine, based on a rate of gray level variation of a second plurality of images of the structure, a second value of the characteristic of the structure; and
  provide information for detecting a defect based on a comparison of the first and the second values of the characteristic of the structure.

113. The apparatus of clause 112, wherein the controller includes circuitry further configured to monitor a process condition or a tool condition based on the comparison of the first and the second values of the characteristic of the structure.

114. The apparatus of any one of clauses 112 and 113, wherein the first and the second plurality of images comprise an image of the structure at a first process level and a second process level, respectively.

115. The apparatus of any one of clauses 112-114, wherein the defect comprises a resistive or a capacitive defect.

116. The apparatus of any one of clauses 112-115, wherein the information for detecting the defect comprises information showing a detection of an open, a short, a partial open, a leakage, a void, an overlay error, a critical dimension error, or a defect associated with a resistance or a capacitance of the structure.

117. The apparatus of any one of clauses 89-116, wherein the characteristic of the structure comprises a sheet resistance, a contact resistance, a capacitance, or an inductance of the structure.

118. The apparatus of any one of clauses 89-117, wherein the controller includes circuitry further configured to cause the apparatus to flood a surface of the sample using the primary electron beam based on a selected mode of operation of the apparatus, wherein the selected mode of operation comprises a voltage contrast mode.

119. A method for determining a characteristic of a structure on a sample, the method comprising:
  activating an electron source to generate a primary electron beam that irradiates a region of the sample, the region comprising a structure;
  detecting, using an electron detector, a plurality of signal electrons generated from the irradiated region;
  acquiring a plurality of images of the structure; and
  determining the characteristic of the structure based on a rate of gray level variation of the plurality of images of the structure.

120. The method of clause 119, wherein the structure comprises an electrical node.

121. The method of clause 120, wherein the structure is associated with the electrical node.

122. The method of any one of clauses 119-121, further comprising adjusting an acquisition parameter of the plurality of images based on information associated with a desired rate of charging of the structure or a desired characteristic of the plurality of images.

123. The method of clause 122, wherein the acquisition parameter comprises a beam current of the primary electron beam, a landing energy of the primary electron beam, or an electric field associated with the sample.

124. The method of any one of clauses 122 and 123, further comprising:

acquiring a first image of the plurality of images comprising the structure;

acquiring a second image of the plurality of images comprising the structure, wherein a time delay between the acquisition of the first image and the second image is adjusted based on the desired rate of charging of the structure.

125. The method of clause 124, wherein the time delay between the acquisition of the first image and the second image is substantially uniform.

126. The method of clause 124, wherein the time delay between the acquisition of the first image and the second image is non-uniform.

127. The apparatus of clause 124, wherein the time delay between the acquisition of the first image and the second image is adjusted based on a desired application.

128. The method of any one of clauses 124-127, wherein the time delay is adjustable in a range from 1 nanosecond (ns) to 1 millisecond (ms).

129. The method of any one of clauses 124-128, further comprising:

identifying the structure from the first image based on a gray level of the structure;

determining a first gray level of the structure from the first image and a second gray level of the structure from the second image;

determining the rate of gray level variation of the structure based on a difference between the first and the second gray level of the structure; and determining the characteristic of the structure based on the rate of gray level variation of the structure.

130. The method of clause 129, further comprising:

determining a third gray level of the structure from a third image of the structure;

determining the rate of gray level variation of the structure based on a difference between the first, the second, and the third gray level of the structure; and determining the characteristic of the structure based on the rate of gray level variation of the structure.

131. The method of clause 130, wherein the rate of gray level variation is linear.

132. The method of clause 130, wherein the rate of gray level variation is non-linear.

133. The method of clause 132, wherein the non-linear rate of gray level variation of the structure comprises a polynomial, or an exponential decay of the gray level of the structure.

134. The method of any one of clauses 129-133, further comprising identifying the structure from the first image based on a comparison between the first image and a reference image comprising the structure having a reference gray level.

135. The method of clause 134, wherein the reference image comprises a trained image formed using a machine learning network.

136. The method of clause 134, wherein the reference image comprises a secondary electron microscopy image of the structure.

137. The method of any one of clauses 119-136, further comprising determining an average rate of gray level variation of the region of the sample based on a rate of gray level variation of a plurality of structures of the region.

138. The method of any one of clauses 119-137, further comprising:

determining an average rate of gray level variation of a plurality of regions of the sample; and generating a pattern of gray level variation of the structure based on the determined average rate of gray level variation of the plurality of regions, wherein the pattern comprises a spatial signature of the gray level variation of the structure.

139. The method of any one of clauses 119-138, further comprising simulating, using a model, a physical characteristic of the structure based on the determined characteristic of the structure, wherein the model comprises an electrical circuit model of the structure.

140. The method of clause 139, wherein the physical characteristic of the structure comprises a critical dimension, a bottom critical dimension, an overlay, a material, stoichiometry, or a composition of the structure.

141. The method of any one of clauses 119-140, further comprising:

determining, based on a rate of gray level variation of a first plurality of images of the structure, a first value of the characteristic of the structure;

determining, based on a rate of gray level variation of a second plurality of images of the structure, a second value of the characteristic of the structure; and providing information for detecting a defect based on a comparison of the first and the second values of the characteristic of the structure.

142. The method of clause 141, further comprising monitoring a process condition or a tool condition based on the comparison of the first and the second values of the characteristic of the structure.

143. The method of any one of clauses 141 and 142, wherein the first and the second plurality of images comprise an image of the structure at a first process level and a second process level, respectively.

144. The method of any one of clauses 141-143, wherein the defect comprises a resistive or a capacitive defect.

145. The method of any one of clauses 141-144, wherein the providing the information for detecting the defect comprises showing information for detecting an open, a short, a partial open, a leakage, a void, an overlay error, a critical dimension error, or a defect associated with a resistance or a capacitance of the structure.

146. The method of any one of clauses 119-145, wherein the characteristic of the structure comprises a sheet resistance, a contact resistance, a capacitance, or an inductance of the structure.

147. The method of any one of clauses 119-146, further comprising flooding a surface of the sample using the primary electron beam based on a selected mode of operation of the apparatus, wherein the selected mode of operation comprises a voltage contrast mode.

148. A non-transitory computer readable medium storing a set of instructions that is executable by one or more processors of an electron beam apparatus to cause the electron beam apparatus to perform a method of determining a characteristic of a structure on a sample, the method comprising:

activating an electron source to generate a primary electron beam that irradiates a region of the sample, the region comprising a structure;

acquiring a plurality of images of the node based on signal electrons generated by the irradiation of the region of the sample and detected using an electron detector; and determining the characteristic of the structure based on a rate of gray level variation of the plurality of images of the structure.

149. The non-transitory computer readable medium of clause 148, wherein the set of instructions that is executable by one or more processors of the electron beam apparatus causes the electron beam apparatus to further perform:

acquiring a first image of the plurality of images comprising the structure;

acquiring a second image of the plurality of images comprising the structure, wherein a time delay between the acquisition of the first image and the second image is adjusted based on the desired rate of charging of the structure.

150. The non-transitory computer readable medium of clause 149, wherein the set of instructions that is executable by one or more processors of the electron beam apparatus causes the electron beam apparatus to further perform:

identifying the structure from the first image based on a gray level of the structure;

determining a first gray level of the structure from the first image;

determining a second gray level of the structure from the second image;

determining a third gray level of the structure from the third image;

determining the rate of gray level variation of the structure based on a difference between the first, the second, and the third gray level of the structure; and determining the characteristic of the structure based on the rate of gray level variation of the structure, wherein the rate of gray level variation is non-linear.

151. The non-transitory computer readable medium of any one of clauses 148-150, wherein the set of instructions that is executable by one or more processors of the electron beam apparatus causes the electron beam apparatus to further perform:

determining an average rate of gray level variation of a plurality of regions of the sample; and generating a pattern of gray level variation of the structure based on the determined average rate of gray level variation of the plurality of regions, wherein the pattern comprises a spatial signature of the gray level variation of the structure.

152. The non-transitory computer readable medium of any one of clauses 148-151, wherein the set of instructions that is executable by one or more processors of the electron beam apparatus causes the electron beam apparatus to further perform simulating, using a model, a physical characteristic of the structure based on the determined characteristic of the structure, wherein the model comprises an electrical circuit model of the structure.

153. The non-transitory computer readable medium of any one of clauses 148-152, wherein the set of instructions that is executable by one or more processors of the electron beam apparatus causes the electron beam apparatus to further perform:

determining, based on a rate of gray level variation of a first plurality of images of the structure, a first value of the characteristic of the structure;

determining, based on a rate of gray level variation of a second plurality of images of the structure, a second value of the characteristic of the structure; and providing information for detecting a defect based on a comparison of the first and the second values of the characteristic of the structure.

154. A charged-particle beam apparatus comprising:

a charged-particle source configured to generate primary charged-particles along a primary optical axis and incident on a first region of a sample;

an optical source configured to generate an optical beam interacting with a second region of the sample, the interaction between the optical beam and the second region of the sample involves generating charge carriers in the sample based on a characteristic of the optical beam; and a charged-particle detector configured to detect secondary charged-particles generated by an interaction of the primary charged-particles with the first region of the sample, wherein an adjustment of the characteristic of the optical beam causes a variation in a characteristic of the generated secondary charged-particles.

155. The apparatus of clause 154, further comprising a controller having circuitry configured to:

cause the apparatus to acquire a plurality of images of the first region of the sample; and determine a variation in a gray level of the plurality of images of the first region of the sample associated with the variation in the characteristic of the generated secondary charged-particles.

156. The apparatus of clause 155, wherein the controller includes circuitry further configured to identify a defect in the sample based on the determined variation in the gray level of the plurality of images of the first region of the sample.

157. The apparatus of clause 156, wherein the defect comprises an electrical defect including an open, a high-resistance defect, a short, or a junction leakage.

158. The apparatus of clause 157, wherein the electrical defect comprises a p-n junction leakage in a reverse-biased metal-oxide semiconductor field effect transistor (MOSFET) device.

159. The apparatus of any one of clauses 154-158, wherein the characteristic of the optical beam comprises a power density of the optical beam.

160. The apparatus of clause 159, wherein the adjustment of the characteristic of the optical beam comprises an incremental adjustment of the power density in a range from 0 to 300 kW/m$^2$.

161. The apparatus of clause 159, wherein the adjustment of the characteristic of the optical beam comprises an incremental adjustment of the power density in a range from 0 to 100 kW/m$^2$.

162. The apparatus of clause 159, wherein the adjustment of the characteristic of the optical beam comprises an incremental adjustment of the power density in a range from 0 to 50 kW/m$^2$.

163. The apparatus of any one of clauses 154-162, wherein the characteristic of the generated secondary charged-particles comprises a trajectory, energy, or intensity of the secondary charged-particles.

164. A method for identifying a defect in a sample, the method comprising:

activating a charged-particle source to generate primary charged-particles along a primary optical axis and incident on a first region of the sample;

activating an optical source to generate an optical beam having a characteristic and interacting with a second region of the sample;

detecting secondary charged-particles generated by an interaction of the primary charged-particles with the first region of the sample, wherein adjusting the characteristic of the optical beam causes a variation in a characteristic of the generated secondary charged-particles;

acquiring a plurality of images of the first region of the sample; and identifying the defect based on a variation of a gray level of the plurality of images of the first region of the sample associated with the variation in the characteristic of the generated secondary charged-particles.

165. The method of clause 164, wherein the interaction between the optical beam and the second region of the sample generates charge carriers in the sample based on the characteristic of the optical beam.

166. The method of clause 165, further comprising adjusting a surface potential of the first region of the sample by varying an amount of generated charge carriers in the sample.

167. The method of any one of clauses 164-166, wherein adjusting the characteristic of the optical beam comprises adjusting a power density of the optical beam incident on the second region of the sample.

168. The method of clause 167, further comprising incrementally adjusting the power density of the optical beam in a range from 0 to 300 $kW/m^2$.

169. The method of clause 167, further comprising incrementally adjusting the power density of the optical beam in a range from 0 to 100 $kW/m^2$.

170. The method of clause 167, further comprising incrementally adjusting the power density of the optical beam in a range from 0 to 50 $kW/m^2$.

171. The method of any one of clauses 164-170, wherein the defect comprises an electrical defect including an open, a high-resistance defect, a short, or a junction leakage.

172. The method of clause 171, wherein the electrical defect comprises a p-n junction leakage in a reverse-biased metal-oxide semiconductor field effect transistor (MOSFET).

173. The method of any one of clauses 164-172, wherein the characteristic of the generated secondary charged-particles comprises a trajectory, energy, or intensity of the secondary charged-particles.

174. A non-transitory computer readable medium storing a set of instructions that is executable by one or more processors of a charged-particle beam apparatus to cause the charged-particle beam apparatus to perform a method of identifying a defect in a sample, the method comprising:

activating a charged-particle source to generate primary charged-particles along a primary optical axis and incident on a first region of the sample;

activating an optical source to generate an optical beam having a characteristic and interacting with a second region of the sample;

detecting secondary charged-particles generated by an interaction of the primary charged-particles with the first region of the sample, wherein adjusting the characteristic of the optical beam causes a variation in a characteristic of the generated secondary charged-particles;

acquiring a plurality of images of the first region of the sample; and identifying the defect based on a variation of the gray level of the plurality of images of the first region of the sample associated with the variation in the characteristic of the generated secondary charged-particles.

175. A system, comprising:

a first particle source configured to generate a pulsed beam of particles supplying energy to an electrical structure disposed on a region of a sample;

a charged-particle beam apparatus, comprising:

a second particle source configured to generate a continuous beam of primary charged-particles incident on the region of the sample;

a charged-particle detector configured to detect secondary charged-particles generated by an interaction between the primary charged-particles and the region of the sample; and a controller having circuitry configured to:

apply a first signal to the first particle source, wherein the first signal comprises information associated with a timing of a plurality of pulses of the pulsed beam of particles; and apply a second signal to the charged-particle detector, the second signal configured to operate the charged-particle detector based on the first signal.

176. The system of clause 175, further comprising a capacitor electrically coupled with the electrical structure.

177. The system of any one of clauses 175-176, wherein the electrical structure comprises a closed-loop ring oscillator.

178. The system of clause 177, wherein in response to receiving the power from the first particle source, the closed-loop ring oscillator is configured to oscillate at an oscillation frequency.

179. The system of clause 178, wherein the oscillation frequency of the closed-loop ring oscillator is equal to or lower than a read-out frequency of the charged-particle detector.

180. The system of any one of clauses 178-179, wherein the charged-particle detector is further configured to receive a detection signal comprising temporal information associated with the oscillation of the closed-loop ring oscillator.

181. The system of clause 180, wherein the controller includes circuitry further configured to:

cause a charged-particle beam apparatus to acquire a plurality of images of the region of the sample based on the temporal information associated with the oscillation of the closed-loop ring oscillator; and determine an average gray level of the plurality of images of the region of the sample.

182. The system of any one of clauses 175-181, wherein the second signal applied to the charged-particle detector is synchronized with the timing of the plurality of pulses of the pulsed beam of particles.

183. The system of any one of clauses 175-182, wherein the charged-particle beam apparatus is configured to operate in a voltage-contrast mode.

184. The system of any one of clauses 175-183, wherein the first particle source comprises a pulsed optical source or a pulsed electron source, and wherein the second particle source comprises a continuous electron source.

185. A method, comprising:

generating, using a first particle source, a pulsed beam of particles supplying energy to an electrical structure disposed on a region of a sample;

generating, using a second particle source, a continuous beam of primary charged-particles incident on the region of the sample; and detecting secondary charged-particles generated by an interaction between the primary charged-particles and the region of the sample;

applying a first signal to the first particle source, wherein the first signal comprises information associated with a timing of a plurality of pulses of the pulsed beam of particles; and applying, a second signal to a charged-particle detector, the second signal configured to operate the charged-particle detector based on the first signal.

186. The method of clause 185, wherein the electrical structure comprises a closed-loop ring oscillator.

187. The method of clause 186, wherein in response to receiving the power from the first particle source, the closed-loop ring oscillator oscillates at an oscillation frequency.

188. The method of clause 187, wherein the oscillation frequency of the closed-loop ring oscillator is equal to or lower than a read-out frequency of the charged-particle detector.

189. The method of any one of clauses 187-188, further comprising receiving a detection signal, by the charged-particle detector, the detection signal comprising temporal information associated with the oscillation of the closed-loop ring oscillator.

190. The method of clause 189, further comprising:
acquiring a plurality of images of the region of the sample based on the temporal information associated with the oscillation of the closed-loop ring oscillator; and
determining an average gray level of the plurality of images of the region of the sample.

191. The method of any one of clauses 185-190, further comprising synchronizing the output signal to the charged-particle detector with the timing of the plurality of pulses of the pulsed beam of particles.

192. The method of any one of clauses 185-191, wherein the charged-particle beam apparatus is configured to operate in a voltage-contrast mode.

193. The method of any one of clauses 185-192, wherein the first particle source comprises a pulsed optical source or a pulsed electron source, and wherein the second particle source comprises a continuous electron source.

194. A non-transitory computer readable medium storing a set of instructions that is executable by one or more processors of an apparatus to cause the apparatus to perform a method, the method comprising:
causing a first particle source to generate a pulsed beam of particles supplying energy to an electrical structure disposed on a region of a sample;
causing a second particle source to generate a continuous beam of primary charged-particles incident on the region of the sample;
detecting secondary charged-particles generated by an interaction between the primary charged-particles and the region of the sample;
applying a first signal from the first particle source, wherein the first signal comprises information associated with a timing of a plurality of pulses of the pulsed beam of particles; and
applying a second signal to the charged-particle detector, the second signal configured to operate the charged-particle detector based on the first signal.

195. A system, comprising:
a first particle source configured to generate a pulsed beam of particles supplying energy to an electrical structure disposed on a region of a sample;
a charged-particle beam apparatus comprising a second particle source configured to generate a pulsed beam of primary charged-particles incident on the region of the sample; and a controller having circuitry configured to:
apply a first signal to cause the first particle source to generate the pulsed beam of particles;
apply a second signal to cause the second particle source to generate the pulsed beam of primary charged-particles; and
adjust a timing of application of the first and the second signals such that there is a time delay between the first and the second signals.

196. The system of clause 195, further comprising a capacitor electrically coupled with the electrical structure.

197. The system of any one of clauses 195-196, wherein the electrical structure comprises a closed-loop ring oscillator.

198. The system of clause 197, wherein in response to receiving the power from the first particle source, the closed-loop ring oscillator is configured to oscillate at an oscillation frequency.

199. The system of clause 198, wherein the charged-particle detector is further configured to receive a detection signal comprising temporal information associated with the oscillation of the closed-loop ring oscillator.

200. The system of any one of clauses 195-199, wherein the controller includes circuitry further configured to adjust the time delay between the first and the second signals.

201. The system of any one of clauses 199-200, wherein the controller includes circuitry further configured to:
cause the charged-particle beam apparatus to acquire a plurality of images of the region of the sample based on the temporal information associated with the oscillation of the closed-loop ring oscillator; and
determine an average gray level of the plurality of images of the region of the sample.

202. The system of any one of clauses 195-201, wherein the first signal comprises information associated with a timing of a plurality of pulses of the pulsed beam of particles.

203. The system of any one of clauses 195-202, wherein the charged-particle beam apparatus is configured to operate in a voltage-contrast mode.

204. The system of any one of clauses 195-203, wherein the first particle source comprises a pulsed optical source, and wherein the second particle source comprises a pulsed electron source.

205. The system of any one of clauses 195-203, wherein the first and the second particle sources comprises a pulsed electron source.

206. A method, comprising:
applying a first signal to a first particle source to cause the first particle source to generate a pulsed beam of particles, the generated pulsed beam configured to supply energy to an electrical structure disposed on a region of a sample;
applying a second signal to a second particle source to cause the second particle source to generate a pulsed beam of primary charged-particles incident on the region of the sample; and
adjusting a timing of application of the first and the second signals such that there is a time delay between the applied first and the second signals.

207. The method of clause 206, further comprising adjusting the time delay between the applied first and the second signals.

208. The method of any one of clauses 206 and 207, wherein the electrical structure comprises a closed-loop ring oscillator, and wherein in response to receiving the power from the first particle source, the closed-loop ring oscillator oscillates at an oscillation frequency.

209. The method of clause 208, further comprising receiving a detection signal, by a charged-particle detector, the detection signal comprising temporal information associated with the oscillation of the closed-loop ring oscillator.

210. The method of clause 209, further comprising:
acquiring a plurality of images of the region of the sample based on the temporal information associated with the oscillation of the closed-loop ring oscillator; and
determining an average gray level of the plurality of images of the region of the sample.

211. A non-transitory computer readable medium storing a set of instructions that is executable by one or more processors of an apparatus to cause the apparatus to perform a method, the method comprising:
applying a first signal to cause a first particle source to generate a pulsed beam of particles to supply energy to an electrical structure disposed on a region of a sample;
applying a second signal to cause a second particle source to generate a pulsed beam of primary charged-particles incident on the region of the sample; and
adjusting a timing of application of the first and the second signals such that there is a time delay between the applied first and the second signals.

212. A system, comprising:
a first particle source configured to generate a pulsed beam of particles supplying energy to an electrical structure disposed on a region of a sample;
a charged-particle beam apparatus comprising:
a second particle source configured to generate a continuous beam of primary charged-particles incident on the region of the sample; and
a charged-particle detector configured to detect secondary charged-particles generated by an interaction between the primary charged-particles and the region of the sample, wherein the charged-particle detector is further configured to modify, prior to detecting, a characteristic of the secondary charged-particles; and
a controller having circuitry configured to:
apply a first signal to cause the first particle source to generate the pulsed beam of particles;
apply a second signal to cause the second particle source to generate the continuous beam of primary charged-particles; and
adjust a timing of application of the first and the second signals such that there is a time delay between the first and the second signals.

213. The system of clause 212, further comprising a capacitor electrically coupled with the electrical structure.

214. The system of any one of clauses 212-213, wherein the electrical structure comprises a closed-loop ring oscillator.

215. The system of clause 214, wherein in response to receiving the power from the first particle source, the closed-loop ring oscillator is configured to oscillate at an oscillation frequency.

216. The system of clause 215, wherein the charged-particle detector comprises a pixelated charged-particle detector configured to receive a detection signal comprising temporal information associated with the oscillation of the closed-loop ring oscillator.

217. The system of any one of clauses 212-216, wherein a modification of the characteristic of the secondary charged-particles comprises generating a pulsed beam of secondary charged-particles, the pulsed beam of secondary charged-particles comprising a plurality of pulses of secondary charged-particles.

218. The system of clause 217, wherein a pulse duration of a pulse of the plurality of pulses of secondary charged-particles is in a range from 100 femtoseconds (fs) to 1000 fs.

219. The system of any one of clauses 212-218, wherein the controller includes circuitry further configured to adjust the time delay between the first and the second signals.

220. The system of any one of clauses 212-219, wherein the controller includes circuitry further configured to:
cause the charged-particle beam apparatus to acquire a plurality of images of the region of the sample; and
determine an average gray level of the plurality of images of the region of the sample.

221. The system of any one of clauses 212-220, wherein the controller includes circuitry further configured to synchronize an operation of a deflector of the charged-particle detector with the pulsed beam of particles generated from the first particle source.

222. The system of any one of clauses 212-221, wherein the charged-particle beam apparatus is configured to operate in a voltage-contrast mode.

223. The system of any one of clauses 212-222, wherein the first particle source comprises a pulsed optical source or a pulsed electron source, and wherein the second particle source comprises a continuous electron source.

224. A method, comprising:
applying a first signal to cause a first particle source to generate a pulsed beam of particles;
applying a second signal to cause a second particle source to generate a continuous beam of primary charged-particles; and
adjusting a timing of application of the first and the second signals such that there is a time delay between the first and the second signals; and
detecting, using a charged-particle detector, secondary charged-particles generated by an interaction between the primary charged-particles and a region of a sample, wherein the charged-particle detector is configured to modify, prior to detecting, a characteristic of the secondary charged-particles.

225. The method of clause 224, further comprising adjusting the time delay between the applied first and the second signals.

226. The method of any one of clauses 224 and 225, wherein the electrical structure comprises a closed-loop ring oscillator, and wherein, in response to receiving the power from the first particle source, the closed-loop ring oscillator oscillates at an oscillation frequency.

227. The method of clause 226, further comprising receiving a detection signal, by a charged-particle detector, the detection signal comprising temporal information associated with the oscillation of the closed-loop ring oscillator.

228. The method of clause 227, further comprising:
acquiring a plurality of images of the region of the sample based on the temporal information of the detection signal; and
determining an average gray level of the plurality of images of the region of the sample.

229. The method of any one of clauses 224-228, wherein the charged-particle detector comprises a pixelated charged-particle detector.

230. The method of any one of clauses 224-229, wherein modifying the characteristic of the secondary charged-particles comprises generating a pulsed beam of secondary charged-particles, the pulsed beam of secondary charged-particles comprising a plurality of pulses of secondary charged-particles.

231. The method of clause 230, wherein a pulse duration of a pulse of the plurality of pulses of secondary charged-particles is in a range from 100 femtoseconds (fs) to 1000 fs.

232. The method of any one of clauses 224-231, further comprising synchronizing an operation of a deflector of the charged-particle detector with the pulsed beam of particles generated from the first particle source.

233. The method of any one of clauses 224-232, wherein the first particle source comprises a pulsed optical source or a pulsed electron source, and wherein the second particle source comprises a continuous electron source.

234. A non-transitory computer readable medium storing a set of instructions that is executable by one or more processors of a charged-particle beam apparatus to cause the charged-particle beam apparatus to perform a method, the method comprising:

generating a pulsed beam of particles configured to supply energy to an electrical structure disposed on a region of a sample;

generating a continuous beam of primary charged-particles incident on the region of the sample;

detecting secondary charged-particles generated by an interaction between the primary charged-particles and the region of the sample, wherein a charged-particle detector is configured to modify, prior to detecting, a characteristic of the secondary charged-particles;

applying a first signal to cause the first particle source to generate the pulsed beam of particles;

applying a second signal to cause the second particle source to generate the continuous beam of primary charged-particles; and adjusting a timing of application of the first and the second signals such that there is a time delay between the first and the second signals.

235. A system, comprising:

a first particle source configured to generate a pulsed beam of particles supplying energy to an electrical structure comprising a plurality of transistors;

the electrical structure, in response to receiving the energy from the pulsed beam of particles, is configured to switch an operation state of one or more transistors of the plurality of transistors, enabling a flow of transient charges, wherein the flow of transient charges causes an emission of a plurality of electromagnetic pulses; and a detector configured to detect the plurality of electromagnetic pulses.

236. The system of clause 235, wherein the electrical structure comprises a closed-loop ring oscillator.

237. The system of clause 236, further comprising a capacitor electrically coupled with the closed-loop ring oscillator.

238. The system of any one of clauses 235-237, wherein the plurality of electromagnetic pulses is emitted at an emission frequency corresponding to an oscillation frequency of the closed-loop ring oscillator.

239. The system of any one of clauses 235-238, wherein the plurality of electromagnetic pulses comprises a plurality of optical pulses.

240. The system of clause 235-239, wherein the detector comprises a photodiode, a charge coupled device, a photo-multiplier, a phototransistor, a near-infrared photomultiplier, or an imager.

241. The system of any one of clauses 235-240, wherein the transient charges comprise hot electrons, and wherein the flow of the transient charges causes hot electroluminescence.

242. The system of any one of clauses 235-241, wherein the first particle source comprises a pulsed optical source or a pulsed electron source.

243. The system of clause 235, wherein the detector comprises an antenna configured to detect the plurality of electromagnetic pulses.

244. A method, comprising:

generating a pulsed beam of particles configured to supply energy to an electrical structure comprising a plurality of transistors;

switching, in response to receiving the supplied energy from the pulsed beam of particles, an operation state of one or more transistors of the plurality of transistors, enabling a flow of transient charges, wherein the flow of transient charges causes an emission of a plurality of electromagnetic pulses at an emission frequency; and detecting the plurality of electromagnetic pulses to determine an oscillation frequency of the electrical structure based on the emission frequency of the plurality of electromagnetic pulses.

245. The method of clause 244, wherein the electrical structure comprises a closed-loop ring oscillator.

246. The method of any one of clauses 244 and 245, wherein the plurality of electromagnetic pulses comprises a plurality of optical pulses.

247. The method of clause 246, further comprising detecting the plurality of optical pulses using an optical detector, the optical detector comprising a photodiode, a charge coupled device, a photomultiplier, a phototransistor, a near-infrared photomultiplier, or an imager.

248. The method of any one of clauses 244-247, wherein the transient charges comprise hot electrons, and wherein the flow of the transient charges causes hot electroluminescence.

249. The method of any one of clauses 244-248, wherein the first particle source comprises a pulsed optical source or a pulsed electron source.

250. The method of clause 244, wherein the detector comprises an antenna configured to detect the plurality of electromagnetic pulses.

251. A non-transitory computer readable medium storing a set of instructions that is executable by one or more processors of an apparatus to cause the apparatus to perform a method, the method comprising:

generating a pulsed beam of particles configured to supply energy to an electrical structure comprising a plurality of transistors;

switching, in response to receiving the energy from the pulsed beam of particles, an operation state of one or more transistors of the plurality of transistors, enabling a flow of transient charges, wherein the flow of transient charges causes an emission of a plurality of electromagnetic pulses at an emission frequency; and detecting the plurality of electromagnetic pulses to determine an oscillation frequency of the electrical structure based on the emission frequency.

It will be appreciated that the embodiments of the present disclosure are not limited to the exact construction that has been described above and illustrated in the accompanying drawings, and that various modifications and changes may be made without departing from the scope thereof. The present disclosure has been described in connection with various embodiments, other embodiments of the invention will be apparent to those skilled in the art from consideration of the specification and practice of the invention disclosed herein. It is intended that the specification and examples be considered as exemplary only, with a true scope and spirit of the invention being indicated by the following claims and the foregoing clauses.

The descriptions above are intended to be illustrative, not limiting. Thus, it will be apparent to one skilled in the art that modifications may be made as described without departing from the scope of the claims and the foregoing clauses.

The invention claimed is:

1. A charged-particle beam apparatus comprising:
a charged-particle source configured to generate a primary charged-particle beam along a primary optical axis;
an optical source configured to generate a pulsed optical beam interacting with a sample, the interaction generating a first plurality of charged particles;
a charged-particle detector configured to detect a second plurality of charged particles generated from a probe spot on the sample formed by the primary charged-particle beam and modified by interaction with a portion of the first plurality of charged particles; and
a controller having circuitry configured to:
apply a first signal with a first timing to cause the optical source to generate the pulsed optical beam;
apply a second signal with a second timing to the charged-particle detector to initiate pulsed detection of the second plurality of charged particles; and
adjust a time delay that is based on a timing difference between pulses of the first signal and the second signal.

2. The apparatus of claim 1, wherein the first plurality of charged particles comprises photoelectrons and the second plurality of charged particles comprises secondary electrons, backscattered electrons, or auger electrons.

3. The apparatus of claim 1, wherein the controller includes circuitry further configured to adjust the first signal to cause an adjustment of a characteristic of an excitation pulse of the pulsed optical beam.

4. The apparatus of claim 3, wherein the characteristic of the excitation pulse comprises an intensity, a width, a repetition rate, or a phase of the excitation pulse.

5. The apparatus of claim 4, wherein the width of the excitation pulse is adjustable and is in a range of 0.05 picoseconds (ps) to 1 nanosecond (ns).

6. The apparatus of claim 4, wherein the repetition rate of the excitation pulse is adjustable and is in a range of 100 kHz to 1 GHz.

7. The apparatus of claim 3, wherein the controller includes circuitry further configured to adjust the second signal based on the characteristic of the excitation pulse, and wherein the second signal comprises a detection signal that enables detection of the second plurality of charged particles.

8. The apparatus of claim 7, wherein an adjustment of the second signal comprises an adjustment of a repetition rate, a width, or a phase of the detection signal.

9. The apparatus of claim 7, wherein the controller includes circuitry further configured to, based on an adjustment of the time delay, adjust a timing between the excitation pulse and the detection signal to adjust a sensitivity of the second plurality of charged particles detected by the charged-particle detector.

10. The apparatus of claim 9, wherein adjustment of the time delay comprises an adjustment of a phase of the detection signal.

11. The apparatus of claim 10, wherein the adjustment of the phase of the detection signal causes the detection signal and the excitation pulse to be out-of-phase with each other.

12. The apparatus of claim 1, wherein the optical source comprises a solid-state laser, a semiconductor laser, a gas laser, a dye laser, a chemical laser, a diode-pumped fiber laser, a gain-switched laser, or gain-switched laser diodes coupled with fiber amplifiers.

13. The apparatus of claim 1, wherein the pulsed optical beam comprises a pulsed laser beam having a photon wavelength in a range of 150 nm to 2 μm.

14. The apparatus of claim 1, wherein a noise associated with the pulsed optical beam is reduced using a technique comprising homodyne detection, heterodyne detection, lock-in amplification, or a combination thereof.

15. A non-transitory computer readable medium storing a set of instructions that is executable by one or more processors of a charged-particle beam apparatus comprising a charged-particle source, an optical source, a charged-particle detector, and a controller, to cause the charged-particle beam apparatus to perform operations for forming an image of a sample, the operations comprising:
activating the charged-particle source to generate a primary charged-particle beam along a primary optical axis;
activating the optical source to generate a pulsed optical beam with a first timing that interacts with the sample, the interaction generating a first plurality of charged particles;
applying a signal with a second timing to the charged-particle detector to detect a second plurality of charged-particles generated from a probe spot on the sample formed by the primary charged-particle beam and modified by interaction with a portion of the first plurality of charged particles;
adjusting a time delay that is based on a timing difference between pulses of the pulsed optical beam and the signal; and
forming an image of the sample based on the detected second plurality of charged-particles and the adjusted time delay.

16. A controller of a charged-particle beam apparatus, the controller comprising:
circuitry configured to:
apply a first signal with a first timing to cause an optical source to generate a pulsed optical beam interacting with a sample, the interaction generating a first plurality of charged particles;
apply a second signal with a second timing to a charged-particle detector to detect a second plurality of charged-particles generated from a probe spot on the sample formed by a primary charged-particle beam and modified by interaction with a portion of the first plurality of charged particles; and
adjust a time delay that is based on a timing difference between pulses of the pulsed optical beam and the signal.

17. The controller of claim 16, further comprising circuitry configured to adjust the first signal to adjust a characteristic of an excitation pulse of the pulsed optical beam, the characteristic of the excitation pulse comprising an intensity, a width, a repetition rate, or a phase of the excitation pulse.

18. The controller of claim 17, further comprising circuitry configured to adjust the second signal based on the characteristics of the excitation pulse, the second signal comprising a detection signal.

19. The controller of claim 18, further comprising circuitry configured to, based on an adjustment of the time delay, adjust a timing between the excitation pulse and the detection signal to adjust a sensitivity of the second plurality of charged particles detected by the charged-particle detector.

20. The controller of claim 16, wherein the circuitry comprises a synchronous digital circuit, a master clock, or a synchronous driver circuit.

* * * * *